(12) United States Patent
Hirose et al.

(10) Patent No.: US 7,514,779 B2
(45) Date of Patent: Apr. 7, 2009

(54) MULTILAYER BUILD-UP WIRING BOARD

(75) Inventors: Naohiro Hirose, Ibi-gun (JP); Honjin En, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 19 days.

(21) Appl. No.: 10/334,062

(22) Filed: Dec. 31, 2002

(65) Prior Publication Data
US 2003/0102151 A1 Jun. 5, 2003

Related U.S. Application Data

(62) Division of application No. 09/787,321, filed on May 17, 2001, now Pat. No. 6,613,986.

(51) Int. Cl.
*H01L 21/4763* (2006.01)
*H01L 23/12* (2006.01)
*H01L 23/495* (2006.01)
*H01L 29/40* (2006.01)
*H01L 21/00* (2006.01)
*H05K 1/00* (2006.01)
*H05K 7/20* (2006.01)
*H05K 1/14* (2006.01)
*H05K 7/00* (2006.01)
*H01R 9/00* (2006.01)

(52) U.S. Cl. .................. 257/700; 257/668; 257/758; 257/759; 257/760; 438/106; 438/622; 438/624; 438/625; 438/626; 174/254; 361/719; 361/720; 361/736; 361/748; 361/751; 361/760; 361/774; 361/777; 361/792

(58) Field of Classification Search ............... 361/748, 361/750, 767, 768, 771; 174/250, 255, 264, 174/261, 262, 266
See application file for complete search history.

(56) References Cited

U.S. PATENT DOCUMENTS 3,739,469 A 6/1973 Dougherty, Jr.

(Continued)

FOREIGN PATENT DOCUMENTS

EP 0 844 809 A2 5/1998

(Continued)

OTHER PUBLICATIONS

Microfilm of the specification and drawings annexed to the request of Japanese Utility Model Application No. 18148/1980 )Laid-open No. 119679/1981) (NEC Corporation ), Sep. 11, 1981 (Family: none).

(Continued)

*Primary Examiner*—Matthew Smith
*Assistant Examiner*—James M Mitchell
(74) *Attorney, Agent, or Firm*—Oblon, Spivak, McClelland, Maier & Neustadt, P.C.

(57) ABSTRACT

Mesh holes 35a and 59a of upper solid layers 35 and upper solid layers 59 are formed to overlie on one another, so that the insulating properties of interlayer resin insulating layers 50 are not lowered. Here, the diameter of each mesh hole is preferably 75 to 300 μm. The reason is as follows. If the diameter of the mesh hole is less than 75 μm, it is difficult to overlay the upper and lower mesh holes on one another. If the diameter exceeds 300 μm, the insulating properties of the interlayer resin insulating layers deteriorate. In addition, the distance between the mesh holes is preferably 100 to 2000 μm. The reason is as follows. If the distance is less than 100 μm, the solid layer cannot function. If the distance exceeds 2000 μm, the deterioration of the insulating properties of the interlayer resin insulating film occurs.

11 Claims, 43 Drawing Sheets

U.S. PATENT DOCUMENTS

| | | | |
|---|---|---|---|
| 3,781,596 A | 12/1973 | Galli et al. | |
| 3,799,777 A | 3/1974 | O'Keeffe et al. | |
| 4,075,416 A | 2/1978 | Kuttner et al. | |
| 4,081,601 A | 3/1978 | Dinella et al. | |
| 4,303,715 A * | 12/1981 | Chang | 428/137 |
| 4,506,004 A * | 3/1985 | Sullivan | 430/312 |
| 4,543,715 A | 10/1985 | Iadarola et al. | |
| 4,754,371 A | 6/1988 | Nitta et al. | |
| 4,795,670 A * | 1/1989 | Nishigaki et al. | 428/209 |
| 4,893,404 A * | 1/1990 | Shirahata et al. | 29/852 |
| 5,153,987 A | 10/1992 | Takahashi et al. | |
| 5,296,649 A | 3/1994 | Kosuga et al. | |
| 5,469,615 A | 11/1995 | Yamazaki | |
| 5,479,138 A | 12/1995 | Kuroda et al. | |
| 5,493,074 A | 2/1996 | Murata et al. | |
| 5,519,177 A * | 5/1996 | Wang et al. | 174/259 |
| 5,562,970 A * | 10/1996 | Satoh | 428/209 |
| 5,698,470 A | 12/1997 | Yamaguchi | |
| 5,741,575 A * | 4/1998 | Asai et al. | 428/209 |
| 5,826,330 A | 10/1998 | Isoda et al. | |
| 5,879,568 A | 3/1999 | Urasaki et al. | |
| 5,939,789 A * | 8/1999 | Kawai et al. | 257/758 |
| 6,046,909 A * | 4/2000 | Joy | 361/748 |
| 6,127,633 A | 10/2000 | Kinoshita | |
| 6,134,118 A * | 10/2000 | Pedersen et al. | 361/779 |
| 6,178,093 B1 * | 1/2001 | Bhatt et al. | 361/795 |
| 6,217,987 B1 * | 4/2001 | Ono et al. | 428/209 |
| 6,248,657 B1 * | 6/2001 | Maeda | 438/612 |
| 6,303,871 B1 | 10/2001 | Zu et al. | |
| 6,376,049 B1 * | 4/2002 | Asai et al. | 428/209 |
| 6,392,898 B1 * | 5/2002 | Asai et al. | 361/794 |
| 6,512,186 B1 * | 1/2003 | Nishiwaki et al. | 174/261 |
| 6,523,252 B1 * | 2/2003 | Lipponen | 29/828 |
| 6,525,275 B1 * | 2/2003 | Asai | 174/255 |
| 6,528,145 B1 * | 3/2003 | Berger et al. | 428/156 |
| 6,571,467 B2 * | 6/2003 | Haze et al. | 29/852 |
| 6,662,442 B1 * | 12/2003 | Matsui et al. | 29/852 |
| 6,667,235 B2 * | 12/2003 | Ihara | 438/678 |
| 6,835,895 B1 * | 12/2004 | Asai et al. | 174/255 |
| 2001/0004944 A1 * | 6/2001 | Nakamura et al. | 174/262 |
| 2001/0011607 A1 * | 8/2001 | Moriizumi et al. | 174/262 |
| 2001/0029065 A1 * | 10/2001 | Fischer et al. | 438/115 |
| 2002/0112885 A1 * | 8/2002 | Hotta et al. | 174/264 |
| 2003/0007332 A1 * | 1/2003 | Seki et al. | 361/750 |
| 2003/0194564 A1 * | 10/2003 | Araki et al. | 428/421 |

FOREIGN PATENT DOCUMENTS

| | | | |
|---|---|---|---|
| FR | 2 522 459 | | 9/1983 |
| JP | 49-117970 | | 11/1974 |
| JP | 60-211897 | | 10/1985 |
| JP | 63-199487 | | 8/1988 |
| JP | 1-163634 | | 6/1989 |
| JP | 1-282888 | | 11/1989 |
| JP | 01282888 A | | 11/1989 |
| JP | 4-55555 | | 2/1992 |
| JP | 4-64279 | | 2/1992 |
| JP | 04-064279 | | 2/1992 |
| JP | 5-75258 | | 3/1993 |
| JP | 05075258 A | | 3/1993 |
| JP | 6-69660 | | 3/1994 |
| JP | 07/115283 | | 5/1995 |
| JP | 08-5581 | | 2/1996 |
| JP | 09-246732 | * | 9/1997 |
| JP | 10-013026 | | 1/1998 |
| JP | 10-163634 | | 6/1998 |
| JP | 10163634 A | | 6/1998 |
| JP | 10-200271 | | 7/1998 |
| JP | 10/261869 | | 9/1998 |
| JP | 10-335817 | | 12/1998 |
| JP | 11-121933 | | 4/1999 |
| MY | 121310 A | | 1/2006 |
| WO | WO 83/03040 | | 9/1983 |
| WO | WO 96/17503 | | 6/1996 |
| WO | WO 97/16056 | | 5/1997 |

OTHER PUBLICATIONS

Patent Abstracts of Japan, JP 04-064279, Feb. 28, 1992.
Patent Abstracts of Japan, JP 03-036791, Feb. 18, 1991.
Patent Abstracts of Japan, JP 05-075258, Mar. 26, 1993.
Patent Abstracts of Japan, JP 06-120659, Apr. 28, 1994.
Patent Abstracts of Japan, JP 06-021611, Jan. 28, 1994.
Patent Abstracts of Japan, JP 01-282888, Nov. 14, 1989.
Patent Abstracts of Japan, JP 10-163634, Jun. 19, 1998.
Patent Abstracts of Japan, JP 56-119679, Sep. 19, 1981.
Patent Abstracts of Japan, JP 06-069660, Mar. 11, 1994.
Microfilm of the specification and drawings annexed to the request of Japanese Utility Model Application No. 18148/1980)Laid-open No. 119679/1981) (NEC Corporation), Sep. 11, 1981 (Family: none).

* cited by examiner

Fig. 2
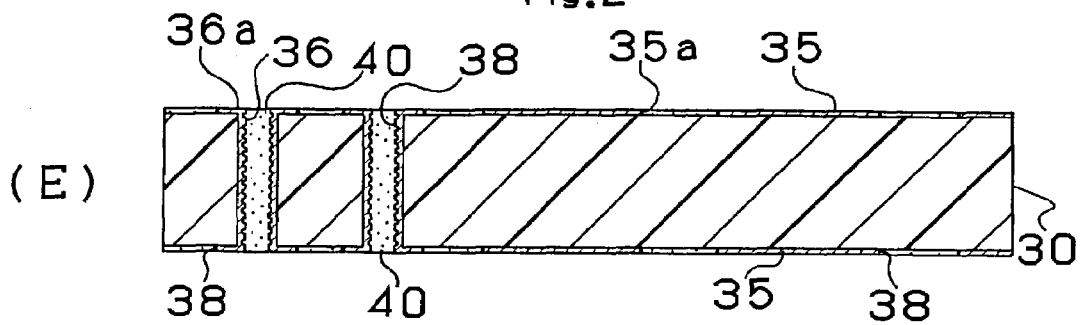
(E)
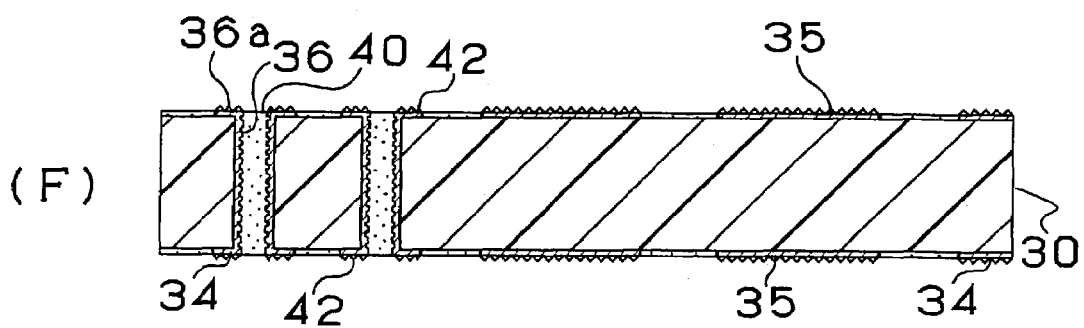
(F)
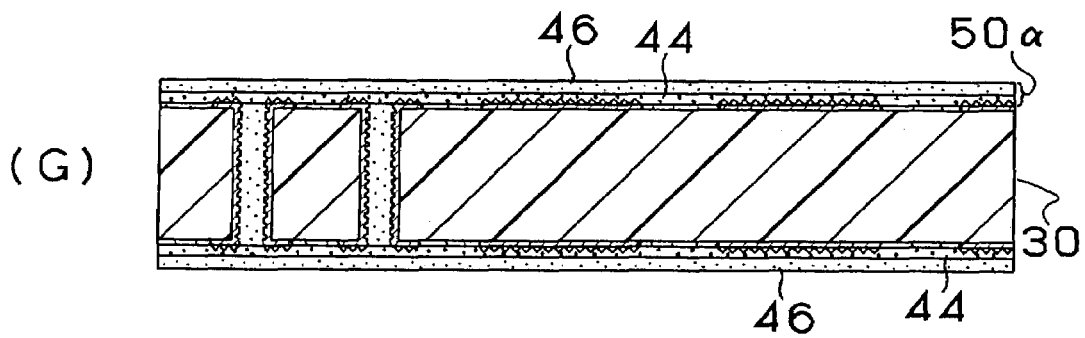
(G)
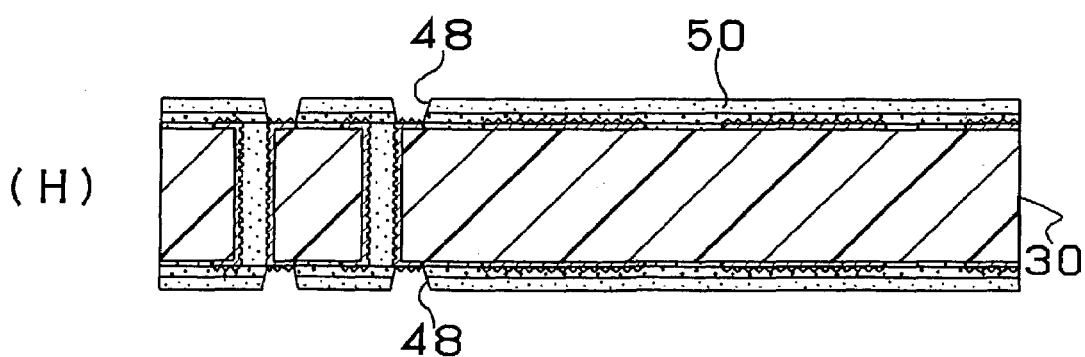
(H)

Fig. 4
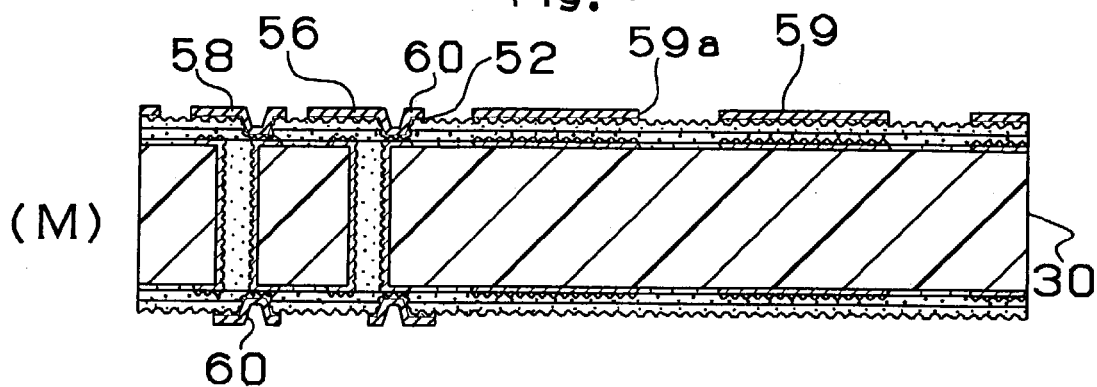
(M)
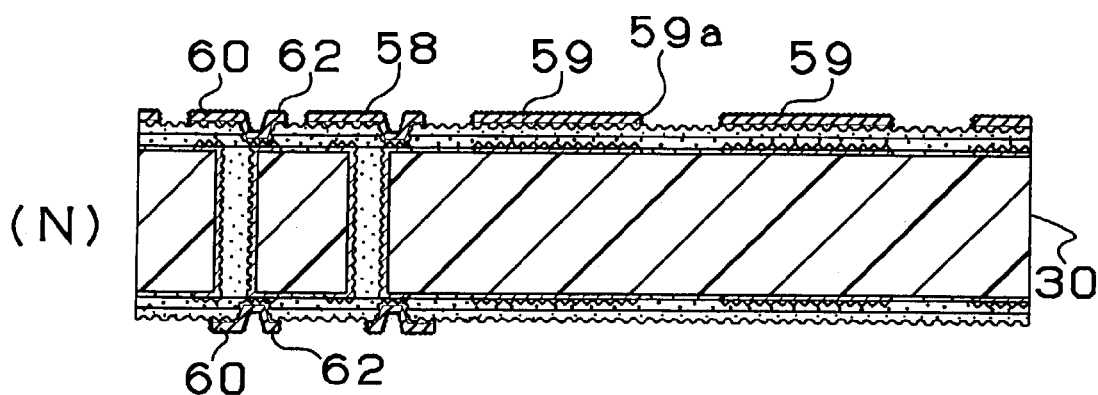
(N)
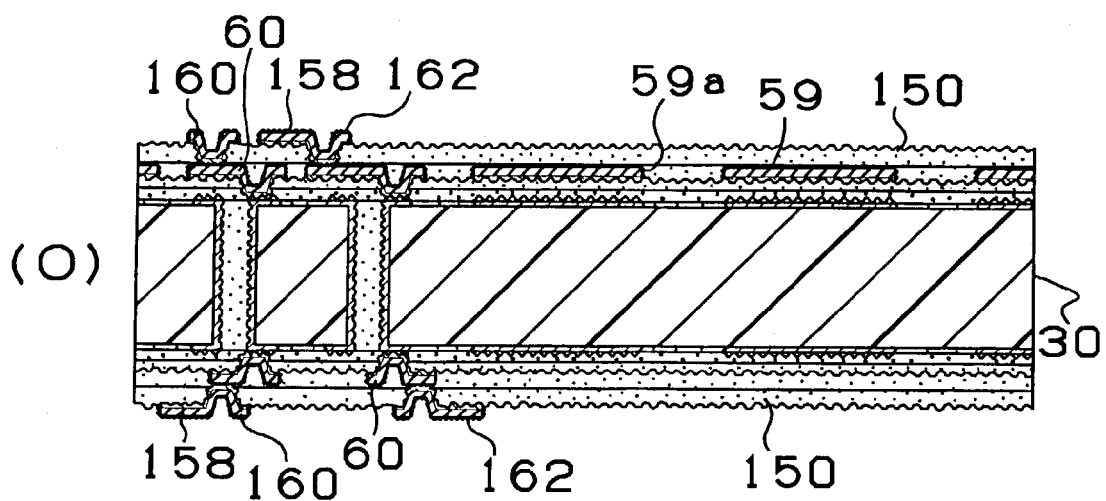
(O)

Fig.5
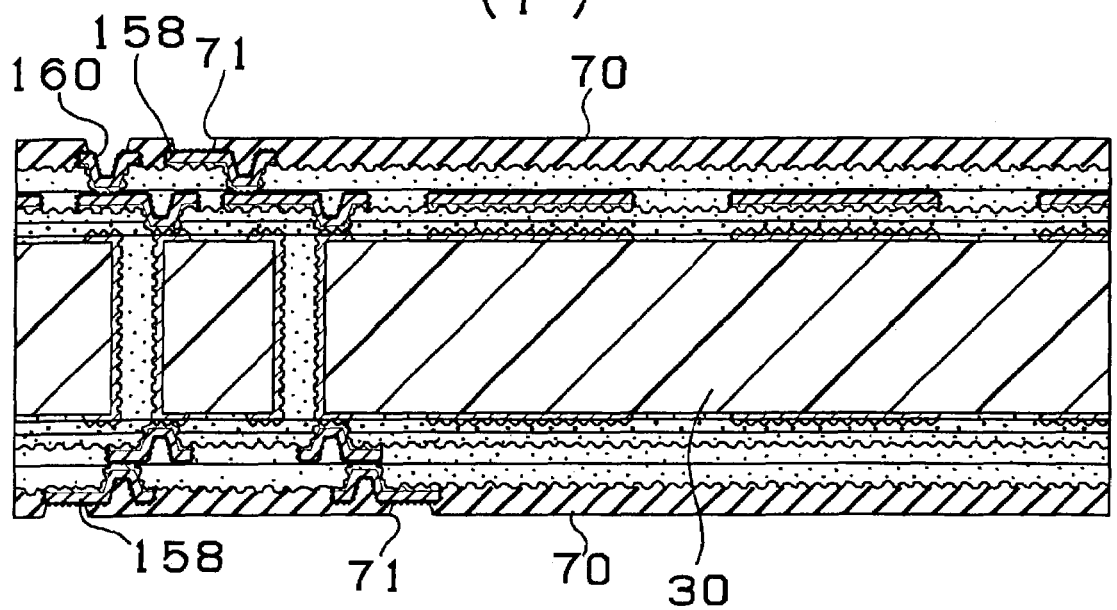
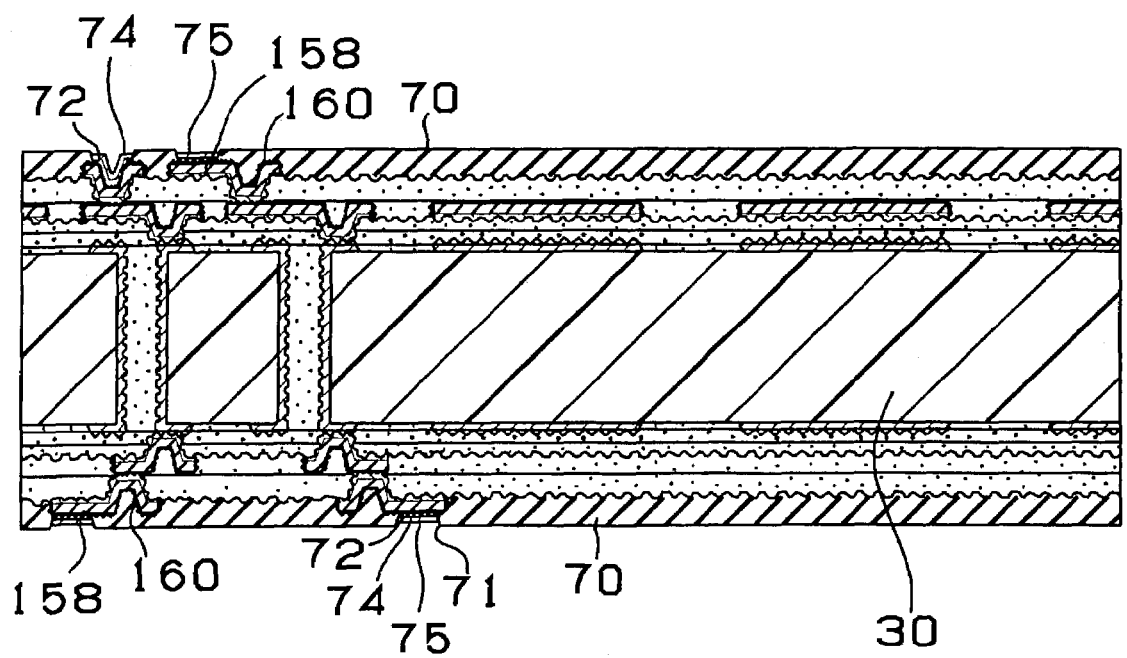

Fig.8
(A)
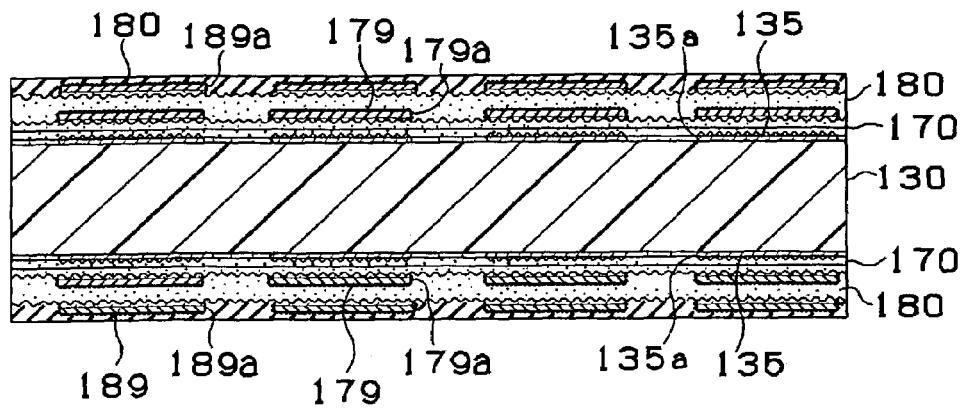
(B)
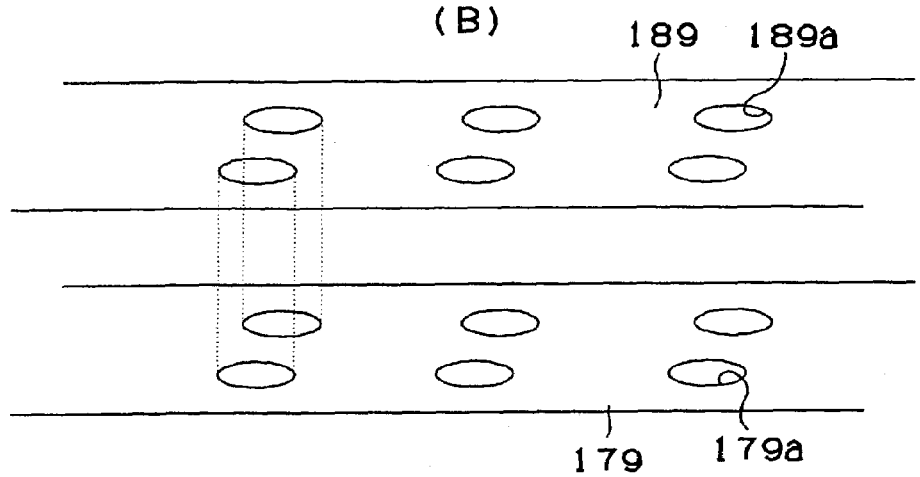
(C)
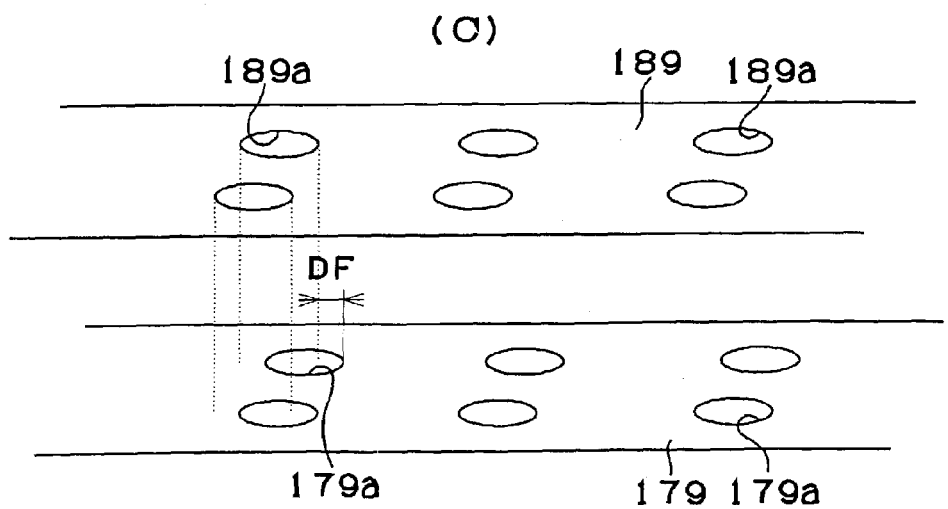

Fig.9
(A)
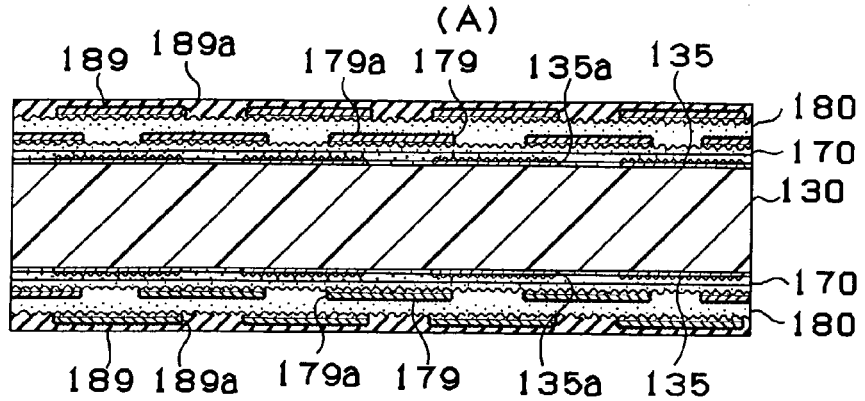
(B)
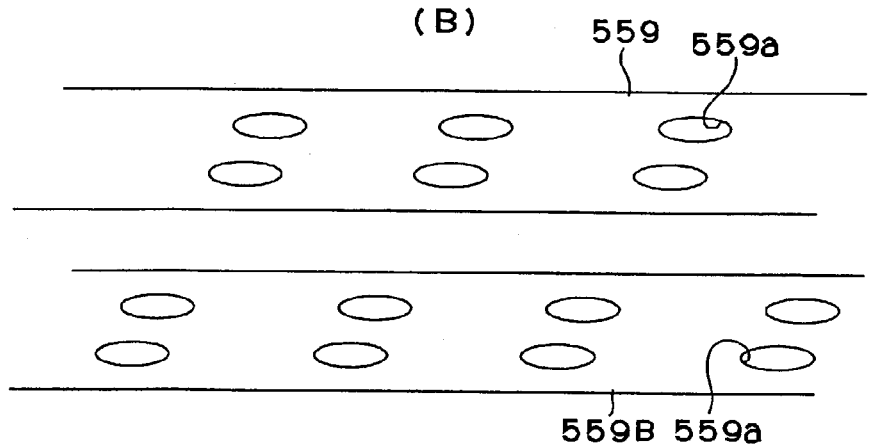
(C)
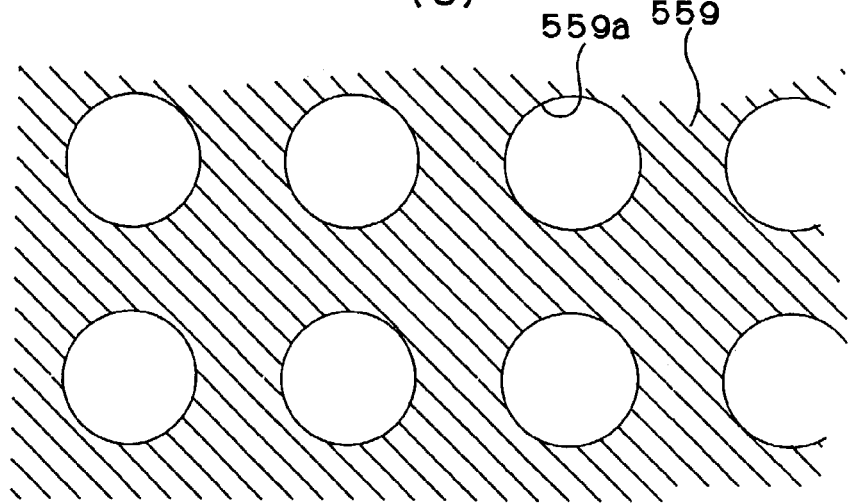

Fig. 15
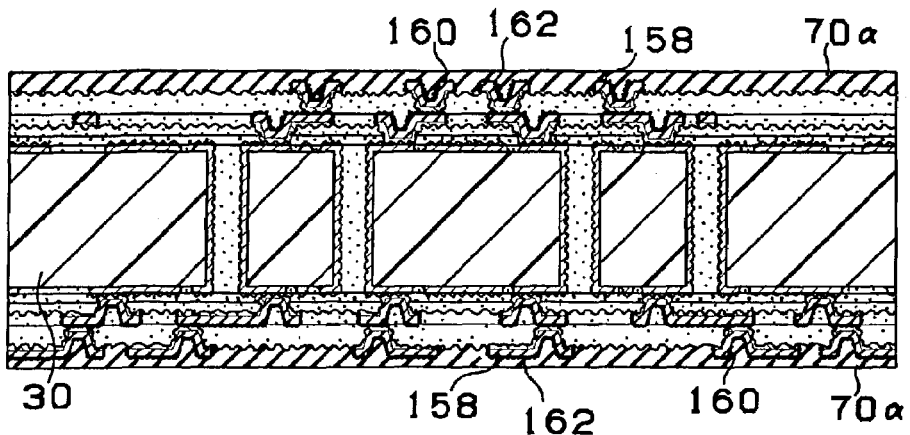
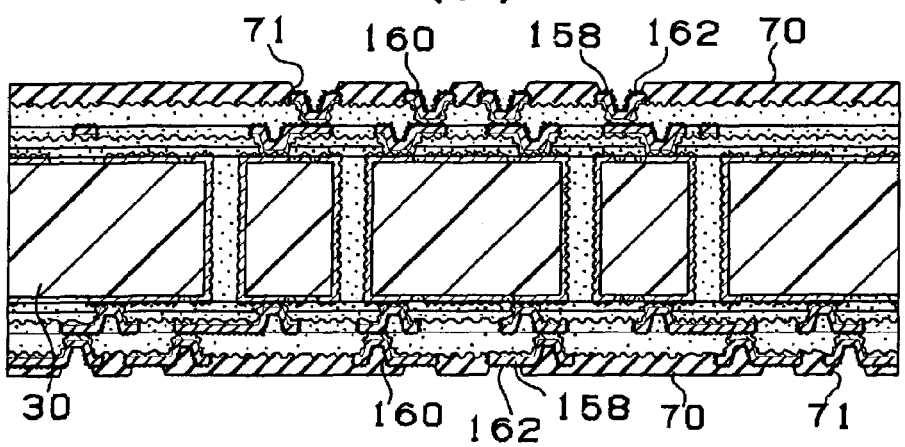
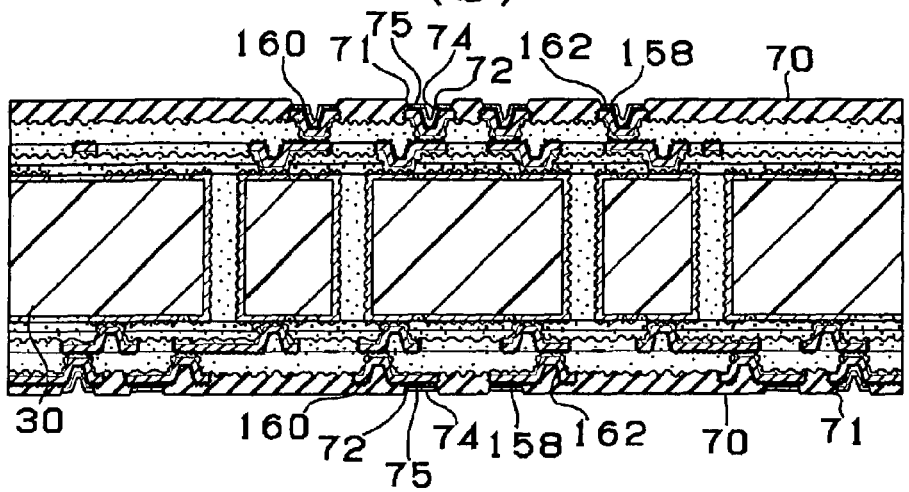

Fig. 18
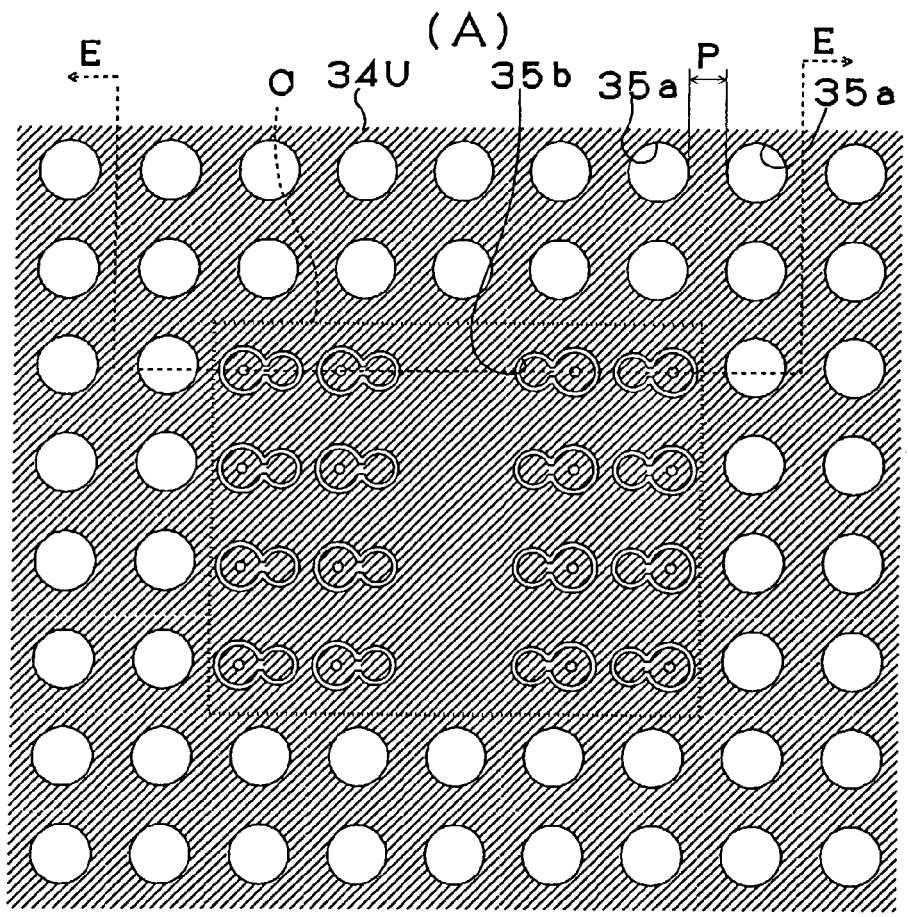
(A)
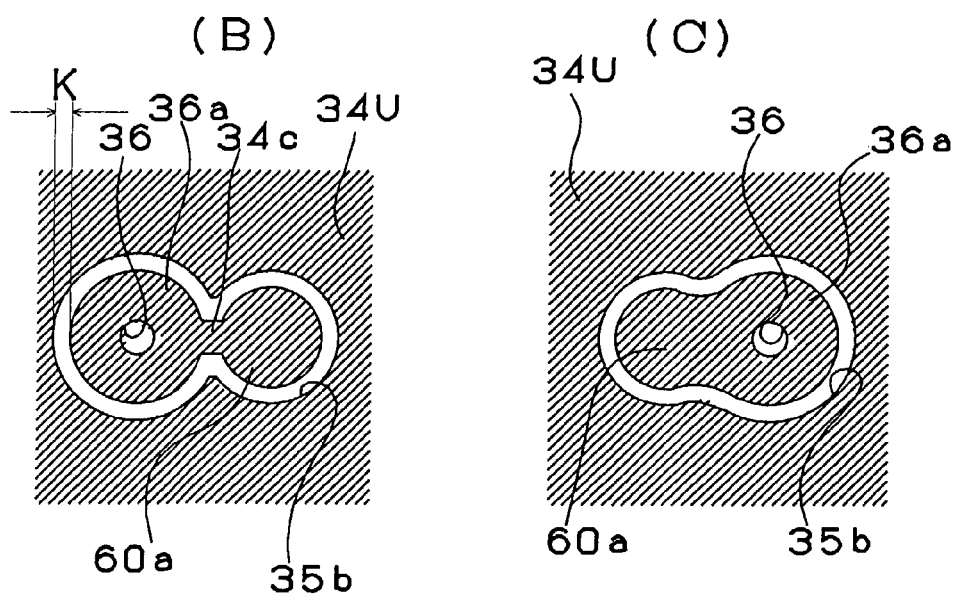
(B)  (C)

Fig. 20
(A)
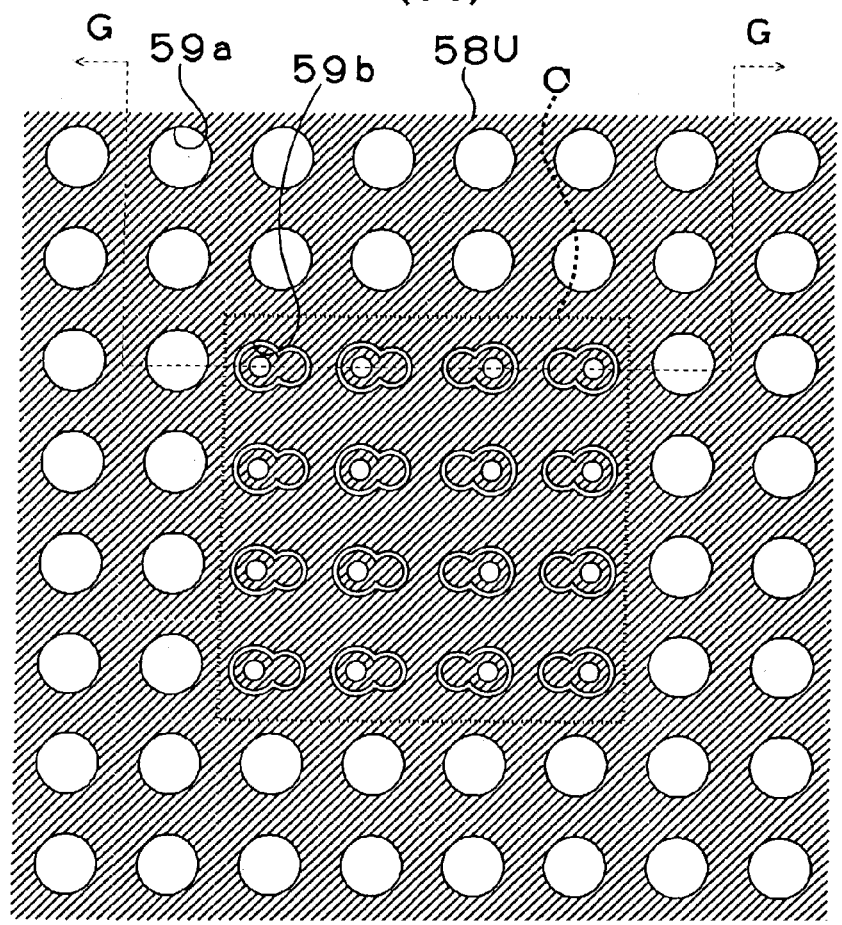
(B)  (C)
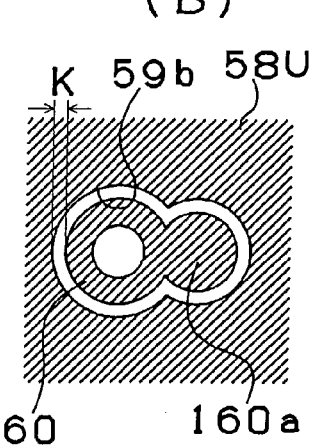
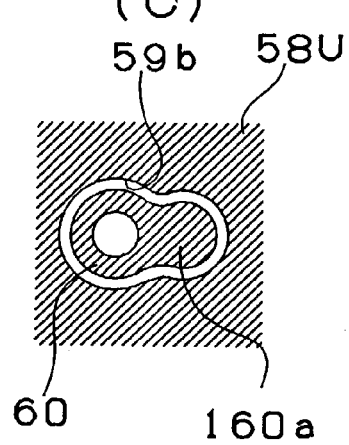

Fig. 21
(A)
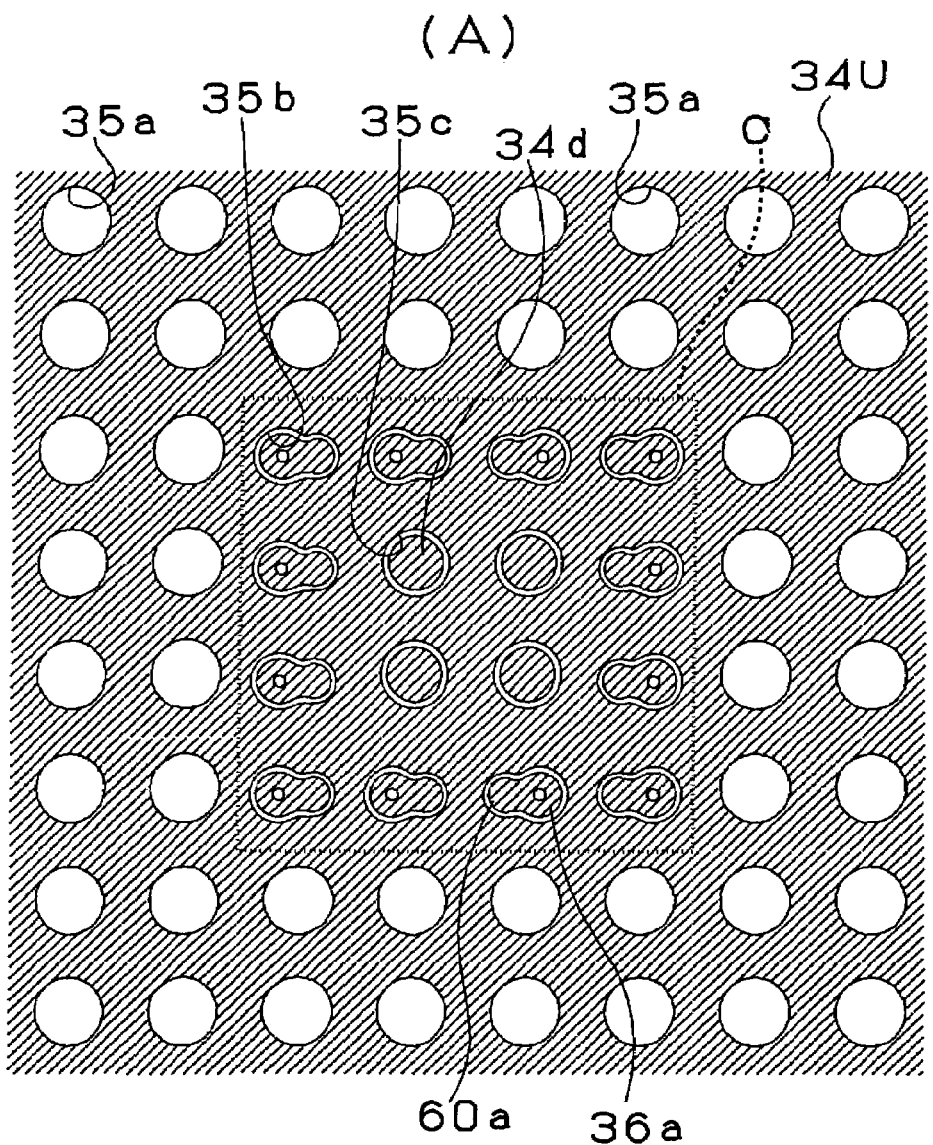
(B)
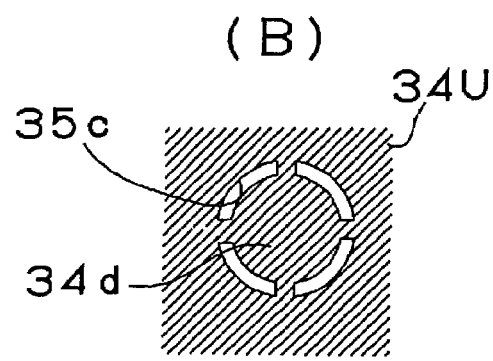

Fig. 22
(A)
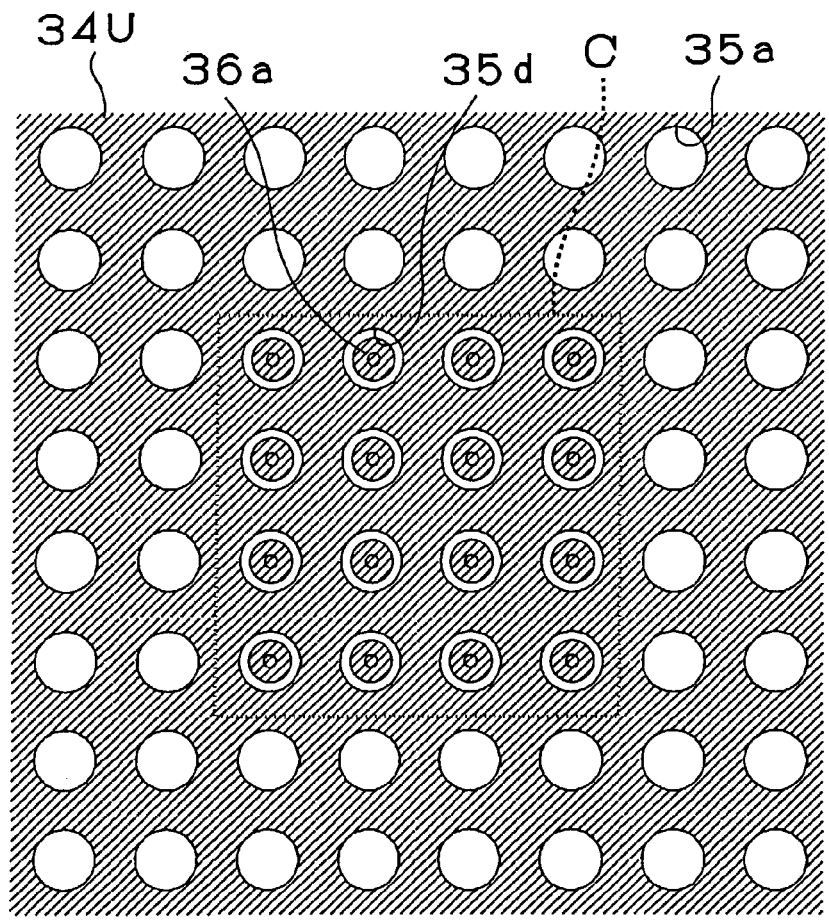
(B)
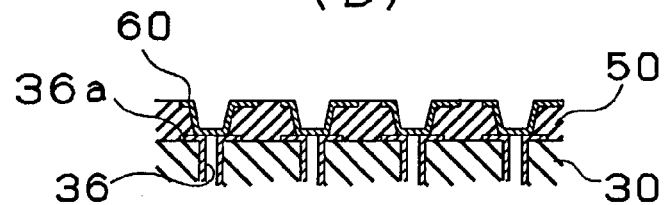
(C)
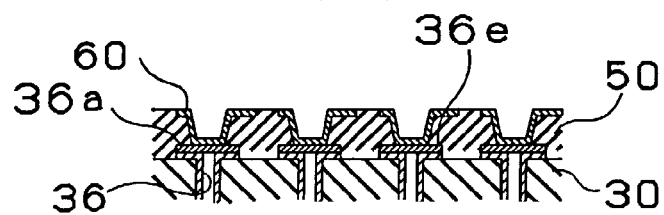

Fig. 34
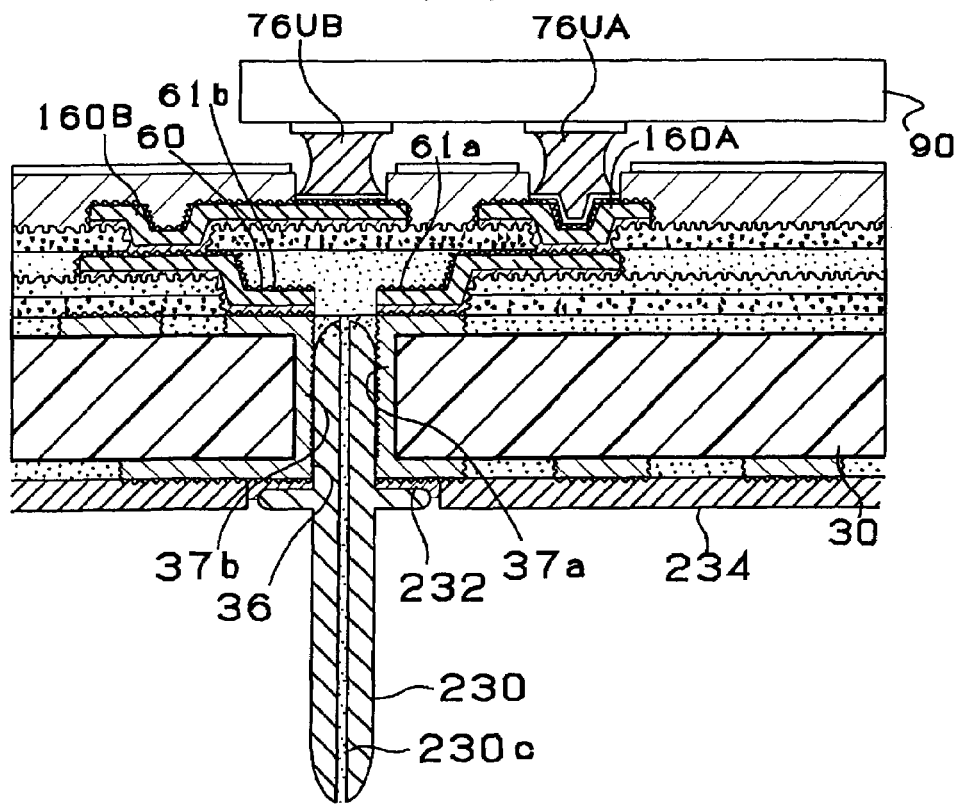
(A)
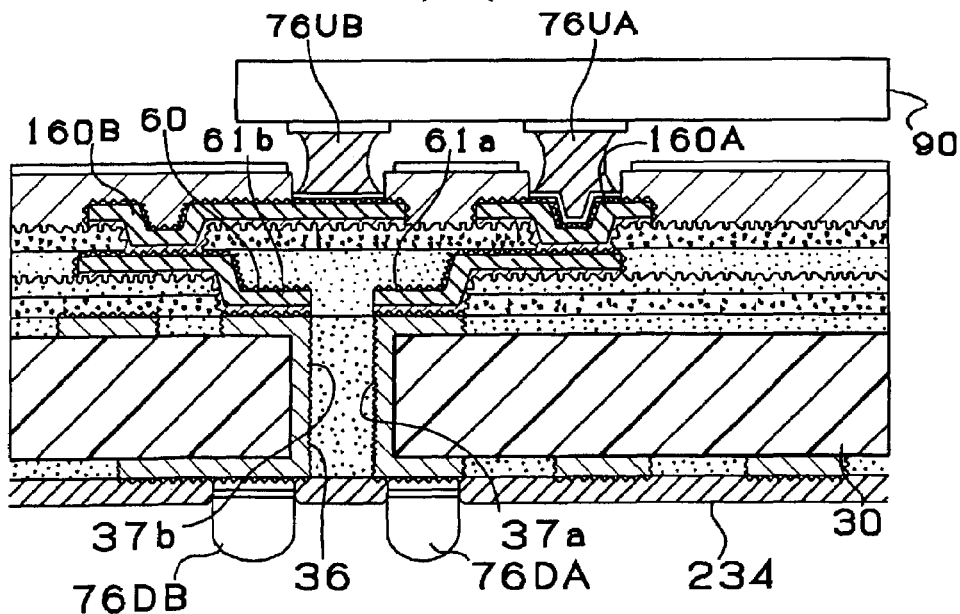
(B)

Fig. 35
(A)
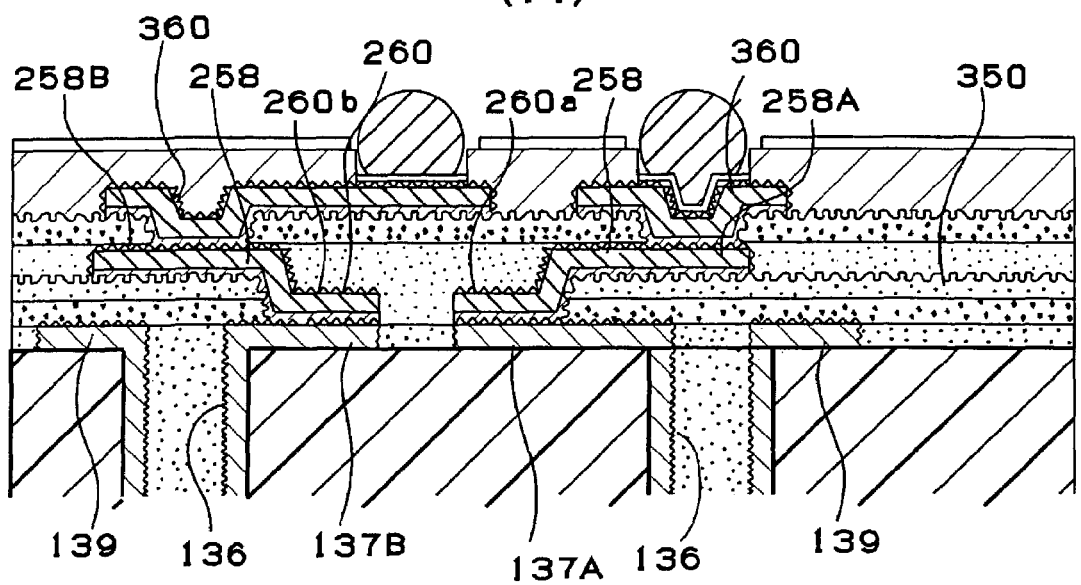
(B)
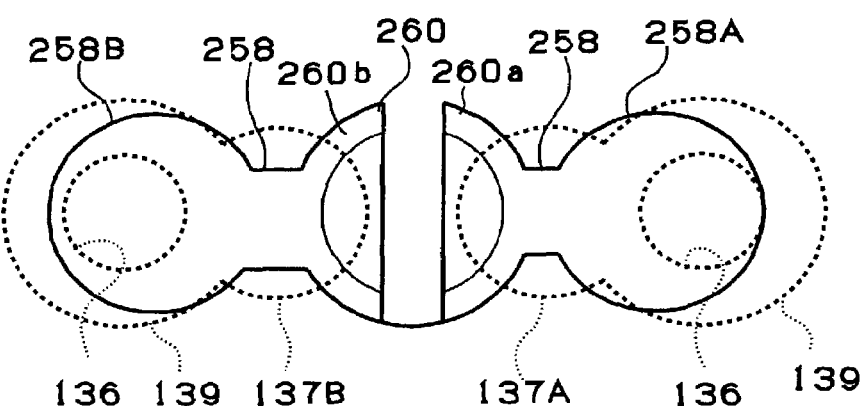

Fig. 43
(A)
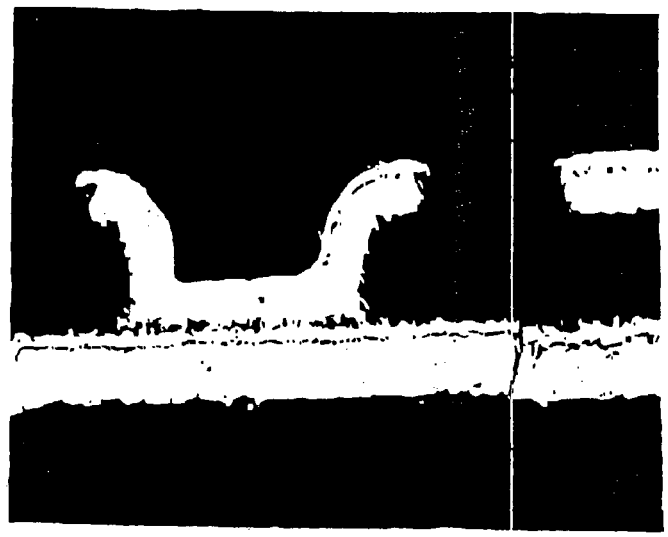
10μm
(B)
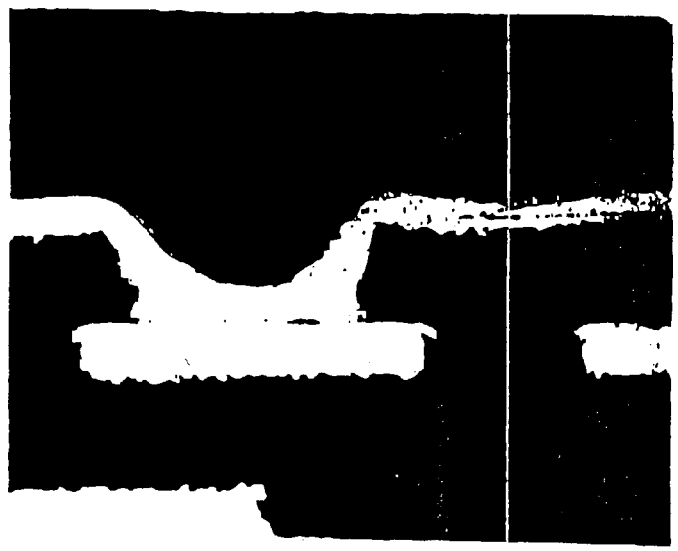
10μm

MULTILAYER BUILD-UP WIRING BOARD

This application is a divisional patent application of U.S. Ser. No. 09/787,321, filed May 17, 2001, now U.S. Pat. No. 6,613,986 the contents of which are incorporated herein in their entirety.

FIELD OF THE INVENTION

The present invention relates to a multilayer build-up wiring board having build-up wiring layers each consisting of interlayer resin insulating layers and conductor layers provided alternately on both sides of a core substrate. The present invention relates to, in particular, a multilayer build-up wiring board provided with plane layer formed as a power conductor layer (power layer) or as a ground conductor layer (ground layer).

BACKGROUND OF THE INVENTION

To reduce noise and the like, one layer of a conductor circuit is used as a ground layer or a power layer in a multilayer build-up wiring board having a plurality of conductor layers (conductor circuits) isolated by interlayer resin insulating layers, respectively. In the multilayer build-up wiring board, as shown in FIG. 9C, a plain layer 559 forming a ground conductor layer (ground layer) or a power conductor layer (power layer) is often formed into a mesh pattern having mesh holes 559a. The reason for providing the mesh holes 559a is as follows. Since the plain layer 559 is formed of copper having a low connection property for connecting with resin, the connection between an upper layer or an interlayer resin insulating layer (not shown) and a lower layer or a resin core substrate (not shown) is improved by directly connecting the interlayer resin insulating layer to the core substrate with the mesh holes 559a. In addition, it is intended to make it easy for gas containing moisture and the like absorbed by the interlayer resin insulating layer to exhale through the mesh holes 559a.

As for the positions for forming these mesh hole 559a, there are various proposals made. For example, Japanese Patent Unexamined Application Publication No. 1-163634 proposes, as shown in FIG. 9B, a technique for providing the penetrating holes 559a of an upper plain layer 559 and mesh holes 559a of a lower plain layer 559B so as not to overlap one another by shifting the positions of the penetrating holes 559a of the upper plain layer 559 and those of the mesh holes 559a of the lower plain layer 559B from one another to thereby prevent recessed portions from being formed on the surface of a board.

An interlayer resin insulating layer separating conductor layers is required to have high insulating property. The inventor of the present invention discovered that the insulating property of the interlayer resin insulating layer correlates to the relative positional relationship between the penetrating holes formed on the upper and lower plain layers. Then, a multilayer build-up wiring board is formed while the positions of the penetrating holes are adjusted, and the insulating property of the interlayer resin insulating layer is measured. As a result, the present inventor reached a conclusion that if the penetrating holes 559a of the upper plain layer 559 are shifted from the mesh holes 559a of the lower plain layer 559B as shown in FIG. 9B, the insulating property of the interlayer resin insulating layer greatly deteriorates.

The present invention has been made to solve the above-stated disadvantage. One object of the present invention is to provide a multilayer build-up wiring board provided with a plain layer and having the less deterioration of the insulating property of the interlayer resin insulating layer.

Meanwhile, as for the positions at which these mesh holes are formed, various proposals have been made. For example, Japanese Patent Unexamined Application Publication No. 10-200271 proposes a technique, as shown in FIG. 23, that mesh holes are not provided in a region of a plain layer 559 facing a chip mount region indicated by C and only provided in a region outside the chip mount region, thereby preventing irregular portions from being provided in the chip mounting region to thereby make the chip mount region flat on a multilayer printed circuit board.

As stated above, gas contained in the interlayer resin insulating layer is exhaled through the mesh holes. If no mesh hole is provided in the chip mount region as in the above technique, moisture does not exhale from an interlayer resin insulating layer below the chip mount region. Then, the interlayer resin insulating layer is peeled off or the insulation resistance of the interlayer resin insulating layer deteriorates.

The present invention has been made to solve the above disadvantage and its still further object is to provide a multilayer build-up wiring board having less insulation deterioration of the interlayer resin insulating layer and capable of forming a flat chip mount region.

Meanwhile, a multilayer build-up wiring board forming a package board for mounting an IC chip and the like is formed by alternately building up interlayer resin insulating layers and conductor layers on a core board provided with through holes and by providing connection bumps for connecting to the IC chip on the upper surface side and bumps for connecting to a mother board on the lower surface side. Then, the upper and lower conductor layers are connected by forming via holes and the via holes on the upper layer of the core board and those on the lower layer thereof are connected to one another by a through hole.

However, the via holes are formed by providing non-penetrating holes in the interlayer resin insulating layers. Due to this, the number of via holes of a fixed size to be formed in the multilayer build-up wiring board is physically limited, which is one of the factors disadvantageously preventing high concentration of the via holes in the multilayer build-up wiring board.

The present invention has been made to solve the above disadvantage and its still further object is to provide a multilayer build-up wiring board capable of providing wirings with high concentration.

Further, as a technique for a multilayer build-up wiring board using a resin board, for example, Japanese Patent Examined Application Publication No. 4-55555 proposes a method of forming epoxy acrylate on a glass epoxy board, on which circuits are mounted, as interlayer resin insulating layers, providing opening portions for via holes using photolithography, roughening the surface, providing a plating resist and thereby forming conductor circuits and via holes by plating.

Conventionally, after the conductor circuits and via holes are formed by the above method, a roughened layer made of Cu—Ni—P alloy for coating the conductor circuits and the like is formed by electroless plating and an interlayer resin insulating layer is formed thereon.

However, if fabricated printed circuit boards are subjected to a heat cycle test or the like, some of them cannot be used as a multilayer build-up wiring board because cracks occur from the corners of an upper layer conductor circuit through the interlayer resin insulating layer and the cracks spread toward the upper surface of the board and a lower layer conductor circuit resulting from the difference in heat expansion between the upper layer conductor circuit made of metal and the interlayer resin insulating layer made of resin.

The reason the cracks occur is, it appears, that the corners of the upper layer conductor circuit tend to be sharpened and stress is concentrated on the corners by the expansion and compression due to the temperature change of the upper layer conductor circuit.

The present invention has been made to solve the above disadvantage of the conventional technique and a still further object is to provide a wiring board and a multilayer build-up wiring board capable of preventing the concentration of stress derived from the change of temperature of the corners of the formed conductor circuit and preventing the resin insulating layer from cracking.

DISCLOSURE OF THE INVENTION

To obtain the above objects, a multilayer build-up wiring board recited in claim 1 is a multilayer build-up wiring board obtained by alternately providing interlayer resin insulating layers and conductor layers, technically characterized in that
  a plurality of plain layers (which function as power conductor layers or ground conductor layers) are formed as the conductor layers; and
  mesh holes are formed in the plurality of plain layers so that at least part of the mesh holes overlay one another.

A multilayer build-up wiring board recited in claim 2 is a multilayer build-up wiring board obtained by alternately providing interlayer resin insulating layers and conductor layers, technically characterized in that
  plain layers (serving as power conductor layers or ground conductor layers) are formed as conductor layers at least one side of the core substrate;
  a plain layer is formed out of at least one of the conductor layers formed between the interlayer resin insulating layers; and
  mesh holes are formed in the plain layer of the core substrate and the plain layer between the interlayer resin insulating layers so that at least part of the mesh holes overlay one another.

According to claim 3, the multilayer build-up wiring board according to claim 1 or 2, is characterized in that
  a diameter of each of said mesh holes is set at 75 to 300 μm and a distance between the mesh holes is set at 100 to 1500 μm.

According to claim 1, the mesh holes of the upper and lower plain layers are formed such that at least part of them overlay one another, thereby preventing the insulating properties of the interlayer resin insulating layers from greatly deteriorating.

Here, the diameter of each mesh hole is preferably 75 to 300 μm. The reason is as follows. If the diameter is less than 75 μm, it is difficult to overlay upper and lower mesh holes on one another. If it exceeds 300 μm, the conductor layers do not function as power conductor layers (power layers) or ground conductor layers (ground layers). In addition, the distance between the mesh holes is preferably 100 to 1500 μm. The reason is as follows. If the distance is less than 100 μm, the area of the plain layer becomes small and the plain layer cannot function. If the distance exceeds 1500 μm, the degree of deterioration of insulating properties of the interlayer resin insulating layers becomes considerably high.

In the present invention, it is desirable to use an adhesive for electroless plating as the above interlayer resin insulating layer. In this adhesive for electroless plating, it is optimal that heat resisting resin particles soluble to a hardened acid or oxidizing agent are dispersed into unhardened heat resisting resin which has difficult solubility to an acid or an oxidizing agent.

The heat resisting resin particles are dissolved and removed by processing these resin particles using an acid or an oxidizing agent, and a coarsened face constructed by an anchor formed in the shape of an octopus trap can be formed on a layer surface.

In the above adhesive for electroless plating, the above heat resisting resin particles particularly hardened are desirably constructed by using ① heat resisting resin powder having an average particle diameter equal to or smaller than 10 μm, ② cohesive particles formed by aggregating heat resisting resin powder having an average particle diameter equal to or smaller than 2 μm, ③ a mixture of heat resisting powder resin powder having an average particle diameter from 2 to 10 μm and heat resisting resin powder having an average particle diameter equal to or smaller than 2 μm, ④ pseudo-particles in which at least one kind of heat resisting resin powder or inorganic powder having an average particle diameter equal to or smaller than 2 μm is attached to the surface of heat resisting resin powder having an average particle diameter from 2 to 10 μm, ⑤ a mixture of heat resisting powder resin powder having an average particle diameter from 0.1 to 0.8 μm and heat resisting resin powder having an average particle diameter greater than 0.8 μm and smaller than 2 μm, and ⑥ heat resisting powder resin powder having an average particle diameter from 0.1 to 1.0 μm. This is because these materials can form a more complicated anchor.

A depth of the coarsened face is preferably set to secure a close attaching property such that Rmax=0.01 to 20 μm. In particular, Rmax preferably ranges from 0.1 to 5 μm in the semi-additive method since an electroless plating film can be removed while the close attaching property is secured.

The heat resisting resin which has difficult solubility to an acid or an oxidizing agent mentioned above is desirably constructed by "a resin complex constructed by thermosetting resin and thermoplastic resin", or "a resin complex constructed by photosensitive resin and thermoplastic resin". The former has a high heat resisting property. The latter is desirable since the opening for the via hole can be formed by photolithography.

The above thermosetting resin can be constructed by using epoxy resin, phenol resin, polyimide resin, etc. When the thermosetting resin is photosensitized, a thermosetting group acrylic-reacts on methacrylic acid, acrylic acid, etc. Acrylate of the epoxy resin is particularly optimal.

The epoxy resin can be constructed by using epoxy resin of novolak type such as phenol novolak type, cresol novolak type, etc., dicyclopentadiene-modified alicyclic epoxy resin, etc.

The thermoplastic resin can be constructed by using polyether sulfone (PES), polysulfone (PSF), polyphenylene sulfone (PPS), polyphenylene sulfide (PPES), polyphenyl ether (PPE), polyether imide (PI), etc.

A mixing ratio of the thermosetting resin (photosensitive resin) and the thermoplastic resin is preferably set such that thermosetting resin (photosensitive resin)/thermoplastic resin=95/5 to 50/50. This is because a high toughness value can be secured without reducing a heating resisting property.

A mixing weight ratio of the above heat resisting resin particles is preferably set to range from 5 to 50 weight % and desirably range from 10 to 40 weight % with respect to the solid content of a heat resisting resin matrix.

The heat resisting resin particles are preferably constructed by amino resin (melamine resin, urea resin, guanamine resin), epoxy resin, etc.

The adhesive may be constructed by two layers having different compositions.

Various kinds of resins can be used as a solder resist layer added to a surface of the multilayer build-up wiring board. For example, it is possible to use bisphenol A-type epoxy resin, acrylate of bisphenol A-type epoxy resin, novolak type epoxy resin, resin formed by hardening acrylate of novolak type epoxy resin by an amine-systemhardening agent, an imidazole hardening agent, etc.

There is a case in which such a solder resist layer is separated since the solder resist layer is constructed by resin having a stiff skeleton. Therefore, the separation of the solder resist layer can be also prevented by arranging a reinforcing layer.

The above acrylate of the novolak type epoxy resin can be constructed by using epoxy resin in which glycidyl ether of phenol novolak and cresol novolak reacts with acrylic acid, methacrylic acid, etc.

The above imidazole hardening agent is desirably formed in a liquid state at 25° C. since the imidazole hardening agent can be uniformly mixed in the liquid state.

Such a liquid state imidazole hardening agent can be constructed by using 1-benzyl-2-methylimidazole (product name: 1B2MZ), 1-cyanoethyl-2-ethyl-4-methylimidazole (product name: 2E4MZ-CN) and 4-methyl-2-ethylimidazole (product name: 2E4MZ).

An adding amount of this imidazole hardening agent is desirably set to range from 1 to 10 weight % with respect to a total solid content of the above solder resist composition substance. This is because the imidazole hardening agent is easily uniformed and mixed if the adding amount lies within this range.

A composition substance prior to the hardening of the above solder resist is desirably constructed by using a solvent of a glycol ether system as a solvent.

In the solder resist layer using such a composition substance, no free acid is caused and no copper pad surface is oxidized. Further, a harmful property with respect to a human body is low.

Such a solvent of the glycol ether system is constructed by using the following structural formula, particularly desirable using at least one kind selected from diethylene glycol dimethyl ether (DMDG) and triethylene glycol dimethyl ether (DMTG). This is because these solvents can perfectly dissolve benzophenone and Michler's ketone as reaction starting agents at a heating temperature from about 30 to 50° C.

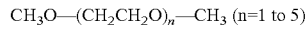

$CH_3O$—$(CH_2CH_2O)_n$—$CH_3$ (n=1 to 5)

This solvent of the glycol ether system preferably has 10 to 70 wt % with respect to a total weight amount of the solder resist composition substance.

As explained above, various kinds of antifoaming and leveling agents, thermosetting resin for improving a heat resisting property and an antibasic property and giving a flexible property, a photosensitive monomer for improving resolution, etc. can be further added to the solder resist composition substance.

For example, the leveling agent is preferably constructed by monomer of acrylic ester. A starting agent is preferably constructed by Irugacure 1907 manufactured by CHIBA-GAIGI. A photosensitizer is preferably constructed by DETX-S manufactured by NIHON KAYAKU.

Further, a coloring matter and a pigment may be added to the solder resist composition substance since a wiring pattern can be hidden. This coloring matter is desirably constructed by using phthalocyaline green.

Bisphenol type epoxy resin can be used as the above thermosetting resin as an adding component. In this bisphenol type epoxy resin, there are bisphenol A-type epoxy resin and bisphenol F-type epoxy resin. The former is preferable when an antibasic property is earnestly considered. The latter is preferable when low viscosity is required (when a coating property is earnestly considered).

A polyhydric acrylic-system monomer can be used as the above photosensitive monomer as an adding component since the polyhydric acrylic-system monomer can improve resolution. For example, DPE-6A manufactured by NIHON KAYAKU and R-604. manufactured by KYOEISYA KAGAKU can be used as the polyhydric acrylic-system monomer.

These solder resist composition substances preferably have 0.5 to 10 Pa·s in viscosity at 25° C. and more desirably have 1 to 10 Pa·s in viscosity since these solder resist composition substances are easily coated by a roll coater in these cases.

To obtain the above objects, according to claim 4, a multilayer build-up wiring board obtained by alternately providing interlayer resin insulating layers and conductor layers, provided with a chip mount region on which a chip is mounted on an outermost layer and having the conductor layers connected to each other by via holes, respectively characterized in that mesh holes are provided in plain layers formed as said conductor layers, and lands of through holes or the via holes and pads connected to the via holes are provided in at least part of mesh holes in a region facing said chip mount region through the interlayer resin insulating layers.

According to the invention recited in claim 4, mesh holes are formed in a region in the plain layers facing the chip mount region of the outermost layer through the interlayer resin insulating layers and the land of a through hole or via hole and a pad to which a via hole is connected are provided in at least part of the mesh holes with a distance kept between the land and pad and the peripheral edge of the mesh hole. Due to this, the interlayer resin insulating layer provided above the plain layer and the interlayer resin insulating layer (or a resin core substrate) provided below the plain layer can be directly connected with each other through the mesh holes provided on the outer periphery of the land, thereby making it possible to increase bonding property. In addition, gas containing moisture and the like absorbed by the interlayer resin insulating layers can be exhaled through the mesh holes provided on the outer peripheries of the land, so that the insulating properties of the interlayer resin insulating layers can be improved. Further, since the land and via hole are provided in each of the mesh holes in the chip mount region, no irregular portions are formed and the chip mount region can be made flat.

Furthermore, according to claim 5, a multilayer build-up wiring board obtained by alternately providing interlayer resin insulating layers and conductor layers, provided with a chip mount region on an outermost layer and having the conductor layers connected to each other by via holes, respectively, is characterized in that mesh holes are provided in plain layers formed as said conductor layers, and lands of the via holes are provided in at least part of the mesh holes in a region facing said chip mount region through the interlayer resin insulating layers.

According to the invention recited in claim 5, mesh holes are formed in a region in the plain layers facing the chip mount region of the outermost layer through the interlayer resin insulating layers and the land of a via hole is provided in each of at least part of the mesh holes with a distance kept between the land of the via hole and the peripheral edge of the mesh hole. Due to this, the interlayer resin insulating layer provided above the plain layer and the interlayer resin insulating layer (or a resin core substrate) provided below the plain layer can be directly connected with each other through the mesh holes provided on the outer periphery of the land of the via hole, thereby making it possible to increase bonding property. In addition, gas containing moisture and the like absorbed by the interlayer resininsulating layers can be exhaled through the mesh holes provided on the outer peripheries of the lands, so that the insulating properties of the interlayer resin insulating layers can be improved. Further, since a via hole is provided in each of the mesh holes in the chip mount region, no irregular portions are formed and the chip mount region can be made flat.

According to claim 6, a multilayer build-up wiring board obtained by alternately providing interlayer resin insulating layers and conductor layers, provided with a chip mount region on an outermost layer is characterized in that mesh holes are provided in plain layers formed as said conductor layers, and solid conductor layers are provided in at least part of mesh holes in a region facing said chip mount region through the interlayer resin insulating layers.

According to the invention recited in claim 6, mesh holes are formed in a region in the plain layers facing the chip mount region of the outermost layer through the interlayer resin insulating layers and a solid conductor layer is provided in each of at least part of the mesh holes with a distance kept between the solid conductor layer and the peripheral edge of the mesh hole. Due to this, the interlayer resin insulating layer provided above the plain layer and the interlayer resin insulating layer (or a resin core substrate) provided below the plain layer can be directly connected with each other through the meshes provided on the outer periphery of the solid conductor layer, thereby making it possible to increase bonding property. In addition, gas containing moisture and the like absorbed by the interlayer resin insulating layers can be exhaled through the mesh holes provided on the outer peripheries of the solid conductor layers, so that the insulating properties of the interlayer resin insulating layers can be increased. Further, since the solid conductor layer is provided in each of the mesh holes in the chip mount region, no irregular portions are formed and the chip mount region can be made flat.

According to claim 7, a multilayer build-up wiring board wherein interlayer resin insulating layers and conductor layers are alternately provided on a substrate having through holes and a chip mount region for mounting a chip is provided on an outermost layer, is characterized in that mesh holes are provided in plain layers formed as said conductor layers, and lands of the through holes are provided in at least part of mesh holes in a region facing said chip mount region through the interlayer resin insulating layers.

According to the invention recited in claim 7, mesh holes are formed in a region in the plain layers facing the chip mount region of the outermost layer through the interlayer resin insulating layers and the land of a the through hole is provided in each of at least part of the mesh holes with a distance kept between the through hole and the peripheral edge of the mesh hole. Due to this, the interlayer resin insulating layer provided above the plain layer and the interlayer resin insulating layer (or a resin core substrate) provided below the plain layer can be directly connected with each other through the meshes provided on the outer periphery of the lands, thereby making it possible to increase bonding property. In addition, gas containing moisture and the like absorbed by the interlayer resin insulating layers can be exhaled through the mesh holes provided on the outer peripheries of the lands, so that the insulating properties of the interlayer resin insulating layers can be increased. Further, since the land is provided in each of the mesh holes in the chip mount region, no irregular portions are formed and the chip mount region can be made flat.

It is noted that the plain layer may face the chip mount region through at least one of the interlayer resin insulating layers according to the present invention.

To solve the above disadvantage, according to claim 8, a multilayer build-up wiring board having a multilayer wiring layer, wherein interlayer resin insulating layers and conductor layers are alternately provided and the conductor layers are connected to each other by via holes, respectively, the multilayer wiring layer formed on a core substrate, is characterized in that one of said via holes is formed out of a plurality of wiring paths.

On the multilayer build-up wiring board recited in claim 8, since one via hole consists of a plurality of wiring paths, several times as many wiring paths as the via holes can be passed through the interlayer resin insulating layers, thereby making it possible to provide wirings on the multilayer build-up wiring board with high concentration.

According to claim 9, a multilayer build-up wiring board having a multilayer wiring layer, wherein interlayer resin insulating layers and conductor layers are alternately provided and the conductor layers are connected to each other by via holes, respectively, the multilayer wiring layer formed on a core substrate, characterized in that one of said via holes is formed out of two wiring paths.

On the multilayer build-up wiring board recited in claim 9, since one via hole consists of two wiring paths, twice as many the wiring paths as the via holes can be passed through the interlayer resin insulating layers, thereby making it possible to provide wirings on the multilayer build-up wiring board with high concentration.

According to claim 10, a multilayer build-up wiring board having a multilayer wiring layer, wherein interlayer resin insulating layers and conductor layers are alternately provided and the conductor layers are connected to each other by via holes, respectively, the multilayer wiring layer formed on a core substrate, said conductor layers electrically connected to conductor layers on back side of the core substrate by through holes formed in the core substrate, respectively, is characterized in that a plurality of wiring paths are provided in each of the through hole in said core substrate; and via holes consisting of a plurality of wiring paths each connected to each of said wiring paths of said through hole are provided right on said through holes in which said plurality of wiring paths are provided.

On the multilayer build-up wiring board recited in claim 10, since a plurality of wiring paths are arranged in one through hole, several times as many the wiring paths as the through holes can be passed through the core substrate. Also, since the via hole provided right on the through hole consists of a plurality of wring paths, several times as many the wiring paths as the via holes can be passed through the interlayer resin insulating layers. This makes it possible to provide wirings on the multilayer build-up wiring board with high concentration. Besides, due to the fact that via holes are formed right on the through holes, the wiring length becomes shortened and it is possible to deal with the demand of providing a high-speed multilayer build-up wiring board.

Furthermore, even if a build-up wiring layer is provided on one side of the core substrate, several times as many wiring paths as through holes can be passed through the core substrate since a plurality of wiring paths are arranged in one through core. Thus, the degree of freedom for the wirings on opposite side to that on which the build-up layer is provided enhances.

According to claim 11, a multilayer build-up wiring board having a multilayer wiring layer, wherein interlayer resin insulating layers and conductor layers are alternately provided and the conductor layers are connected to each other by via holes, the multilayer wiring layer formed on both sides of a core substrate, conductor layers of the both sides of said core substrate electrically connected to one another by through holes formed in the core substrate, is characterized in that a plurality of wiring paths are provided in each of the through holes in said core substrate; and via holes consisting of a plurality of wiring paths each connected to each of said wiring paths of said through hole are provided right on said through holes in which said plurality of wiring paths are provided.

On the multilayer build-up wiring board recited in claim 11, since a plurality of wiring paths are arranged in one through hole, several times as many the wiring paths as the through holes can be passed through the core substrate. Also, since the via hole provided right on the through hole consists of a plurality of wiring paths, several times as many the wiring paths as the via holes can be passed through the interlayer resin insulating layers. This makes it possible to provide wirings on the multilayer build-up wiring board with high concentration. Besides, due to the fact that via holes are formed right on the through holes, the wiring length becomes shortened and it is possible to deal with the demand of providing a high-speed multilayer build-up wiring board.

In this case, since a plurality of wiring paths are arranged in one through hole, several times as many the wiring paths as the through holes can be passed through the core substrate. Due to this, wirings can be integrated on the multilayer wiring layers formed on the front side of the core substrate and those formed on the back side thereof at the same pace. Thus, the number of layers can be minimized by setting the number of the upper multilayer wiring layers to be the same as that of the lower multilayer wiring layers.

According to claim 12, a multilayer build-up wiring board having a multilayer wiring layer, wherein interlayer resin insulating layers and conductor layers are alternately provided and the conductor layers are connected to each other by via holes, the multilayer wiring layer formed on both sides of a core substrate, conductor layers of the both sides of said core substrate electrically connected to one another by through holes formed in the core substrate, is characterized in that a filler is filled in the through holes of said core substrate and a conductor layer covering an exposed surface of the filler from the through holes is formed in the through hole;

the through holes and the conductor layers are divided into a plurality of parts, respectively; and via holes consisting of wiring paths connected to the divided parts of the conductor layers, respectively, are provided right on the through holes covered with said divided parts of the conductor layers.

The multilayer build-up wiring board recited in claim 12 is characterized in that filler is filled in the through holes provided in the core substrate, the conductor layer for covering the exposed surface of the filler from the through holes is formed and the via hole is connected to the conductor layer, thereby ensuring the connection between the build-up wiring layers and the through holes.

According to this constitution, the regions right on the through holes function as inner layer pads, thereby eliminating a dead space. Besides, since it is not necessary to arrange inner layer pads for connecting to via holes from the through holes, the land of the through hole can be formed into a complete round. As a result, the arrangement concentration of the through holes provided in the multilayer core substrate can enhance, the number of through holes can be increased, and the signal lines of the build-up wiring layers at the back side can be connected to the build-up layers on the front side through the through holes. The high concentration of the multilayer build-up wiring boards can be attained by arranging a plurality of wiring paths in each of the increased number of through via holes and by arranging a plurality of the wiring paths in each of the via holes.

On the multilayer build-up wiring board recited in claim 12, the filler filled into the through holes preferably consists of metal particles and thermosetting or thermoplastic resin.

On the multilayer build-up wiring board recited in claim 12, the filler preferably consists of metal particles, thermosetting resin and a hardening agent, or consists of metal particles and thermoplastic resin. Solvent may be added thereto if required. Since the filler contain metal particles, the metal particles are exposed by sanding the surface thereof and the plated film of a conductor layer formed on the filler is integrated with the filler through the metal particles. Thus, even under strict conditions of high temperature and high humidity such as a PCT (pressure cooker test), the filler is peeled off less frequently at the interface with the conductor layer. In addition, the filler of this type is filled in the through holes each having a metal film formed on a wall surface thereof, so that the migration of metal ions does not occur.

As for metal particles, copper, gold, silver, aluminum, nickel, titanium, chromium, tin/lead, palladium, platinum and the like may be used. The diameter of a metal particle is preferably 0.1 to 50 µm. The reason is as follows. If the diameter is less than 0.1 µm, the copper surface is oxidized and with wetness resin deteriorates. If the diameter exceeds 50 µm, printing property deteriorates. The compounding quantity of the metal particles is preferably 30 to 90 wt %. If it is less than 30 wt %, the adhesion of the cover plating deteriorates and if it exceeds 90 wt %, printing property deteriorates.

As for resin to be used, epoxy resin such as bisphenol A resin and bisphenol F resin, phenol resin, polyimide resin, fluorine-contained resin such as polytetrafluoroethylene (PTFE), bismaleimide/triazine (BT) resin, FEP, PFA, PPS, PEN, PES, nylon, aramid, PEEK, PEKK, PET and the like can be used.

As for the hardening agent, an imidazole hardening agent, a phenol hardening agent, an amine hardening agent and the like can be used.

As for solvent, NMP (normal methyl pyrrolidone), DMDG (diethylene glycol dimethyl ether), glycerol, water, 1-, 2- or 3-cyclohexanol, cyclohexanone, methyl cellosolve, methyl cellosolve acetate, methanol, ethanol, butanol, propanol, and the like can be used.

The filler is preferably non-conductive. This is because non-conductor filler has low hardening/contraction rate and the filler is peeled off less frequently from the conductor layer or via hole.

After diligently pursuing their studies to realize the above objects, the present inventors finally reached the invention the outline of which will be described below.

That is, a wiring board recited in claim 13 having a conductor circuit including a conductor layer of two-layer structure in which a second metal film, thinner than a first metal film is provided on said first metal film, is characterized in that sides of the second metal film forming said conductor layer protrude outside compared with sides of said first metal film.

Furthermore, a multilayer build-up wiring board recited in claim 14 having a structure in which at least one resin insulating layer and at least one conductor circuit are formed on a resin substrate, characterized in that at least one layer of said conductor circuit includes a conductor layer of two layer structure in which a second metal film, thinner than a first metal film is provided on said first metal film; and sides of the second metal film forming said conductor layer protrude outside compared with sides of said first metal film.

According to the constitution recited in claim 13, the sides of the second metal film formed on the first metal film protrude outside compared with those of the first metal. Owing to this, if a resin insulating layer is formed on these conductor layers and temperature change and the like occurs due to this protruding structure, stress does not concentrate on the corners of the conductor layer, with the result that it is possible to prevent cracks from occurring to the resin insulating layer.

BRIEF DESCRIPTION OF THE DRAWINGS

FIGS. 2E, 2F, 2G and 2H show manufacturing steps of the multilayer build-up wiring board in the first embodiment according to the present invention;

FIGS. 4M, 4N and 4O show manufacturing steps of the multilayer build-up wiring board in the first embodiment according to the present invention;

FIGS. 5P and 5Q show manufacturing steps of the multilayer build-up wiring board in the first embodiment according to the present invention;

FIG. 8A is a cross-sectional view of a multilayer build-up wiring board in an experimental example according to the present invention, and FIGS. 8B and 8C are explanatory views for describing the arrangement of mesh holes;

FIG. 9A is a cross-sectional view of a multilayer build-up wiring board in the first comparison example, FIG. 9B is an explanatory view showing the arrangement of mesh holes in the comparison example, and FIG. 9C is a plan view of a plain layer of a conventional technique;

FIGS. 15Q, 15R and 15S show manufacturing steps of the multilayer build-up wiring board in the second embodiment according to the present invention;

FIG. 18A is a cross-sectional view taken along line D-D of FIG. 17, FIG. 18B is an enlarged view of the mesh hole shown in FIG. 18A and FIG. 18C is an enlarged view of a mesh hole in a modified example;

FIG. 20A is a cross-sectional view taken along line F-F of FIG. 19, FIG. 20B is an enlarged view of the mesh hole shown in FIG. 20A and FIG. 20C is an enlarged view of a mesh hole in a modified example;

FIG. 21A is a plan view of a plain layer of a multilayer build-up wiring board in the second modified example of the second embodiment and FIG. 21B is an enlarged view of a modified example of a mesh hole shown in FIG. 21A;

FIG. 22A is a plan view of a plain layer of a multilayer build-up wiring board in the third modified example of the second embodiment, FIG. 22B is a cross-sectional view of the multilayer build-up wiring board and FIG. 22C is a cross-sectional view of a multilayer build-up wiring board in a modified example;

FIGS. 34A and 34B are cross-sectional views of a multilayer build-up wiring board in the first modified example of the third embodiment;

FIG. 35A is a cross-sectional view of the multilayer build-up wiring board in the first modified example of the third embodiment and FIG. 35B is a plan view of through holes and lands in the first modified example of the third embodiment;

FIGS. 43A and 43B show microphotographs of an optical microscope showing the cross section of the multilayer build-up wiring board obtained in the fourth embodiment.

BEST MODES FOR WORKING THE INVENTION

First Embodiment

Figure 1:
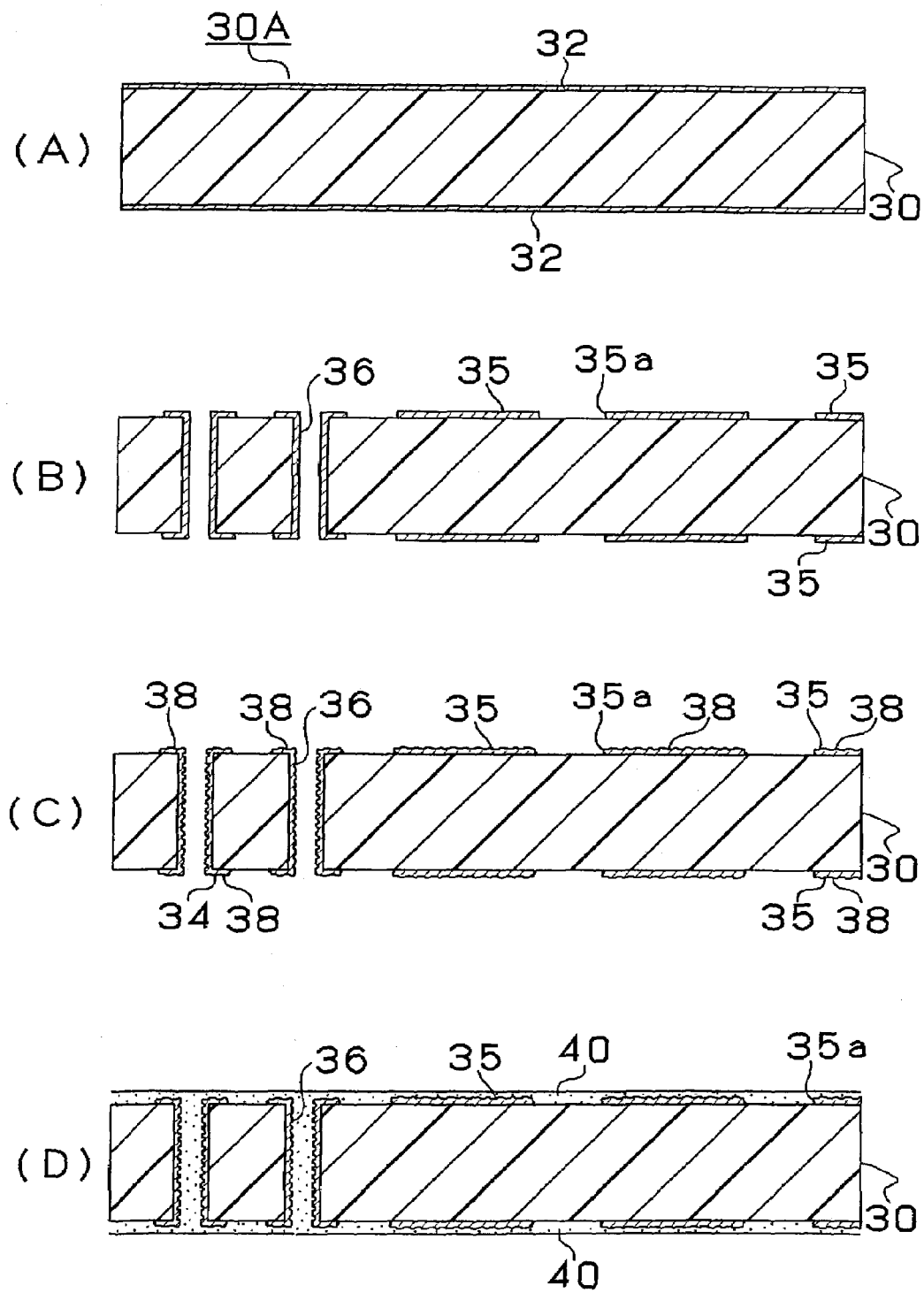
FIGS. 1A, 1B, 1C and 1D show manufacturing steps of a multilayer build-up wiring board in the first embodiment according to the present invention.
Figure 3:
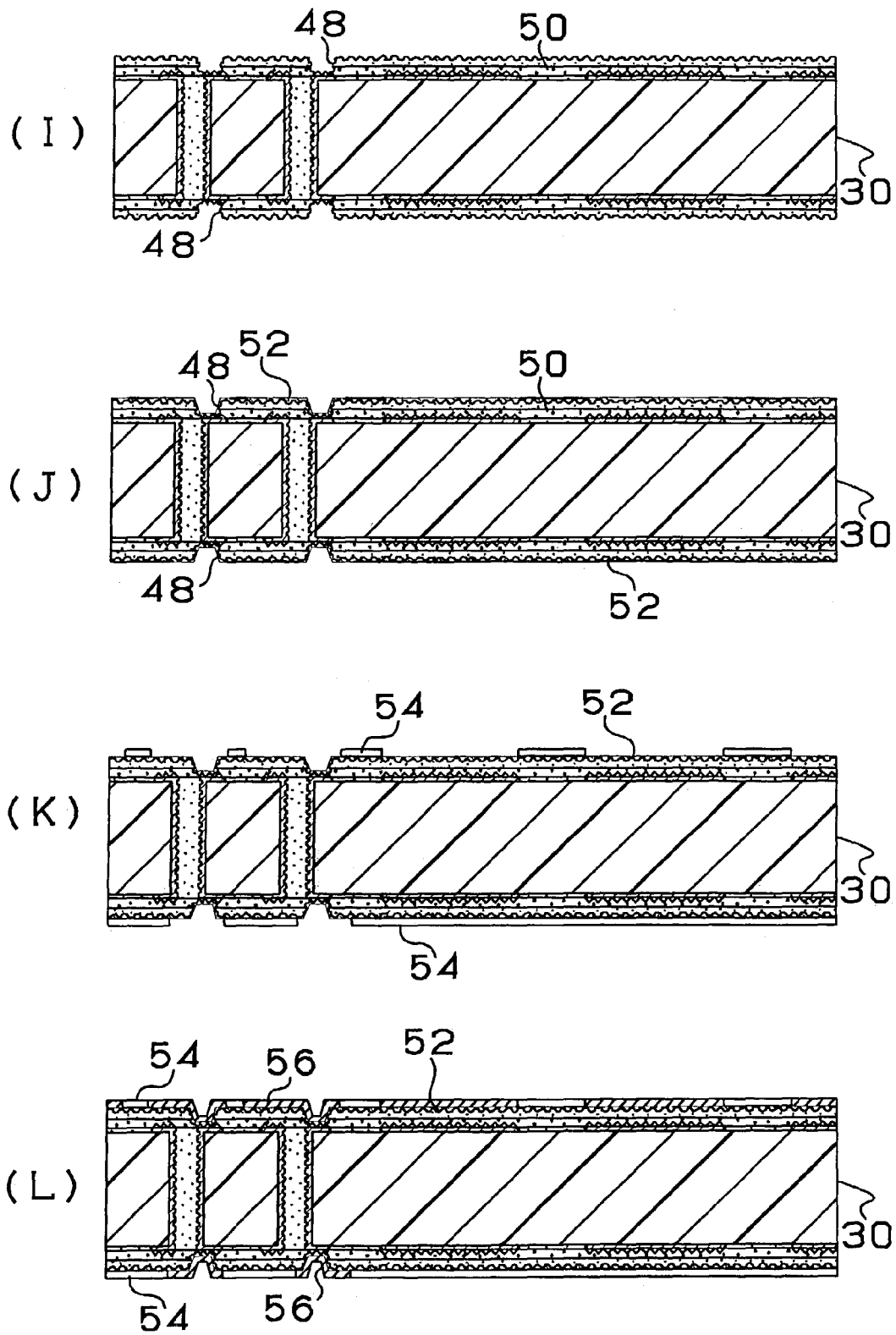
FIGS. 3I, 3J, 3K and 3L show manufacturing steps of the multilayer build-up wiring board in the first embodiment according to the present invention.

Now, a multilayer build-up wiring board and a multilayer build-up wiring board manufacturing method in the first embodiment of the present invention will be described with reference to the drawings.

First, description will be given to the constitution of a multilayer build-up wiring board 10 in the first embodiment of the present invention with reference to FIG. 6. On the multilayer build-up wiring board 10, a plain layer 35 for forming a ground layer is formed on each of the front and back sides of a core substrate 30. Build-up wiring layers 80A and 80B are formed on the front-side plain layer 35 and the back-side plain layer 35, respectively. The build-up layer 80A consists of an interlayer resin insulating layer 50 which includes a via hole 60, a conductor layer 58 and a plain layer 59 serving as a power layer and an interlayer resin insulating layer 150 which includes a via hole 160 and a conductor circuit 158. The build-up wiring layer 80B consists of an interlayer resin insulating layer 50 which includes a via hole 60 and a conductor circuit 58 and an interlayer insulating layer 150 which includes a via hole 160 and a conductor circuit 158.

On the upper surface, a solder bump 76U for connecting to a land of an integrated circuit chip (not shown) is provided. The solder bump 76U is connected to a through hole 36 through the via holes 160 and 60. On the lower surface, a solder bump 76D for connecting to a land of a daughter board (not shown) is provided. The solder bump 76D is connected to the through hole 36 through the via holes 160 and 60.

Figure 6:
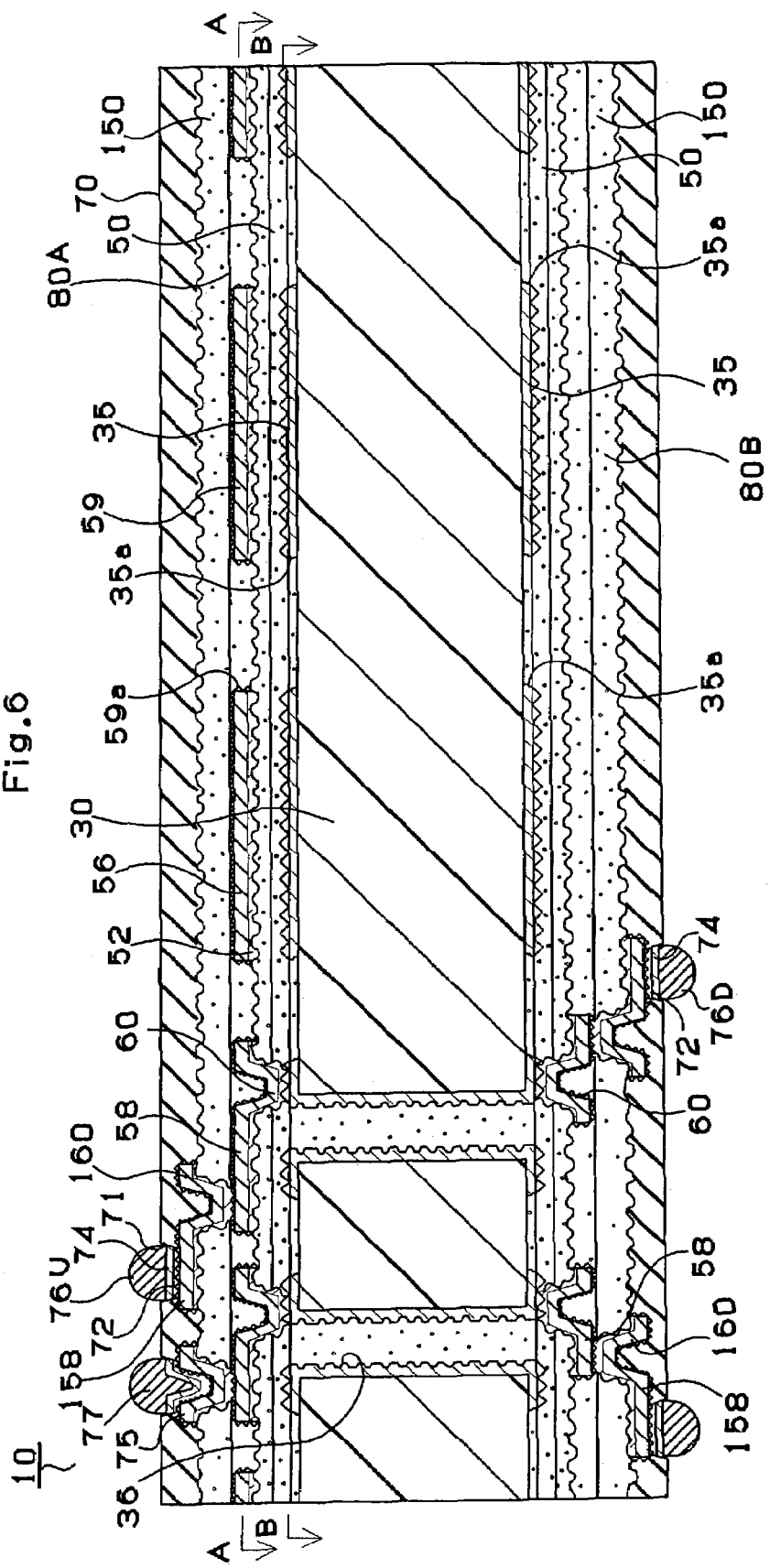
FIG. 6 is a cross-sectional view of the multilayer build-up wiring board in the first embodiment according to the present invention.
Figure 7:
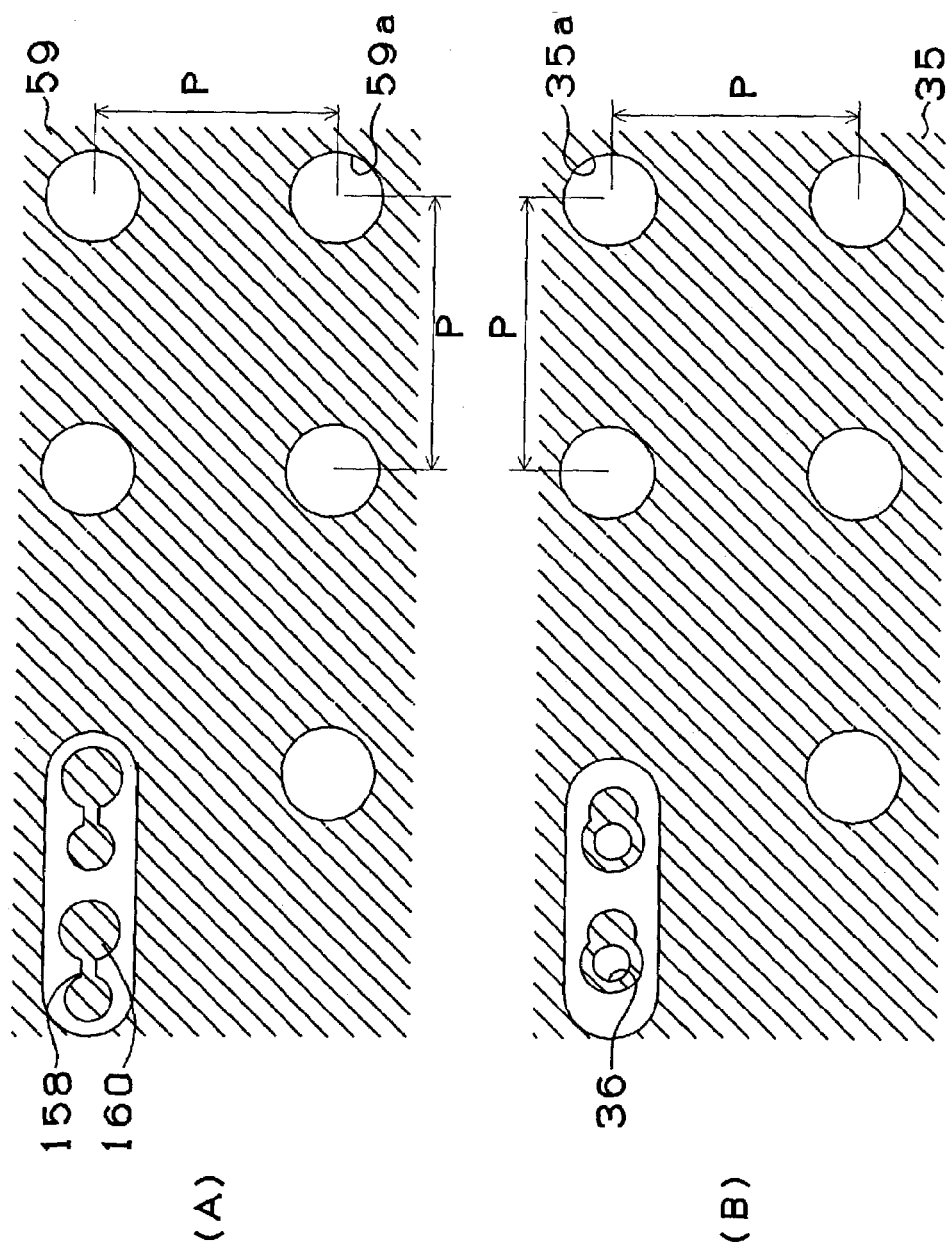
FIG. 7A is a cross-sectional view taken along line A-A of FIG. 6.
FIG. 7B is a cross-sectional view taken along line B-B.

FIG. 7A is a cross-sectional view taken along line A-A of FIG. 6, showing the plane of the plain layer 59 formed on the surface of the interlayer resin insulating layer 50. FIG. 7B is a cross-sectional view taken along line B-B of FIG. 6, showing the plane of the plain layer 35 formed on the surface of the core substrate 30. As shown in FIG. 7A, mesh holes 59a of 20 μm in diameter are formed at every pitch P (500 μm) in the plain layer 59 on the surface of the interlayer resin insulating layer 50. Likewise, as shown in FIG. 7B, mesh holes 35a of 200 μm in diameter are formed at every pitch P (500 μm) in the plain layer 35 on the surface of the core substrate 30. Mesh holes 35a are also formed on the back side of the core substrate 30 although not shown.

On the multilayer build-up wiring board 10 in the first embodiment, the mesh holes 35a and 35b in the plain layers 35, 35 on both sides of the core substrate 30 are arranged to completely overlay on the mesh holes 59a in the plain layer 59 of the interlayer resin insulating layer 50 as shown in FIG. 6. This can prevent the insulating property of the interlayer resin insulating layer 50 from lowering.

Next, the method of manufacturing a multilayer build-up wiring board in the first embodiment will be described with reference to the drawings.

Here, the explanation is made with respect to compositions of A. an adhesive for electroless plating, B. an interlayer resin insulating agent C. a resin filling agent, and D. Solder Resist Composition used in the manufacturing method of the multilayer printed wiring board in accordance with the first embodiment.

A. Raw Material Composition Substance for Adjusting and Manufacturing an Adhesive for Electroless Plating (an Adhesive for an Upper Layer)

[Resin Composition Substance ①]

A resin composition substance is obtained by stirring and mixing 35 weight parts of a resin liquid, 3.15 weight parts of a photosensitive monomer (manufactured by TO-A GOSEI, Alonix M315), 0.5 weight part of an antifoaming agent (manufactured by SAN-NOPUKO, S-65) and 3.6 weight parts of NMP. In the resin liquid, 25% of a cresol novolak type epoxy resin (manufactured by NIHON KAYAKU, molecular weight 2500) and 80 wt % of an acrylic substance in concentration are dissolved to DMDG.

[Resin Composition Substance ②]

A resin composition substance is obtained by mixing 12 weight parts of polyether sulfone (PES), 7.2 weight parts of epoxy resin particles (manufactured by SANYOKASEI, polymer pole) having an average particle diameter of 1.0 μm, and 3.09 weight parts of epoxy resin particles having an average particle diameter of 0.5 μm, and then adding 30 weight parts of NMP to the mixed material and stirring and mixing these materials by a beads mill.

[Hardening Agent Composition Substance ③]

A hardening agent composition substance is obtained by stirring and mixing 2 weight parts of an imidazole hardening agent (manufactured by SHIKOKU KASEI, 2E4MZ-CN), 2 weight parts of an optical starting agent (manufactured by CHIBAGAIGI, Irugacure I-907), 0.2 weight part of a photosensitizer (manufactured by NIHON KAYAKU, DETX-S), and 1.5 weight parts of NMP.

B. Raw Material Composition Substance for Adjusting and Manufacturing an Interlayer Resin Insulating Agent (an Adhesive for a Lower Layer)

[Resin Composition Substance ①]

A resin composition substance is obtained by stirring and mixing 35 weight parts of a resin liquid, 4 weight parts of a photosensitive monomer (manufactured by TO-AGOSEI, Alonix M315), 0.5 weight part of an antifoaming agent (manufactured by SAN-NOPUKO, S-65) and 3.6 weight parts of NMP. In the resin liquid, 25% of a cresol novolak type epoxy resin (manufactured by NIHON KAYAKU, molecular weight 2500) and 80 wt % of an acrylic substance in concentration are dissolved to DMDG.

[Resin Composition Substance ②]

A resin composition substance is obtained by mixing 12 weight parts of polyether sulfone (PES) and 14.49 weight parts of epoxy resin particles (manufactured by SANYO KASEI, polymer pole) having an average particle diameter of 0.5 μm, and then adding 30 weight parts of NMP to the mixed material and stirring and mixing these materials by a beads mill.

[Hardening Agent Composition Substance ③]

A hardening agent composition substance is obtained by stirring and mixing 2 weight parts of an imidazole hardening agent (manufactured by SHIKOKU KASEI, 2E4MZ-CN), 2 weight parts of an optical starting agent (manufactured by CHIBAGAIGI, Irugacure I-907), 0.2 weight part of a photosensitizer (manufactured by NIHON KAYAKU, DETX-S), and 1.5 weight parts of NMP.

C. Composition of Material for Preparing Filling Resin

[Composition of Resin 1]

100 parts by weight of bisphenol F epoxy monomer (manufactured by Yuka Shell Epoxy Kabushiki Kaisha, molecular weight: 310, YL983U), 170 parts by weight of $SiO_2$ spherical particles coated with a silane coupling agent and having a mean particle diameter of 1.6 μm (manufactured by Admatec, CRS1101-CE, where the maximum particle size is not more than the thickness (15 μm) of an inner layer copper pattern to be described later), 1.5 parts of a leveling agent (manufactured by SAN NOPCO Limited, PERENOL S4) are agitated to thereby adjust the mixture to have a viscosity of 45,000 to 49,000 cps at 23±1° C.

[Composition of Hardening Agent 2]

6.5 parts by weight of an imidazole hardening agent (manufactured by Shikoku Chemical, 2E3MZ-CN)

D. Raw Material Composition Substance for Adjusting and Manufacturing Solder Resist Composition Solder resist composition is obtained by mixing 46.67 g of photosensitive oligomer (molecular weight 4000) obtained by acrylic-modifying 50% of epoxy groups of 60 percentage by weight of cresol novolac dissolved into DMDG of 50% epoxy resin (Nippon Kayaku); 15.0 g of 80 percentage by weight of bisphenol A type epoxy resin (Yuka Shell, Epikote 1001) dissolved into methyl ethyl ketone; 1.6 g of imidazole hardener (Shikoku Chemicals, 2E4MZ-CN); 3 g of multivalent acrylic monomer (Nippon Kayaku, R604) which is photoreceptive monomer; 1.5 g of the same multivalent acrylic monomer (KYOEISHA CHEMICAL, DPE6A); 0.71 g of a scattering anti-foaming agent (SANNOPCO, S-65); then adding 2 g of benzophenone (KANTO CHEMICAL) used as a photo-initiator; and 0.2 g of Michler's ketone (KANTO CHEMICAL) used as a photosensitizer to the mixture and adjusting the viscosity to 2.0 Pa·s at 25° C.

The viscosity is measured by B-type measurement (TOKYO measurement DVL-B type). A rotator No. 4 was used in 60 rpm, and a rotator No.3 was used in 6 rpm.

Next, the manufacturing steps for the multilayer build-up wiring board in the first embodiment will be described with reference to FIGS. 1 through 6. In the first embodiment, the multilayer build-up wiring board is formed by means of the semi-additive method.

(1) As shown in FIG. 1A, a copper-clad laminate 30A including a substrate 30 of glass epoxy resin or BT (Bismaleimide/Triazine) resin and having a 18 μm copper foil 32 laminated on both sides thereof is used as a starting material. First, the copper-clad laminate 30A is drilled and subjected to electroless plating and pattern-etching, thereby forming through holes 36 and plain layers 35 and forming a core substrate 30 shown in FIG. 1B. As already described above with reference to FIG. 7B, the mesh holes 35a are formed in each plain layer 35.

(2) The substrate 30 having the plain layers 35 and the through hole 36 formed thereon is washed and dried. Thereafter, roughened layers 38 are provided on the surfaces of the plain layers 35 and the through holes 36 by oxidizing-reducing using an oxidizing (blackening) bath of NaOH (10 g/l), NaCl (40 g/l) and $Na_3PO_4$ (6 g/l) and a reducing bath of NaOH (10 g/l) and $NaBH_4$ (6 g/l) (see FIG. 1C).

(3) The composition of material for preparing a filling resin described in C above is mixed and kneaded to obtain a filling resin.

(4) The filling resin obtained in (3) above is coated on the both sides of the substrate 30 using a roll coater within 24 hours after preparation, filled into the mesh holes 35a of the conductor circuits (plain layers) 35 and into the through holes 36 and dried at a temperature of 70° C. for 20 minutes. As for the other side, as in the case of the above, filling resin 40 is filled into the mesh holes 35a and the through holes 36 and dried at a temperature of 70° C. for 20 minutes (see FIG. 1D).

(5) The one side of the substrate which has been subjected to the treatment of (4) above is sanded by belt sanding using a #600 belt sand paper (manufactured by Sankyo Rikagaku Co., Ltd.) so that the filling resin 40 does not remain on the surfaces of the plain layers 35 and the surfaces of the land 36a of the through hole 36. Next, to remove flaws caused by belt sanding, the one side of the substrate is subjected to buffing. A series of these sanding steps are effected for the other side of the substrate, as well (See FIG. 2E).

Thereafter, heating treatment at 100° C. for 1 hour, that at 120° C. for 3 hours, that at 150° C. for 1 hour and that at 180° C. for 7 hours are conducted to harden the filling resin 40.

Thus, the surface layer portion of the filling resin 40 filled in the through holes 36 and the like and the roughened layer 38 on the upper surface of the plain layers 35 are removed to thereby smooth the both sides of the substrate. Then, a wiring substrate is obtained wherein the filling resin 40 and the sides of the plain layers 35 are fixedly attached to each other through the roughened layers 38 and the inner wall surface of the through hole 36 and the filling resin 40 are fixedly attached to each other through the roughened layers 38. In other words, through these steps, the surface of the filling resin 40 is made flush with that of the surfaces of the plain layers 35.

(6) The substrate 30 on which the plain layer 35 has been formed is subjected to alkali degreasing and soft-etching. Then, the substrate 30 is treated by a catalytic solution of palladium chloride and organic acid to add a Pd catalyst to the substrate 30. After the Pd catalyst is activated, the substrate is submerged in an electroless plating liquid consisting of $3.2\times 10^{-2}$ mol/l of copper sulfate, $3.9\times 10^{-3}$ mol/l of nickel sulfate, $5.4\times 10^{-2}$ mol/l of a complexing agent, $3.3\times 10^{-1}$ mol/l of sodium hypophosphite, $5.0\times 10^{-1}$ mol/l of boracic acid and 0.1 g/l of surfactant (manufactured by Nisshin Kagaku, Surfeal465) and having a pH of 9. After one minute of submergence, the substrate is longitudinally and transversely vibrated once for four seconds to thereby provide a coated layer and roughened layer 42 of a needle alloy of Cu—Ni—P on the surface of the plain layer 35 and that of the land 36a of the through hole 36 (see FIG. 2F).

Furthermore, Cu—Sn displacement reaction is conducted under conditions of 0.1 mol/l of tin fluoborate, 1.0 mol/l of thiourea, a temperature of 35° C. and a pH of 1.2 to thereby provide an Sn layer (not shown) of a thickness of 0.3 μm on the surface of the roughened layer.

(7) The composition of material for preparing an interlayer resin insulating agent described in B is agitated to adjust the viscosity thereof to 1.5 Pa·s to thereby obtain an interlayer resin insulating agent (for a lower layer).

Next, the composition of material for preparing an electroless plating adhesive agent described in A is agitated to adjust the viscosity thereof to 7 Pa·s to thereby obtain an electroless plating adhesive agent solution (for an upper layer).

(8) The interlayer resin insulating agent (for an lower layer) 44 of a viscosity of 1.5 Pa·s obtained in (7) above is coated on the both sides of the substrate of (6) by a roll coater within 24 hours after preparing the agent and left horizontally for 20 minutes. Thereafter, the agent is dried (or pre-baked) at 60° C. for 30 minutes. The photosensitive adhesive agent solution (for an upper layer) 46 of a viscosity of 7 Pa·s obtained in (7) above is coated on the both sides of the substrate of (6) within 24 hours after preparing the agent and left horizontally for 20 minutes. Thereafter, the agent is dried (or pre-baked) at 60° C. for 30 minutes. Thus, adhesive agent layers 50α of a thickness of 35 μm are formed (see FIG. 2G).

(9) A photo mask film (not shown) on which a 85 μmφ black circle had been printed is closely contacted with the both sides of the substrate 30 on which the adhesive agent layers have been formed in (8) above and exposed at 500 mJ/cm$^2$ by an extra-high pressure mercury lamp. The resultant film is subjected to spray-development with a DMTG solution. The substrate is further exposed at 3000 mJ/cm$^2$ by the extra-high pressure mercury lamp, and heated (or post-baked) at 100° C. for one hour, at 120° C. for one hour and at 150° C. for three hours. Thus, interlayer resin insulating layers (two-layer structure) 50 each having a thickness of 35 μm and having 85 μmφ openings (via hole formation openings) 48 excellent in dimensional accuracy and corresponding to a photo mask film are formed (see FIG. 2H). A tin plated layer (not shown) is partially exposed to the openings 48 which become via holes.

(10) The substrate 30, in which the openings 48 have been formed, is submerged in chromic acid for 19 minutes to dissolve and remove epoxy resin particles present on the surfaces of the interlayer resin insulating layers 50, thereby roughening the surfaces of the interlayer resin insulating layers 50 (see FIG. 3I). Thereafter, the substrate is submerged in a neutralizing solution (manufactured by Shipley Far East) and washed.

(11) A palladium catalyst (manufactured by Atotec) is added to the surface of the substrate 30 which has been subjected to roughening treatment, thereby providing catalyst nuclei on the surfaces of the interlayer resin insulating layers 50. Thereafter, the substrate 30 is submerged in an electroless copper plating solution which composition is shown below to thereby form electroless plated films 52 of a thickness of 0.6 μm on the entire surface (see FIG. 3J).

[Electroless Plating Solution]

| | |
|---|---|
| EDTA | 150 g/l |
| Copper sulfate | 20 g/l |
| HCHO | 30 ml/l |
| NaOH | 40 g/l |
| α, α'-bypyridil | 80 mg/l |
| PEG | 0.1 g/l |

[Electroless Plating Conditions]
  Solution temperature: 70° C.
  Time: 30 minutes

(12) A commercially available photosensitive dry film is put on each electroless copper plated film formed in (11) above and a mask is mounted thereon. The film is exposed at 100 mJ/cm$^2$ and developed by 0.8% sodium carbonate, to thereby provide plating resists 54 of a thickness of 15 μm (see FIG. 3K).

(13) Next, electrolytic copper plating is conducted to portions on which no resist is formed under the following conditions, to thereby form electrolytic copper plated films 56 of a thickness of 15 μm (see FIG. 3L)

[Electrolytic Plating Solution]

| | |
|---|---|
| Sulfuric acid | 180 g/l |
| Copper sulfate | 80 g/l |
| Additive (manufactured by Atotec Japan, Karapacido GL) | 1 ml/l |

[Electrolytic Plating Conditions]

| | |
|---|---|
| Current density | 1 A/dm$^2$ |
| Time | 30 minutes |
| Temperature | Room temperature |

(14) After the plating resists 54 are peeled off by 5% KOH, the electroless plated films 52 under the plating resist are etched by a mixture liquid of sulfuric acid and peroxide and dissolved, thereby forming conductor circuits 58, plain layers 59 and via holes 60 each consisting of the electroless copper plated film 52 and the electrolytic copper plated film 60 and having a thickness of 18 μm (FIG. 4M). Here, as described above with reference to FIG. 7A, the mesh holes 59a are formed in the plain layers 59 and the holes 59a are formed to overlay the mesh holes 35a of the plain layers 35 formed on both sides of the core substrate 30.

(15) The same treatment as in (6) is conducted and a roughened layer 62 of Cu—Ni—P is formed on surfaces of the conductor circuits 58, the plain layers 59 and the via holes 60, and the surface of the roughened layer 62 is subjected to Sn displacement reaction (see FIG. 4N).

Figure 40:
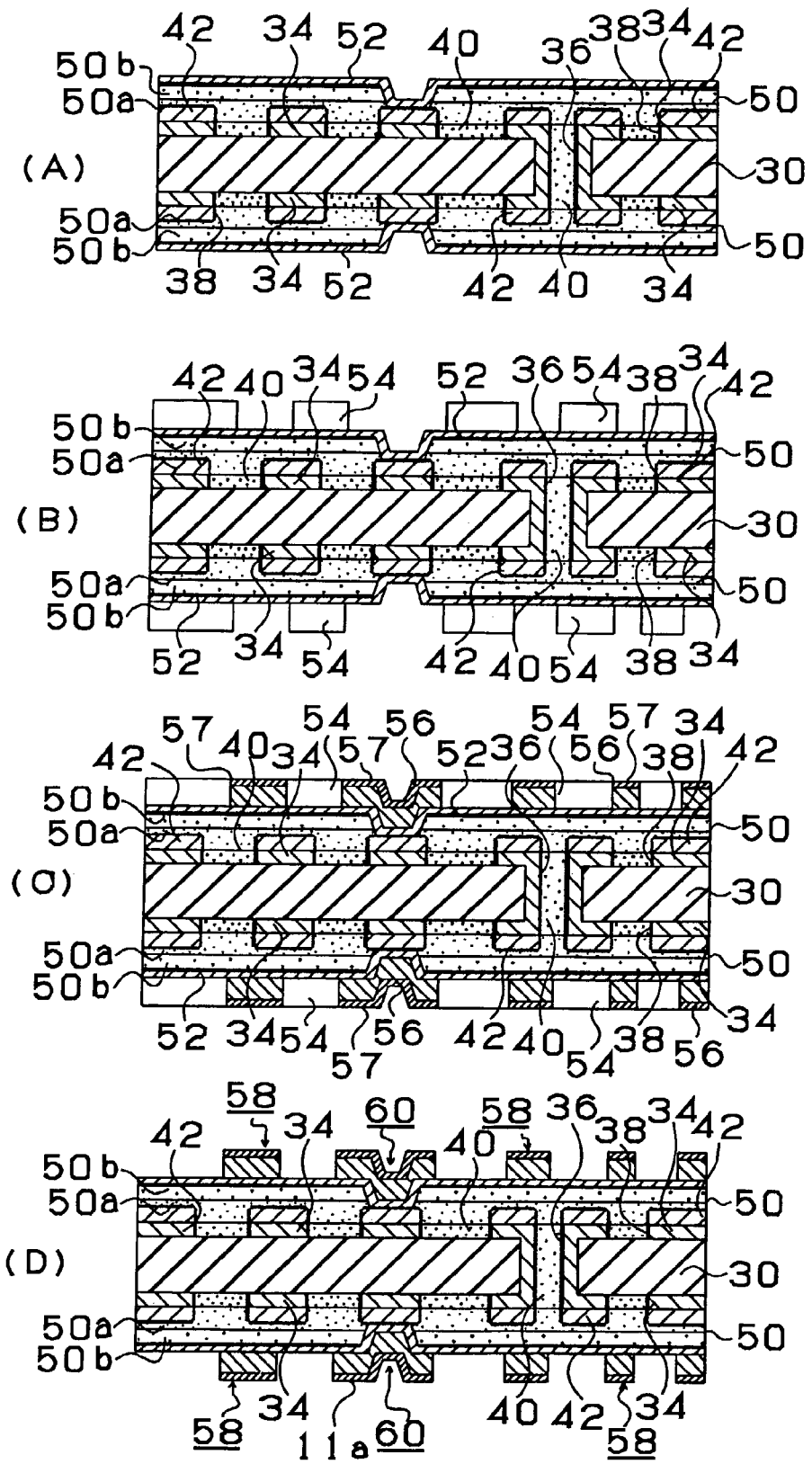
FIGS. 40A, 40B, 40C and 40D are cross-sectional views showing part of manufacturing steps of the multilayer build-up wiring board in the fourth embodiment.
Figure 41:
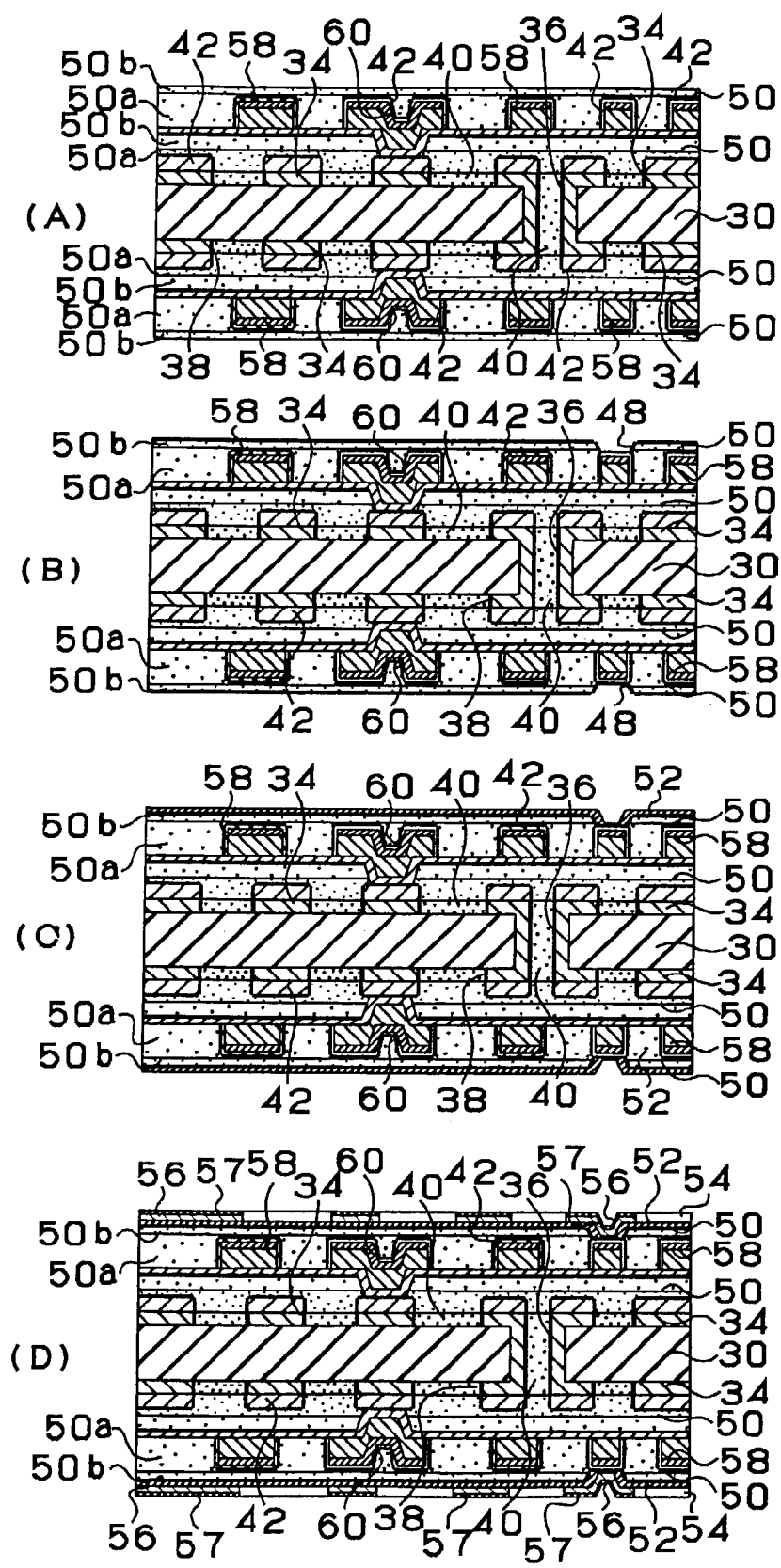
FIGS. 41A, 41B, 41C and 41D are cross-sectional views showing part of manufacturing steps of the multilayer build-up wiring board in the fourth embodiment.
Figure 42:
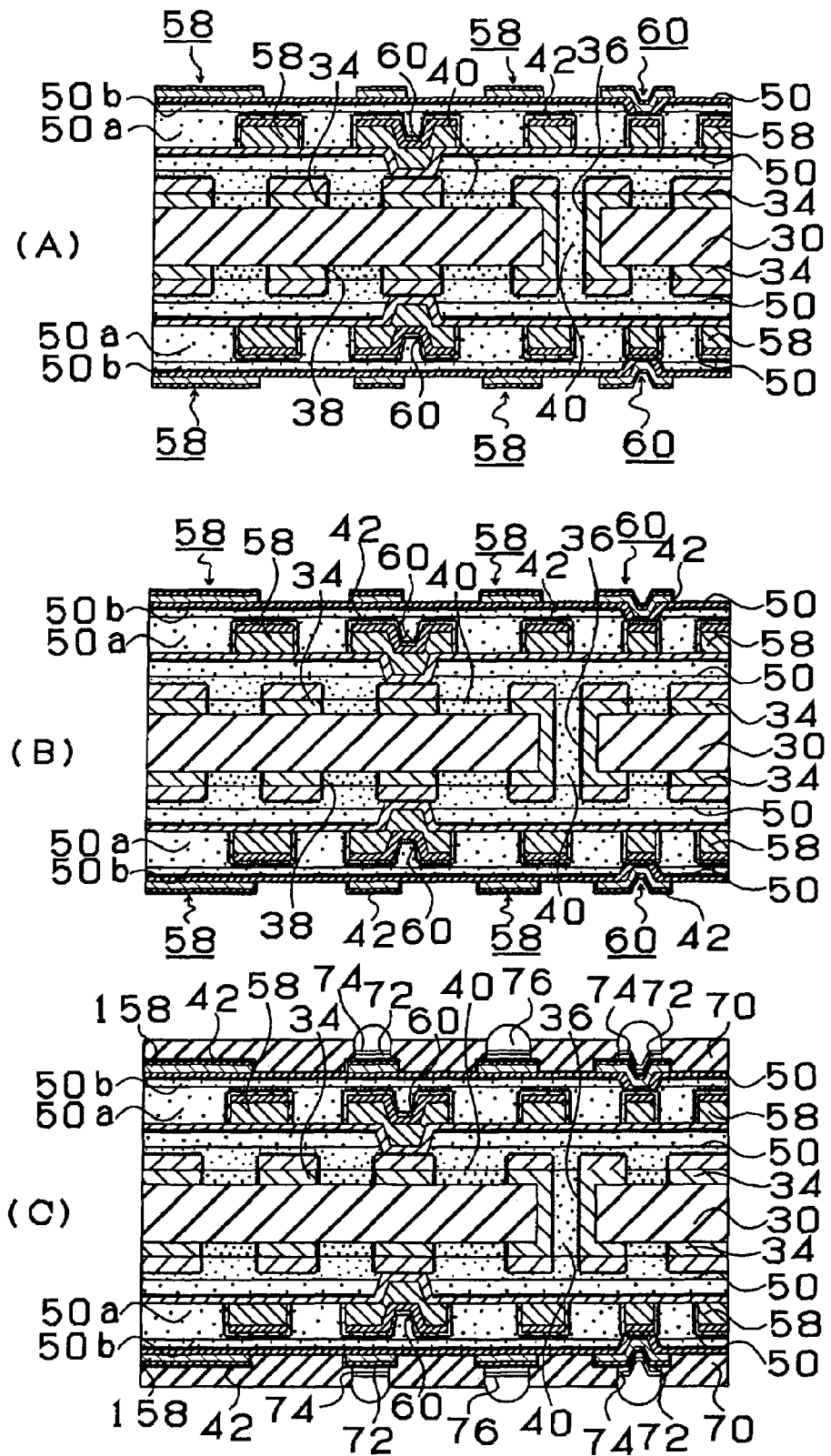
FIGS. 42A, 42B and 42C are cross-sectional view showing part of manufacturing steps of the multilayer build-up wiring board in the fourth embodiment.

(16) The steps of (7) to (15) are repeated, thereby forming interlayer resin insulating layers 150, via holes 160 and upper layer conductor circuits 158 and obtaining a multilayer build-up wiring board (see FIG. 40). It is noted that no Sn displacement reaction is conducted in the steps of forming the upper layer conductor circuits.

(17) Thereafter, a solder bump is formed on the above-stated multilayer build-up wiring board. The above-stated solder resist composition, as described in D. above of a thickness of 45 μm is coated on the both sides of the substrate 30 obtained in (16) above. Next, drying treatment at 70° C. for 20 minutes and that at 70° C. for 30 minutes are conducted. Thereafter, a photo mask film (not shown) of a thickness of 5 mm, on which a circle pattern (or mask pattern) is written, is mounted on the substrate while being closely contacted therewith, exposed to ultraviolet rays of 1000 mJ/cm$^2$ and subjected to DMTG development treatment. Further, heating treatment is conducted at 100° C. for one hour, 120° C. for one hour and 150° C. for three hours to thereby form solder resist layers (thickness: 20 μm) 70 each having an opening (opening diameter: 200 μm) 71 in a soldering pad portion (including a via hole and a via hole land) (see FIG. 5P).

(18) Next, the substrate 30 is dipped for 20 minutes into an electroless nickel plating liquid of pH=4.5 constructed by nickel chloride $2.31 \times 10^{-1}$ mol/l, sodium hypophosphite $2.8 \times 10^{-1}$ mol/l and sodium citrate $1.85 \times 10^{-1}$ mol/l. Thus, a nickel plating layer 72 having 5 μm in thickness is formed in the opening portions 71. Further, this substrate is dipped for 7 minutes and 20 seconds into an electroless gold plating liquid constructed by potassium gold cyanide $4.1 \times 10^{-2}$ mol/l, ammonium chloride $1.87 \times 10^{-1}$ mol/l, sodium citrate $1.16 \times 10^{-1}$ mol/l and sodium hypophosphite $1.7 \times 10^{-1}$ mol/l in a condition of 80° C. Thus, a gold plating layer 74 having 0.03 μm in thickness is formed on the nickel plating layer so that a soldering pad 75 is formed in the via hole 160 and the not shown conducting circuit (refer FIG. 5(Q)).

(19) Solder bumps (solder bodies) 76U, 76D are formed in the opening portions 71 of the solder resist layers 70, respectively by printing a solder paste and conducting reflow at 200° C. and a multilayer build-up wiring board 10 is formed (see FIG. 6).

Experimental Example

Now, an experimental example of the present invention and the first comparison example will be described with reference to FIGS. 8 and 9.

FIG. 8A shows a cross-section of a multilayer build-up wiring board in the experimental example according to the present invention. The multilayer build-up wiring board in this example is formed in the same manner as that of the multilayer build-up wiring board 10 in the above-described first embodiment. However, the through hole is formed in the core substrate in the first embodiment, whereas no through hole is formed in this experimental example. In addition, in this experimental example, a plain layer 135 is formed on each of the upper and lower surfaces of the core substrate 130 and plain layers 179 and 189 are formed on each of the interlayer resin insulating layers 170 and interlayer resin insulating layers 180 as outermost layers on the upper and lower surfaces. FIG. 8B shows how a mesh hole 179a in the interlayer resin insulating layer 170 relates to a mesh hole 189a in the plain layer 189. In this experimental example, as in the case of the first embodiment described above with reference to FIG. 6, the mesh holes 135a of the plain layers 135, the mesh holes 179a of the plain layers 179 and the mesh holes 189a of the plain layers 189 on the core substrate 130 are formed to overlay one another. The mesh holes of a diameter of 250 μm are arranged at a pitch of 550 μm.

Meanwhile, FIG. 9A shows the cross section of a multilayer build-up wiring board in the first comparison example and FIG. 9B shows how a mesh hole 179a in plain layers 179 relates to a mesh hole 189a in plain layer 189 of the multilayer build-up wiring board in the comparison example. The multilayer build-up wiring board in the first comparison example is manufactured in exactly the same manner as that in the above experimental example. Unlike the experimental example shown in FIG. 8A, the mesh holes 135a in the plain layers 135, the mesh holes 179a in the plain layers 179 and the mesh holes 189a in the plain layers 189 on the core substrate 130 are formed not to overlay one another.

Figure 10:
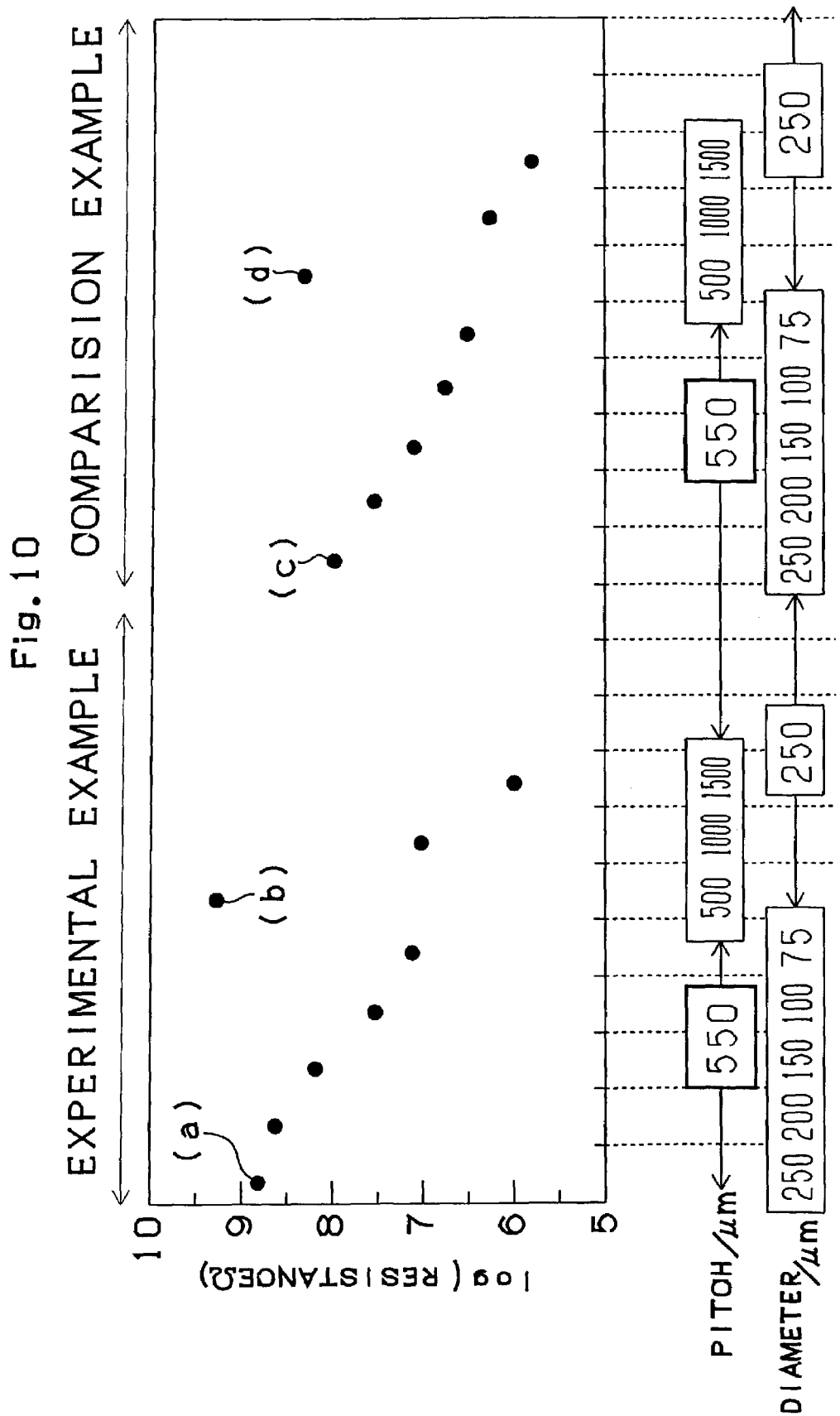
FIG. 10 is a graph showing insulation tests for the interlayer resin insulating films of the multilayer build-up wiring boards in the experimental example and the first comparison example.
Figure 11:
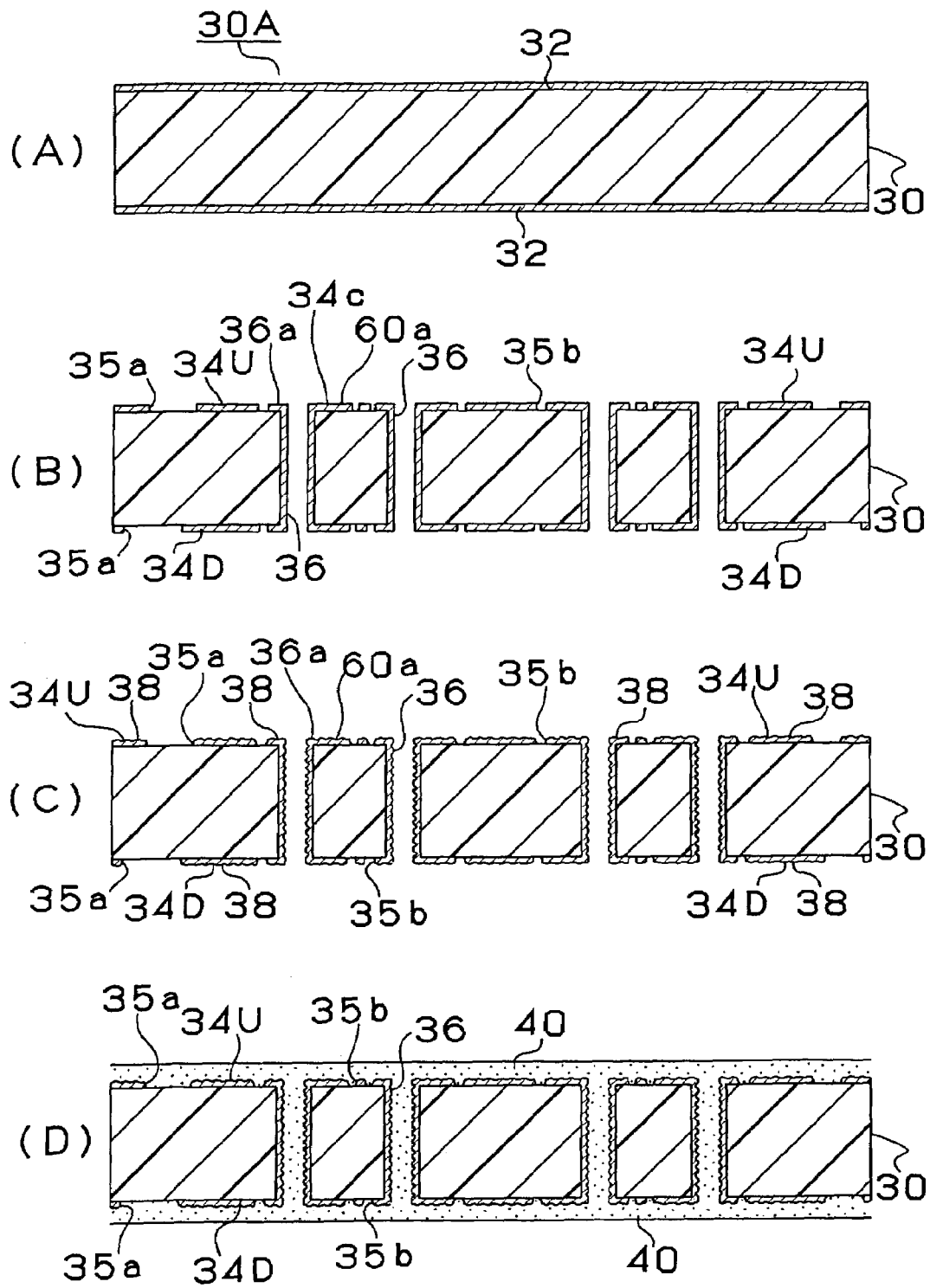
FIGS. 11A, 11B, 11C and 11D show manufacturing steps of a multilayer build-up wiring board in the second embodiment according to the present invention.
Figure 12:
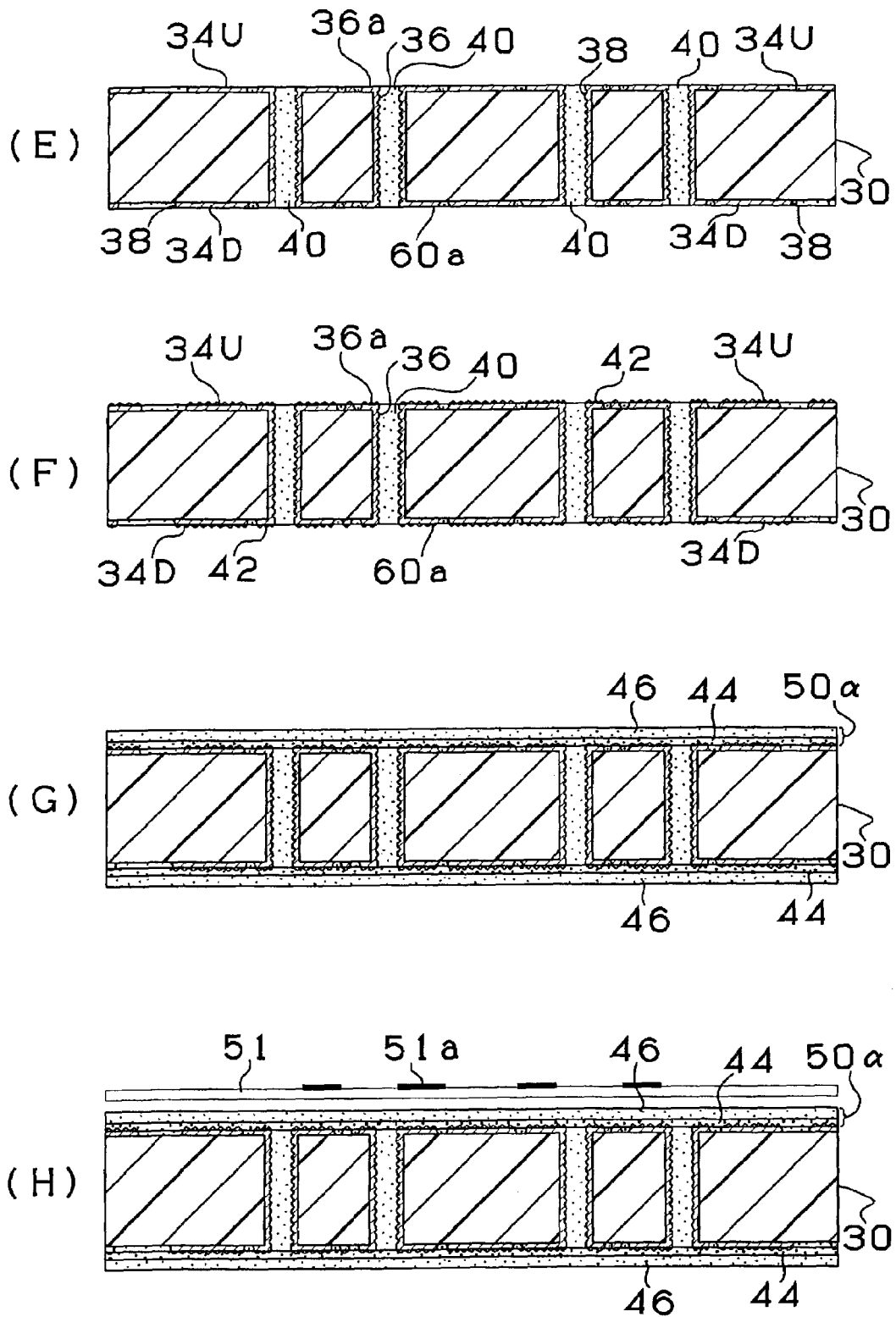
FIGS. 12E, 12F, 12G and 12H show manufacturing steps of the multilayer build-up wiring board in the second embodiment according to the present invention.
Figure 13:
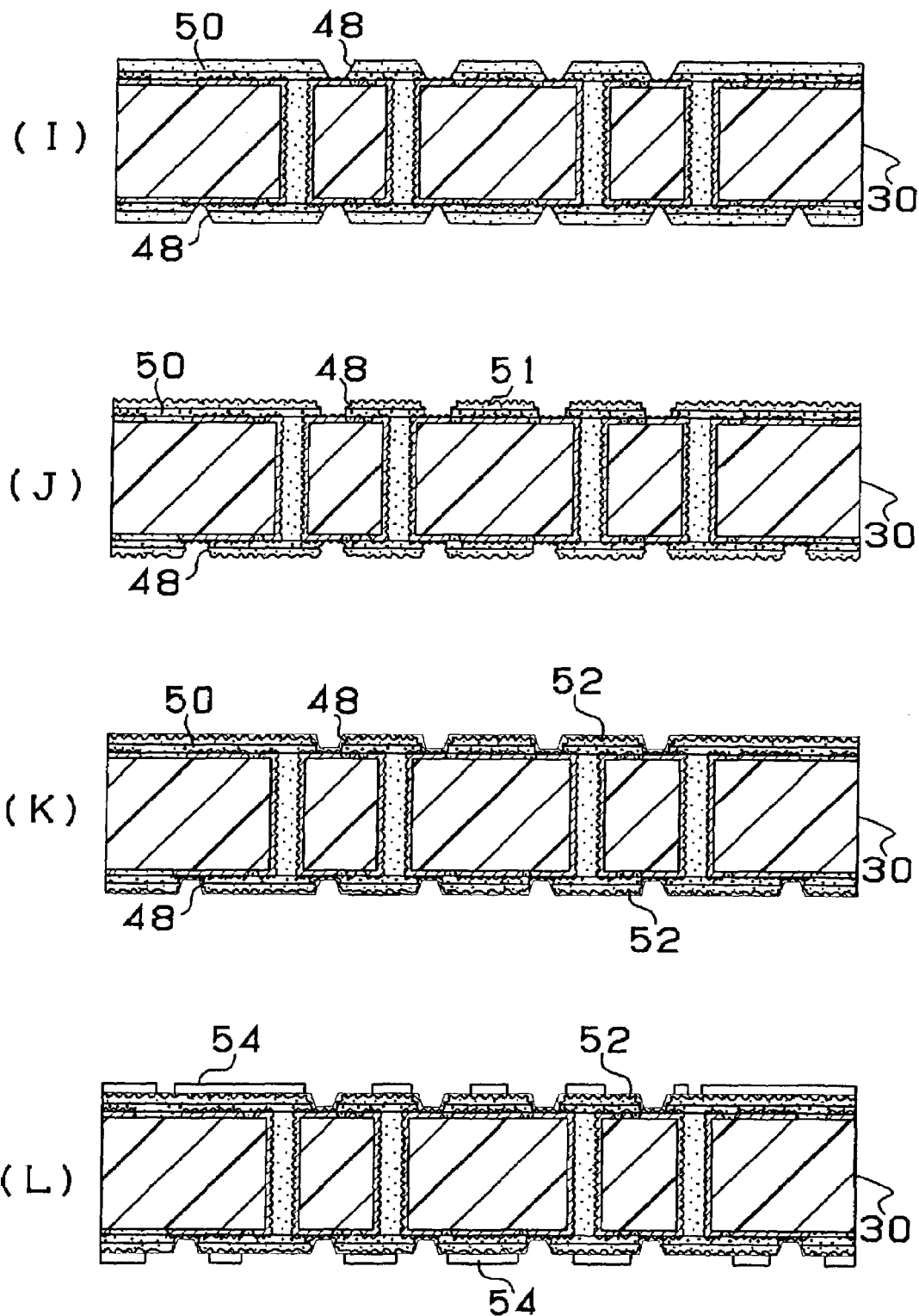
FIGS. 13I, 13J, 13K and 13L show manufacturing steps of the multilayer build-up wiring board in the second embodiment according to the present invention.
Figure 14:
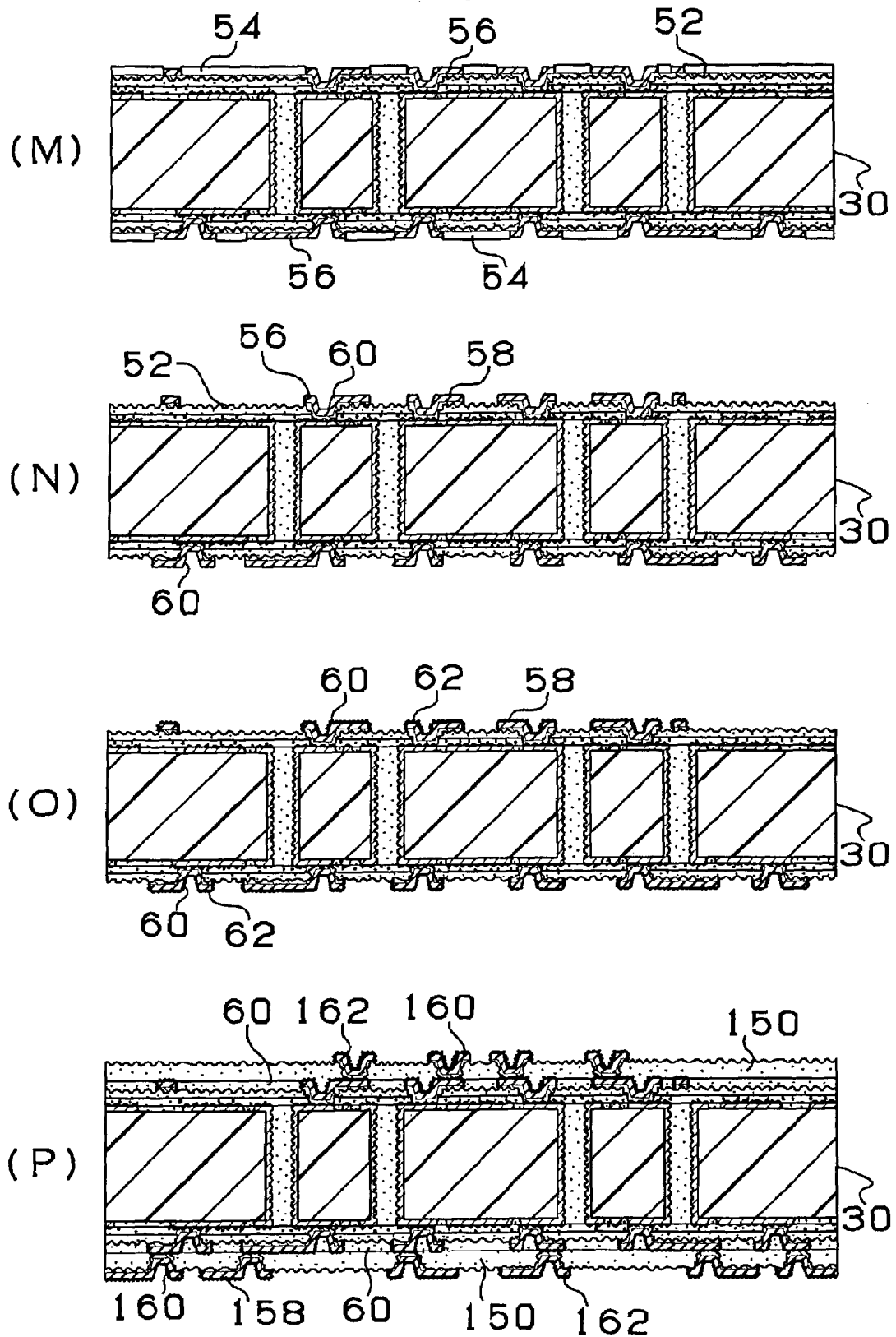
FIGS. 14M, 14N, 14O and 14P show manufacturing steps of the multilayer build-up wiring board in the second embodiment according to the present invention.

Now, the results of insulation tests conducted for the interlayer resin insulating layers in the experimental example and the comparison example will be described with reference to a graph of FIG. 10.

An STEC test was conducted as the insulation test. In the STEC test, ten multilayer build-up wiring boards were kept under the conditions of 121° C., 100% RH and 2.1 atm for 336 hours and insulation resistance between the interlayer resin insulating layers was measured. In the graph of FIG. 10, the number on the vertical axis indicates a multiplier and the horizontal axis indicates the pitch (μm) between the mesh holes and the diameter (μm) of the mesh holes.

In the experimental example, if the diameter of a mesh hole was set at 250 μm and the pitch was set at 550 μm (indicated by symbol (a)), an insulation resistance of approximately $1 \times 10^9$ Ω could be maintained. In the first comparison example, the insulation resistance was lowered to $1 \times 10^8$ Ω under the same conditions. On the other hand, in the experimental example, if the diameter of a mesh hole was set at 250 μm and the pitch was set at 500 μm in the experimental example (indicated by symbol (b) in FIG. 10), the insulation resistance of not less than $1 \times 10^9$ Ω could be maintained. In the first comparison example, the insulation resistance is lowered to about $1 \times 10^8$ Ω under the same conditions, as indicated by symbol (d) in FIG. 10.

As can be seen from the test result, the position of the mesh hole and the insulation resistance of the interlayer resin insulating layer correlate to each other. If the mesh holes are arranged to overlay one another as shown in the experimental example, it is possible to increase the insulation resistance of the interlayer resin insulating layer.

It is noted that if upper and lower mesh holes overlay each other, it is possible to increase the insulation resistance of the interlayer resin insulating layer. FIG. 8C shows the positional relationship between the mesh holes 189a in the plain layer 189 formed on the outermost interlayer resin insulating layer 180 and the mesh holes 179a in the plain layer 179 formed on the interlayer resin insulating layer 170. In the manufacturing method described above with reference to the first embodiment, the positional errors of about 35 μm are generated between the upper and lower mesh holes 189a and 179a. Even if a positional error of about 35 μm occurs, the insulation resistance of the interlayer resin insulating layer can be increased by setting the diameter of the mesh hole at not less than 70 μm to overlay at least part of the mesh holes with one another.

As described above, on the multilayer build-up wiring board in the first embodiment, the mesh holes in the upper and lower plain layers are formed such that at least part of them overlay one another, thereby preventing the insulation resistance of the interlayer resin insulating layer from lowering.

Second Embodiment

A multilayer build-up wiring board and a manufacturing method thereof in the second embodiment according to the present invention will be described with reference to the drawings.

First, description will be given to the constitution of a multilayer build-up wiring board 10 in the second embodiment of the present invention with reference to FIGS. 16, 17 and 18.

Figure 16:
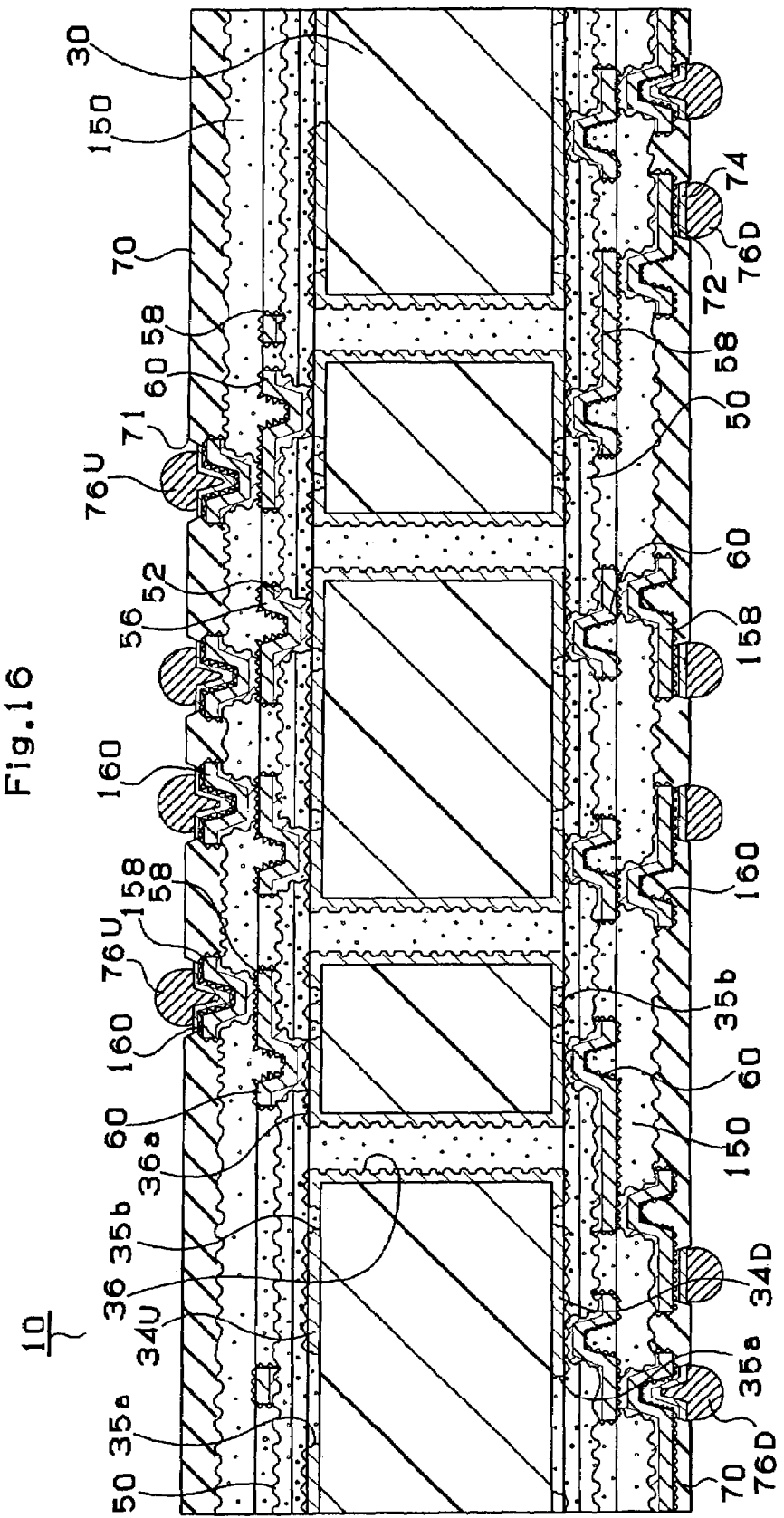
FIG. 16 is a cross-sectional view of the multilayer build-up wiring board in the second embodiment according to the present invention.

FIG. 16 is a cross-sectional view of a multilayer printed wiring board 10 before an IC chip is mounted thereon. FIG. 17 shows a state in which an IC chip 90 is mounted on the multilayer printed wiring board 10 shown in FIG. 10 and the board 10 is attached onto a daughter board 94.

As shown in FIG. 16, on the multilayer build-up wiring board 10, through holes 36 are formed in a core substrate 30. A plain layer 34U, which serves as a power layer, is formed on the surface of the core substrate 30 (IC chip side) and a plain layer 34D, which serves as a ground layer, is formed on the back surface thereof (daughter board side). Lower interlayer resin insulating layers 50, on which via holes 60 and conductor circuits 58 are formed, are arranged on the plain layers 34U and 34D, respectively. Upper interlayer resin insulating layers 150, on which via holes 160 and conductor circuits 158 (FIG. 16 shows only the back surface side) are formed, are arranged on the lower interlayer resin insulating layers 50, respectively.

Figure 17:
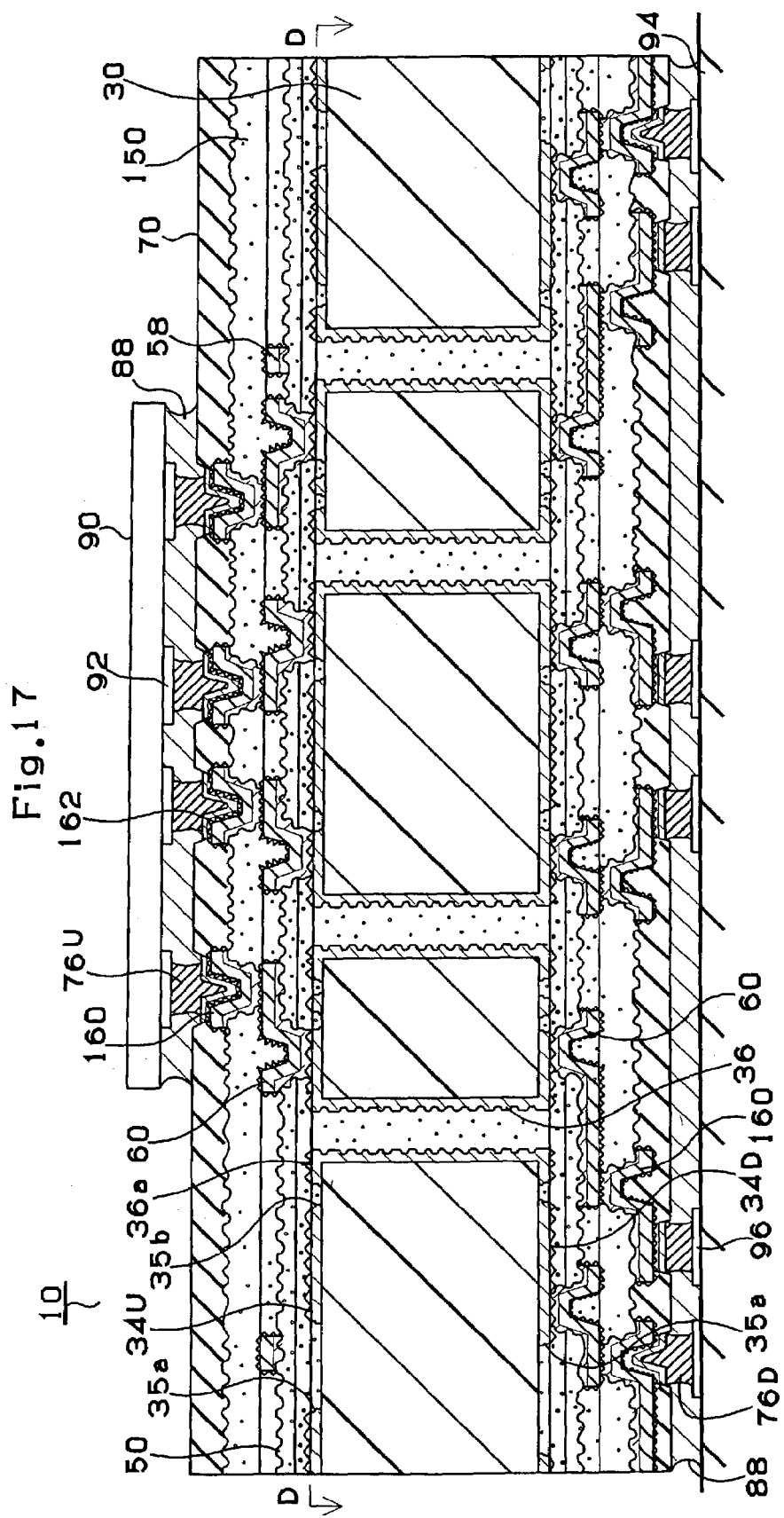
FIG. 17 is a cross-sectional view of the multilayer build-up wiring board in the second embodiment according to the present invention.

As shown in FIG. 17, solder bumps 76U, for connecting to the lands 92 of the IC chip 90, are provided on the upper surface of the multilayer printed wiring board. Each of the solder bumps 76U is connected to the through hole 36 through the via hole 160 and the via hole 60. Solder bumps 76D for connecting to the lands 96 of the daughter board 94, are provided on the lower surface of the multilayer printed wiring board 10. Each of the solder bumps 76D is connected to the through hole 36 through the via hole 160 and the via hole 60.

FIG. 18 is a cross-sectional view taken along line D-D of FIG. 17, showing the plane of the plain surface 34U formed on the surface of the core substrate 30. The cross section taken along line E-E of FIG. 18 corresponds to FIG. 17. As shown in FIG. 18A, mesh holes 35a each having a diameter of 250 μm are formed outside of a region C (to be referred to as 'chip mount region' hereinafter) facing a region on which IC chip 90 is mounted through the interlayer resin insulating layer at intervals of pitch P (560 μm). Lageniform mesh holes 35b are formed inside the chip mount region C. FIG. 18B shows an enlarged mesh hole 35b. In the mesh hole 35b, the land 36a of the through hole 36 and the via hole (bottom of the via hole) 60a are formed with gaps K of 5 to 50 μm. The land 36a is connected to a pad, to which the via hole is connected, through the conductor circuit 34c.

On the multilayer printed wiring board 10 in the second embodiment, mesh holes 35b are formed in the chip mount region C of the plain layer 34U and the land 36a of the through hole 36 and the pad 60a, to which the via hole is connected, are provided in each of the mesh holes 35b. Due to this, the interlayer resin insulating layer 50 formed above the plain layer 34U and the resin core substrate 30 formed below the plain layer 34U can be directly contacted with each other through the gaps K of the mesh holes 35b provided on the outer periphery of the land 36a and the pad 60a to which the via hole is connected, thereby making it possible to increase bonding property. In addition, gas containing moisture and the like absorbed by the interlayer resin insulating layers 50 and the core substrate 30 can be exhaled through the gaps K of the mesh holes 35b provided on the outer periphery of the land 36a and the pad 60a to which the via hole is connected. Due to this, it is possible to increase the insulating properties of the interlayer resin insulating layers 50 and the core substrate 30 and to prevent the interlayer resin insulating layers from peeling off. Further, since the land 36a and the pad 60a to which the via hole is connected are formed in each of the mesh holes 35b in the chip mount region C, irregular portions are not formed and the chip mount region C can be made flat. That is, if the mesh holes 35a are arranged in the chip mount region C, the holes are left as recessed portions. In the second embodiment, however, the land 36a and the pad 60a, to which the via hole is connected, are provided in each of the holes, so that the chip mount region C can be made flat. It is noted that the land 36a and the pad to which the via hole is connected may be integrally formed into lageniform, round-bellied or teardrop shape as shown in FIG. 18C.

Next, manufacturing steps for a multilayer build-up wiring board in the second embodiment according to the present invention will be described with reference to FIGS. 11 to 16. In this embodiment, the multilayer build-up wiring board is formed by means of the semi-additive method.

(1) As shown in FIG. 11A, a copper-clad laminate 30A including a substrate 30 of glass epoxy resin or BT (Bismaleimide/Triazine) resin and having a 18 μm copper foil 32 laminated on both sides thereof is used as a starting material. First, the copper-clad laminate 30A is drilled and subjected to electroless plating and pattern-etching, thereby forming a through hole 36 and plain layers 34U and 34D and forming a core substrate 30 shown in FIG. 11B. As already described above with reference to FIG. 18, mesh holes 35a and 35b are formed in the plain layer 34U and 34D, and the land 36a of a through hole 36, a conductor circuit 34c and the bottom 60a of the via hole are provided in each of the mesh holes 35b in the chip mount region C.

(2) The substrate 30 having the plain layers 34 and the through holes 36 formed thereon are washed and dried. Thereafter, roughened layers 38 are provided on the surfaces of the plain layers 34U, 34D and of through holes 36 by oxidizing-reducing using an oxidizing (blackening) bath of NaOH (10 g/l), NaClO$_2$ (40 g/l) and Na$_3$PO$_4$ (6 g/l) and a reducing bath of NaOH (10 g/l) and NaBH$_4$ (6 g/l) (see FIG. 11C).

(3) The same composition of material for preparing a filling resin described in the first embodiment is mixed and kneaded to obtain a filling resin.

(4) The filling resin 40 obtained in (3) above is coated on the both sides of the substrate 30 using a roll coater within 24 hours after preparation, filled into the mesh holes 35a and 35b of the conductor circuits (plain layer) 34 and into the through holes 36 and dried at a temperature of 70° C. for 20 minutes. As for the other side, as in the case of the above, the filling resin 40 is filled into the mesh holes 35a and the through holes 36 and dried at a temperature of 70° C. for 20 minutes (see FIG. 11D).

(5) The substrate 30, which has been subjected to the treatment of (4) above, is sanded (see FIG. 12E). Next, heating treatment is conducted to harden the filling resin 40.

(6) A coated layer and roughened layer 42 of a needle alloy of Cu—Ni—P are provided on the surfaces of the plain layers 34U, 34D, the lands 36a of the through holes 36 and the bottoms 60a of the via holes as in the case of the first embodiment (see FIG. 12F).

Furthermore, Cu—Sn displacement reaction is conducted under conditions of 0.1 mol/l of tin fluoborate, 1.0 mol/l of thiourea, a temperature of 35° C. and a pH of 1.2 to thereby provide an Sn layer of a thickness of 0.3 µm on the surface of the roughened layer (not shown).

(7) The same composition of material for preparing an interlayer resin insulating agent as that in the first embodiment is agitated to adjust the viscosity thereof to 1.5 Pa·s to thereby obtain an interlayer resin insulating agent (for a lower layer).

Next, the same composition of material for preparing an electroless plating adhesive agent as that in the first embodiment is agitated to adjust the viscosity thereof to 7 Pa·s to thereby obtain an electroless plating adhesive agent solution (for an upper layer).

(8) The interlayer resin insulating agent (for lower layer) 44 obtained in (7) is coated on the both sides of the substrate of (6), the photosensitive adhesive agent solution (for an upper layer) 46 obtained in (7) above is coated and an adhesive agent layers 50a of a thickness of 35 µm are formed (see FIG. 12G).

(9) A photo mask film 51 (FIG. 13H) on which a 85 µmφ black circle 51a is printed is in close contact on the both sides of the substrate 30 on which the adhesive agent layer has been formed in (8) above, exposed and developed to thereby form interlayer resin insulating layers (two-layer structure) 50 having a thickness of 35 µm and 85 µmφ openings (via hole formation openings) 48 (see FIG. 13I). A tin plated layer (not shown) is partially exposed to the openings 48 which become via holes.

(10) The substrate 30, in which the openings 48 are formed, is submerged in chromic acid for 19 minutes to dissolve and remove epoxy resin particles present on the surfaces of the interlayer resin insulating layers 50, thereby roughening the surfaces of the interlayer resin insulating layers 50 (see FIG. 13J). Thereafter, the substrate is submerged in a neutralizing solution (manufactured by Shipley Far East) and washed.

(11) A palladium catalyst (manufactured by Atotec) is added to the surface of the substrate 30 which has been subjected to roughening treatment in the step of (10) above, thereby providing catalyst nuclei on the surfaces of the interlayer insulating layers 50. Thereafter, the substrate 30 is submerged in the same electroless copper plating solution as that in the first embodiment to thereby form electroless plated films 52 of a thickness of 0.6 µm on the entire surfaces (see FIG. 13K).

(12) A commercially available photosensitive dry film is put on each electroless copper plated film 52 formed in (11) above and a mask is mounted thereon. The film is exposed at 100 mJ/cm² and developed by 0.8% sodium carbonate, to thereby provide a plating resist 54 of a thickness of 15 µm (see FIG. 13L)

(13) Next, electrolytic copper plating is conducted to portions on which no resist is formed under the same conditions as those in the first embodiment, to thereby form electrolytic copper plated films 56 of a thickness of 15 µm (see FIG. 14M).

(14) After the plating resists 54 are peeled off by 5% KOH, the electroless plated films 52 under the plating resists are etched by a mixture liquid of sulfuric acid and peroxide and dissolved, thereby forming conductor circuits 58 and via holes 60 each consisting of the electroless copper plated film 52 and the electrolytic copper plated film 56 and having a thickness of 18 µm (FIG. 14N).

(15) The same treatment as in (6) is conducted and roughened layers 62 of Cu—Ni—P are formed on surfaces of the conductor circuits 58 and the via holes 60, and the surface of the roughened layers 62 are subjected to Sn displacement reaction (see FIG. 14O).

(16) The steps of (7) to (15) are repeated, thereby forming interlayer resin insulating layers 150, via holes 160 and upper layer conductor circuits 158 and completing a multilayer build-up wiring board (see FIG. 14P). It is noted that no Sn displacement is conducted in the steps of forming the upper layer conductor circuit.

(17) Thereafter, a solder bump is formed on the above-stated multilayer build-up wiring board. The same solder resist composition 70a of a thickness of 45 µm as that in the first embodiment is coated on the both sides of the substrate 30 obtained in (16) above (see FIG. 15Q). Next, exposure and development treatments are conducted to thereby form solder resist layers (thickness: 20 µm) 70 having openings (opening diameter: 200 µm) 71 in soldering pad portions (including a via hole and a via hole land) (see FIG. 15R).

(18) Next, nickel plated layers 72 are formed. Gold plated layers 74 of a thickness of 0.03 µm are formed on the nickel plated layers, respectively, thereby forming solder pads 75 on via holes 160 and conductor circuits 158 (only the back side shown) (see FIG. 15S).

(19) Solder bumps (solder bodies) 76U, 76D are formed in the opening portions 71 of the solder resist layers 70 by printing solder paste and conducting reflow at 200° C., thereby completing a multilayer build-up wiring board 10 (see FIG. 16).

The pads 92 of the IC chip 90 are correspondingly mounted on the solder bumps 76U of the completed multilayer printed wiring board 10. Then, reflow is conducted and the IC chip 90 is mounted on the pads 92. Thereafter, an under-fill 88 is filled between the IC chip 90 and the multilayer printed wiring board 10. The multilayer printed wiring board 10 on which the IC chip 90 is mounted, is correspondingly mounted on bumps 96 of the daughter board 94. Then, reflow is conducted and the board 10 is attached to the daughter board 94. Thereafter, an under-fill 88 is filled between the multilayer printed wiring board 10 and the daughter board 94.

Figure 19:
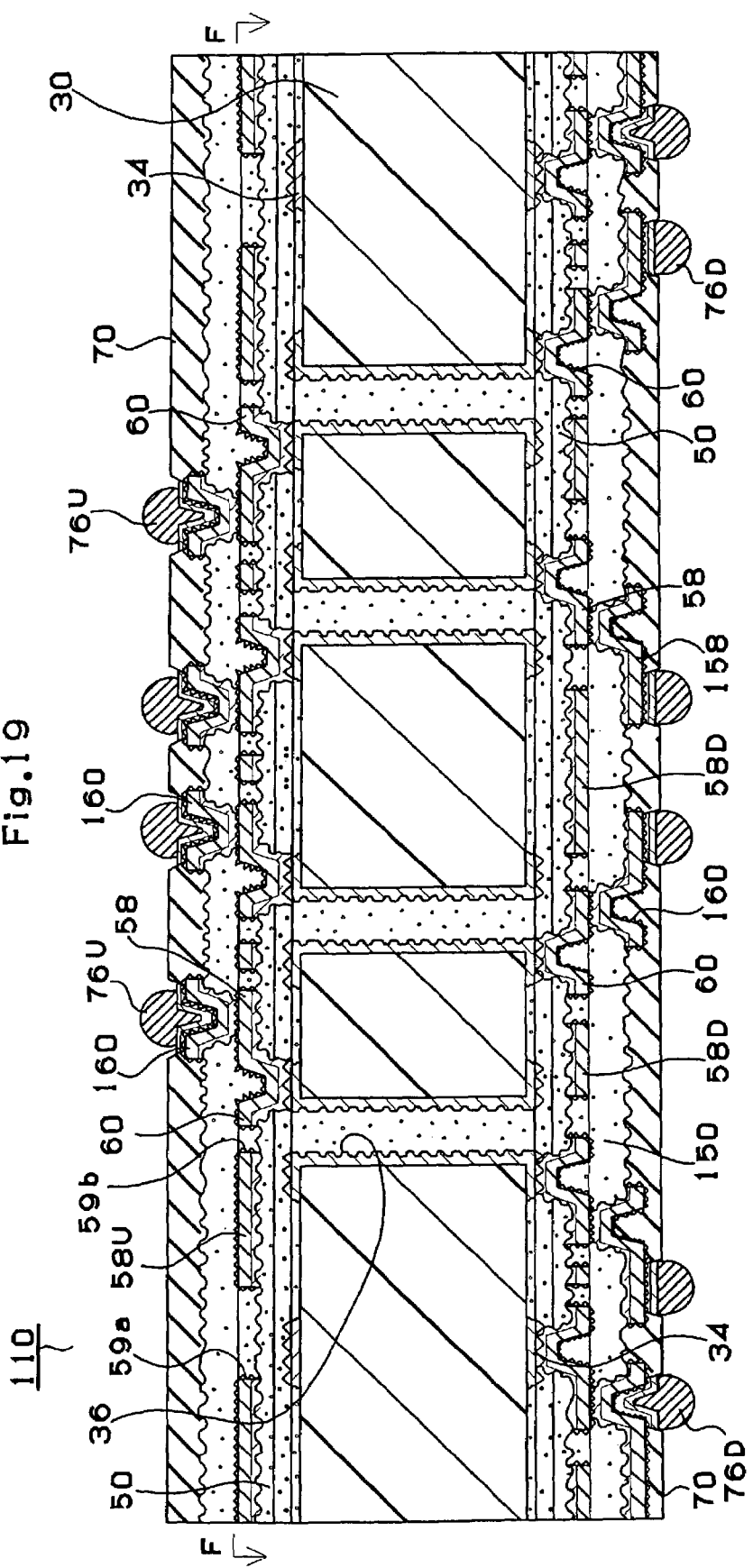
FIG. 19 is a cross-sectional view of a multilayer build-up wiring board in the first modified example of the second embodiment.
Figure 23:
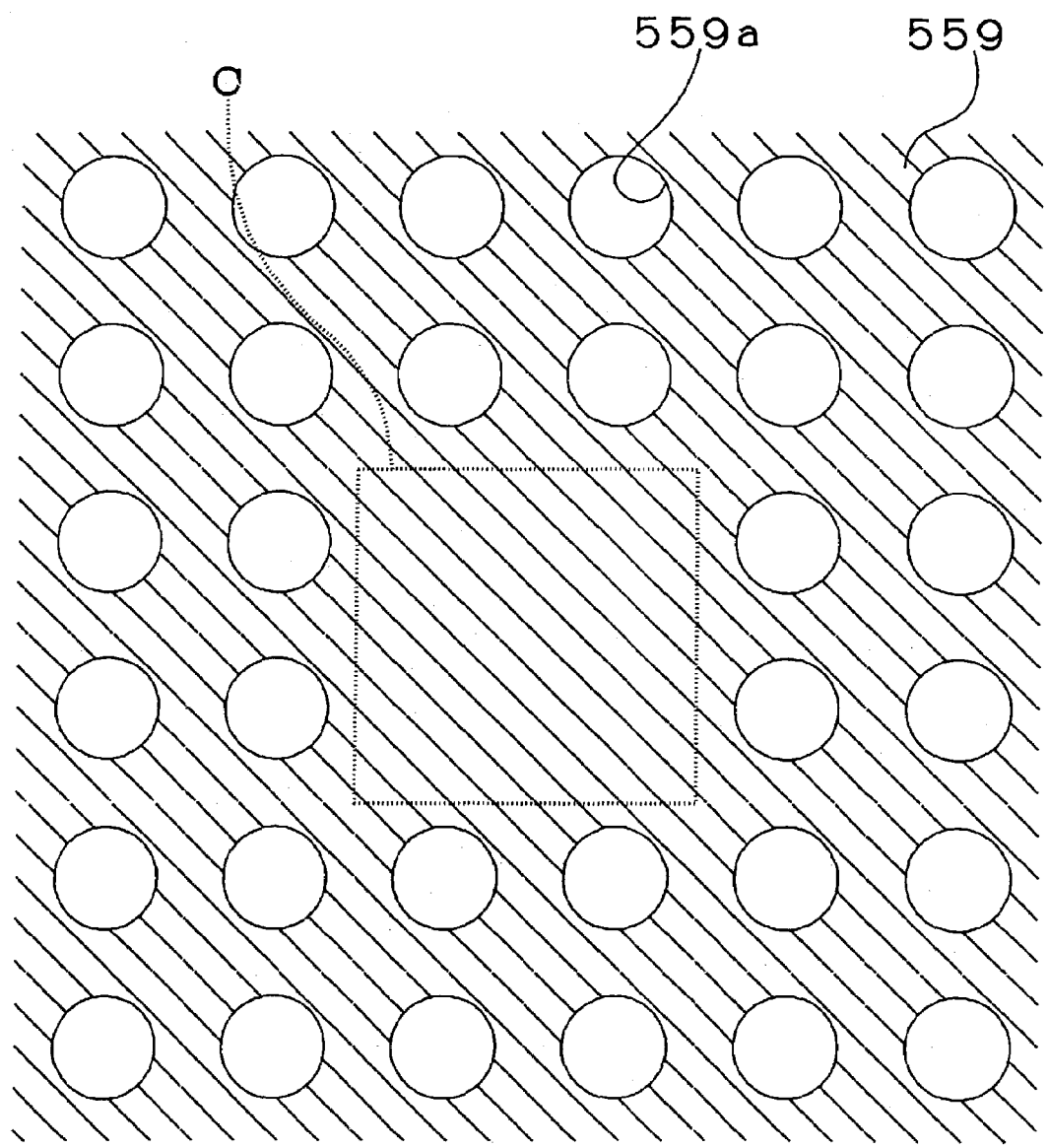
FIG. 23 is a plan view of the plain layer of a multilayer build-up wiring board in a conventional technique.
Figure 24:
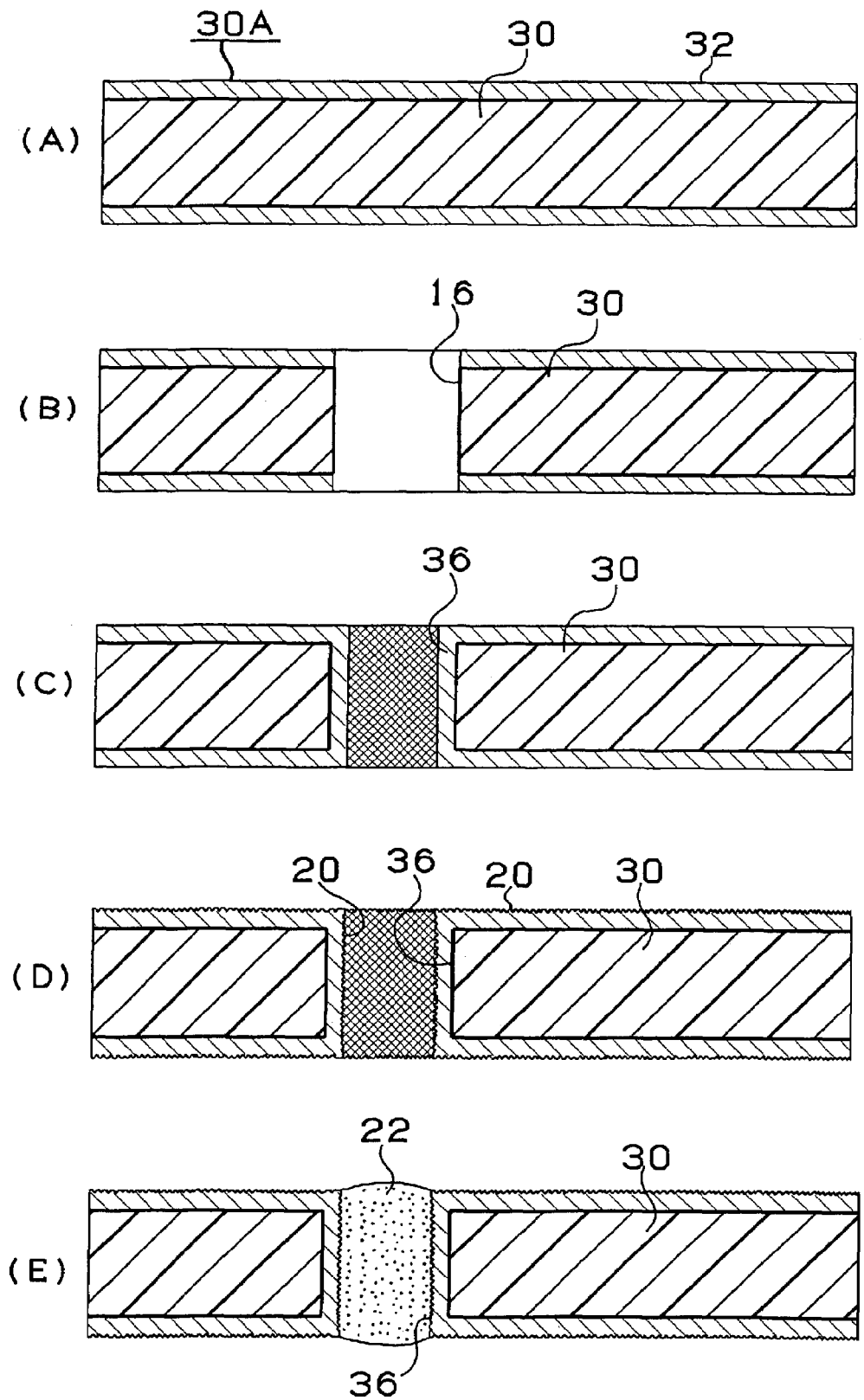
FIGS. 24A, 24B, 24C, 24D and 24E show manufacturing steps of a multilayer build-up wiring board in the third embodiment according to the present invention.
Figure 25:
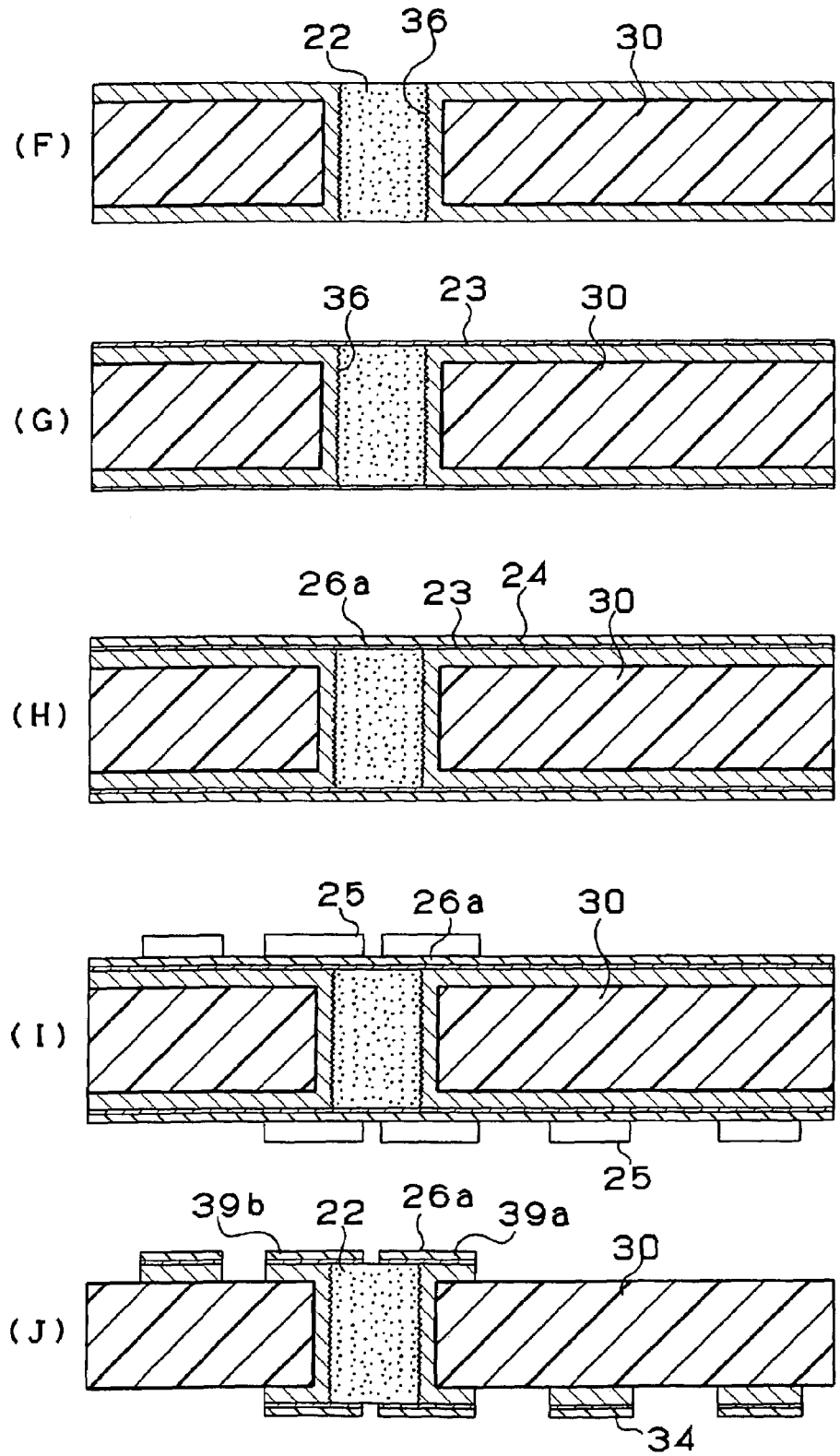
FIGS. 25F, 25G, 25H, 25I and 25J show manufacturing steps of the multilayer build-up wiring board in the third embodiment according to the present invention.
Figure 26:
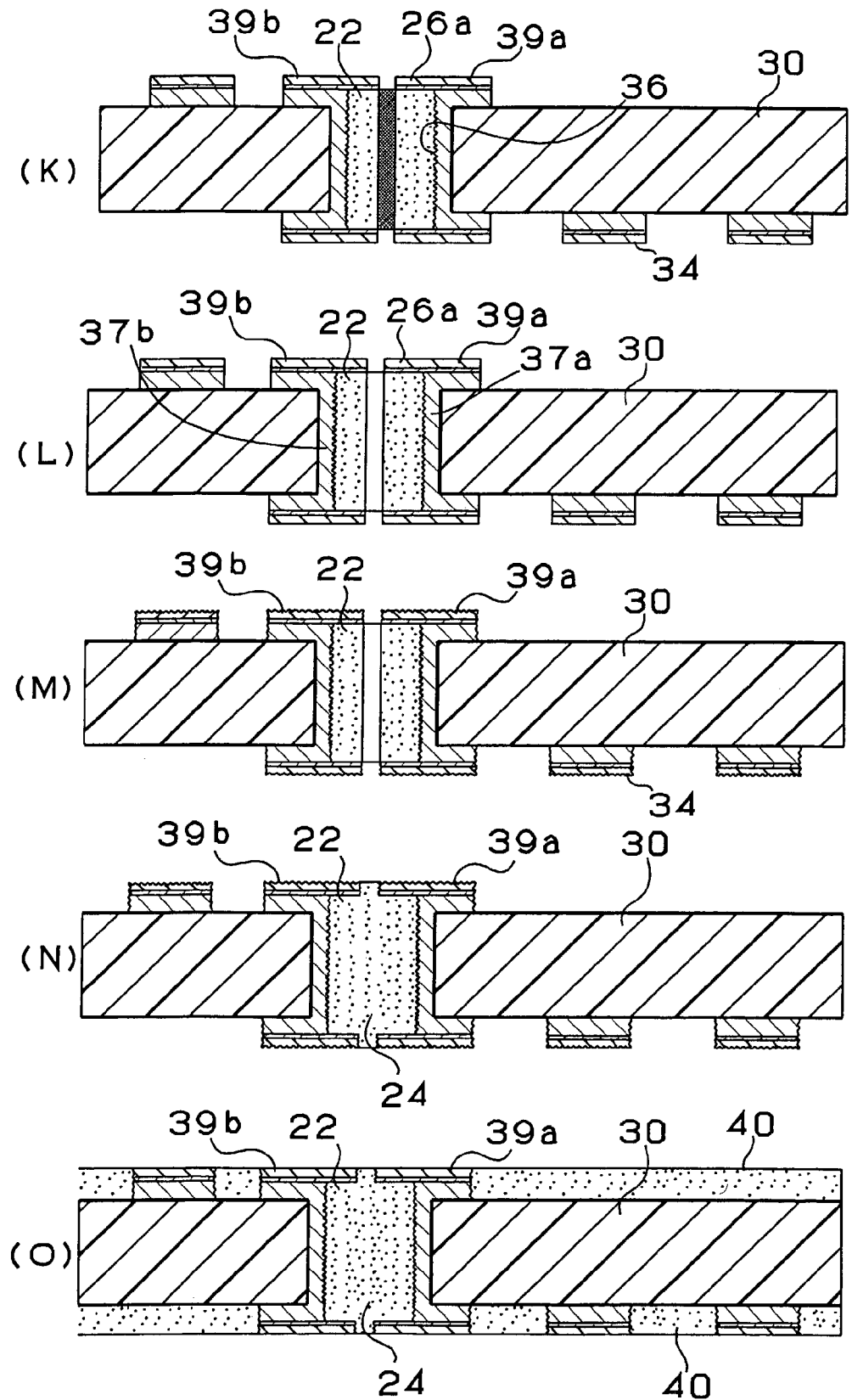
FIGS. 26K, 26L, 26M, 26N and 26O show manufacturing steps of the multilayer build-up wiring board in the third embodiment according to the present invention.
Figure 27:
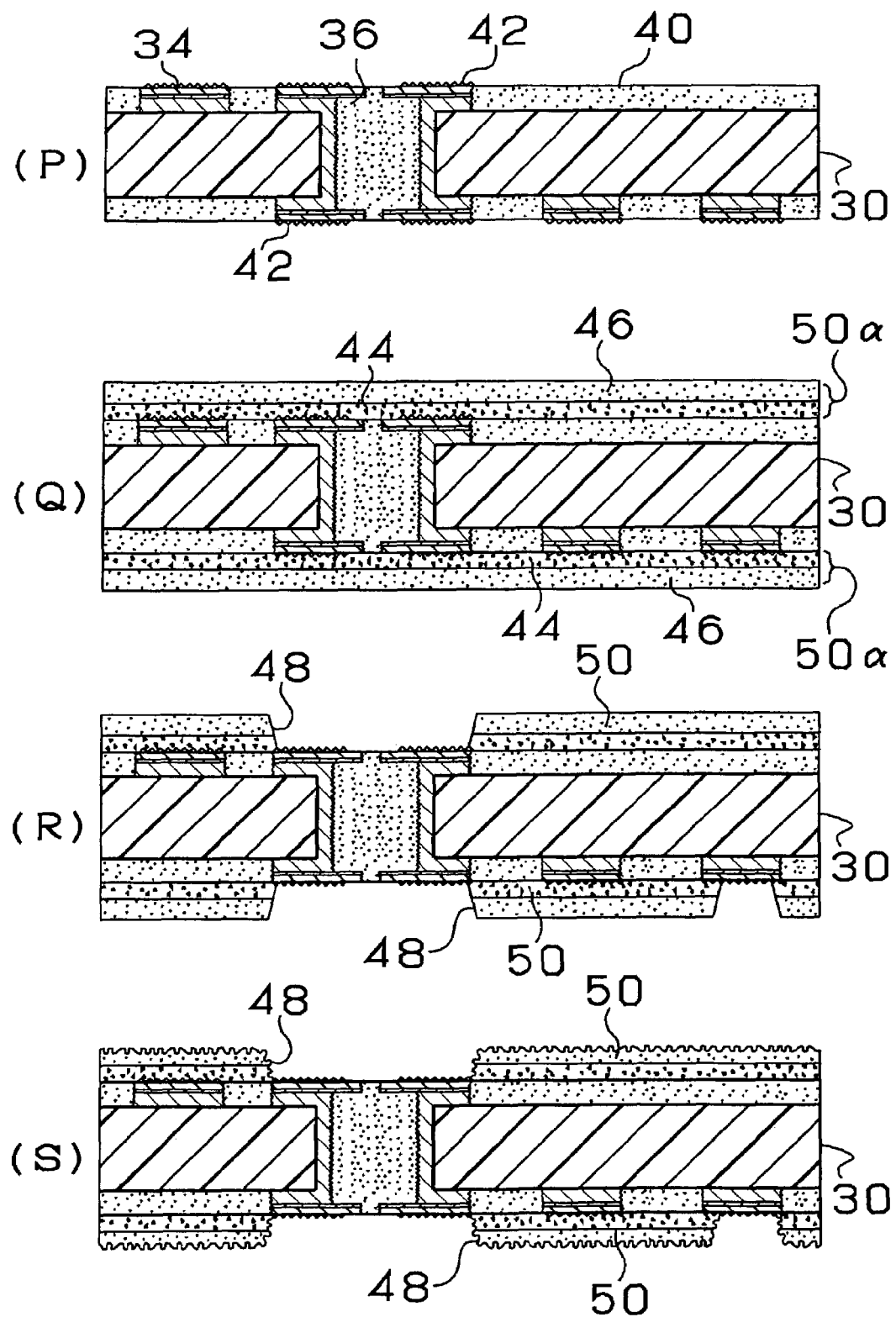
FIGS. 27P, 27Q, 27R and 27S show manufacturing steps of the multilayer build-up wiring board in the third embodiment according to the present invention.
Figure 28:
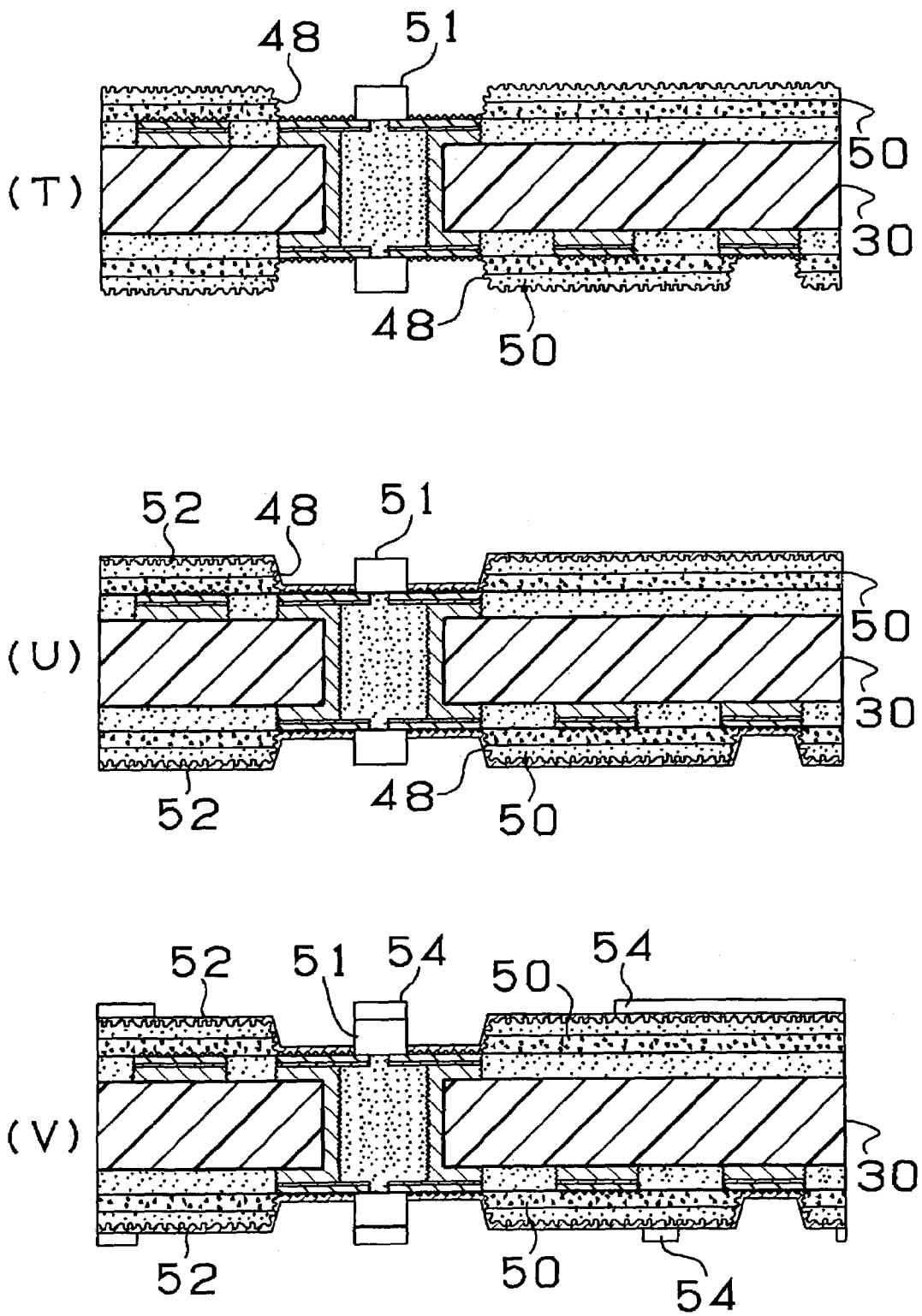
FIGS. 28T, 28U and 28V show manufacturing steps of the multilayer build-up wiring board in the third embodiment according to the present invention.
Figure 29:
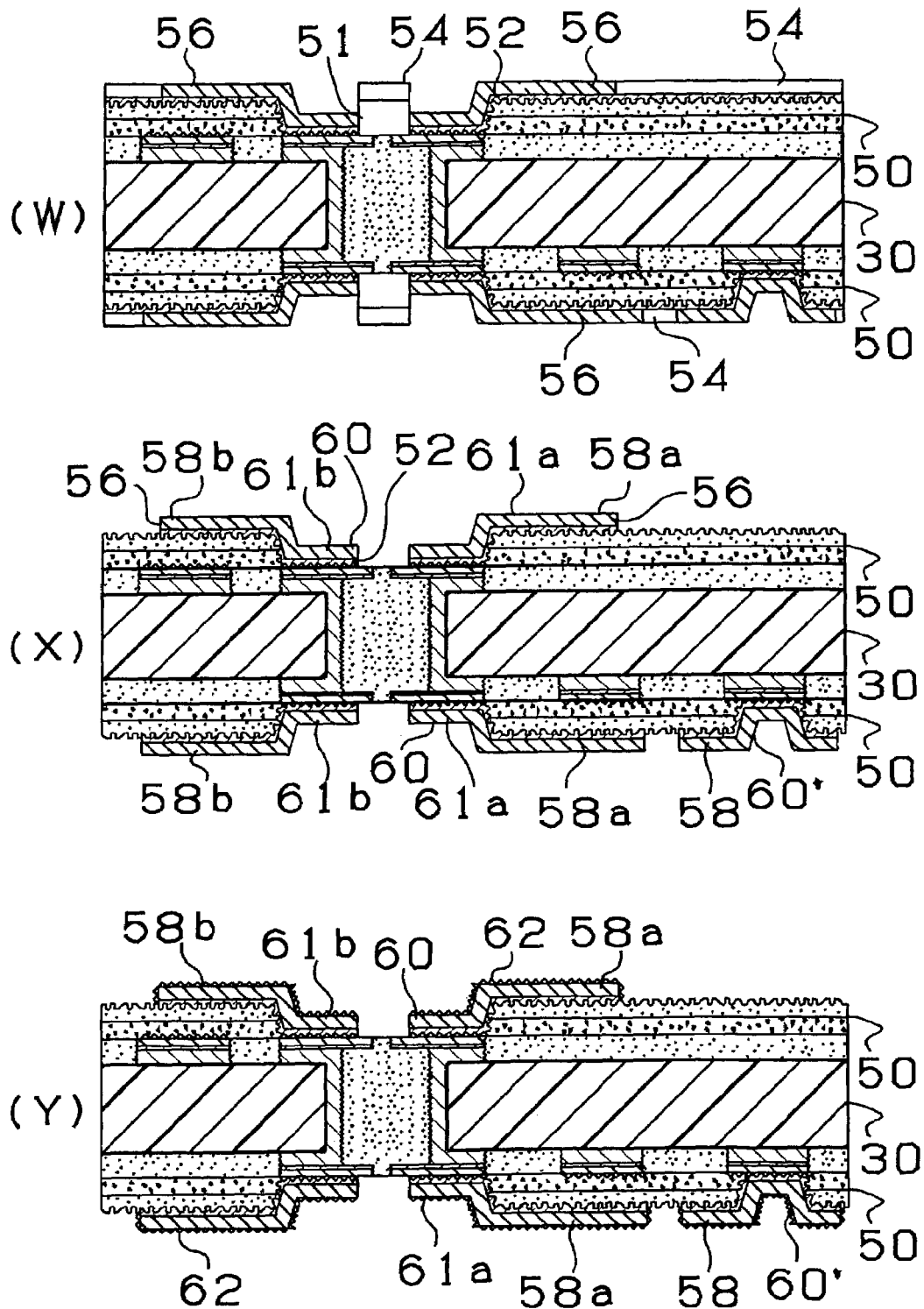
FIGS. 29W, 29X and 29Y show manufacturing steps of the multilayer build-up wiring board in the third embodiment according to the present invention.
Figure 30:
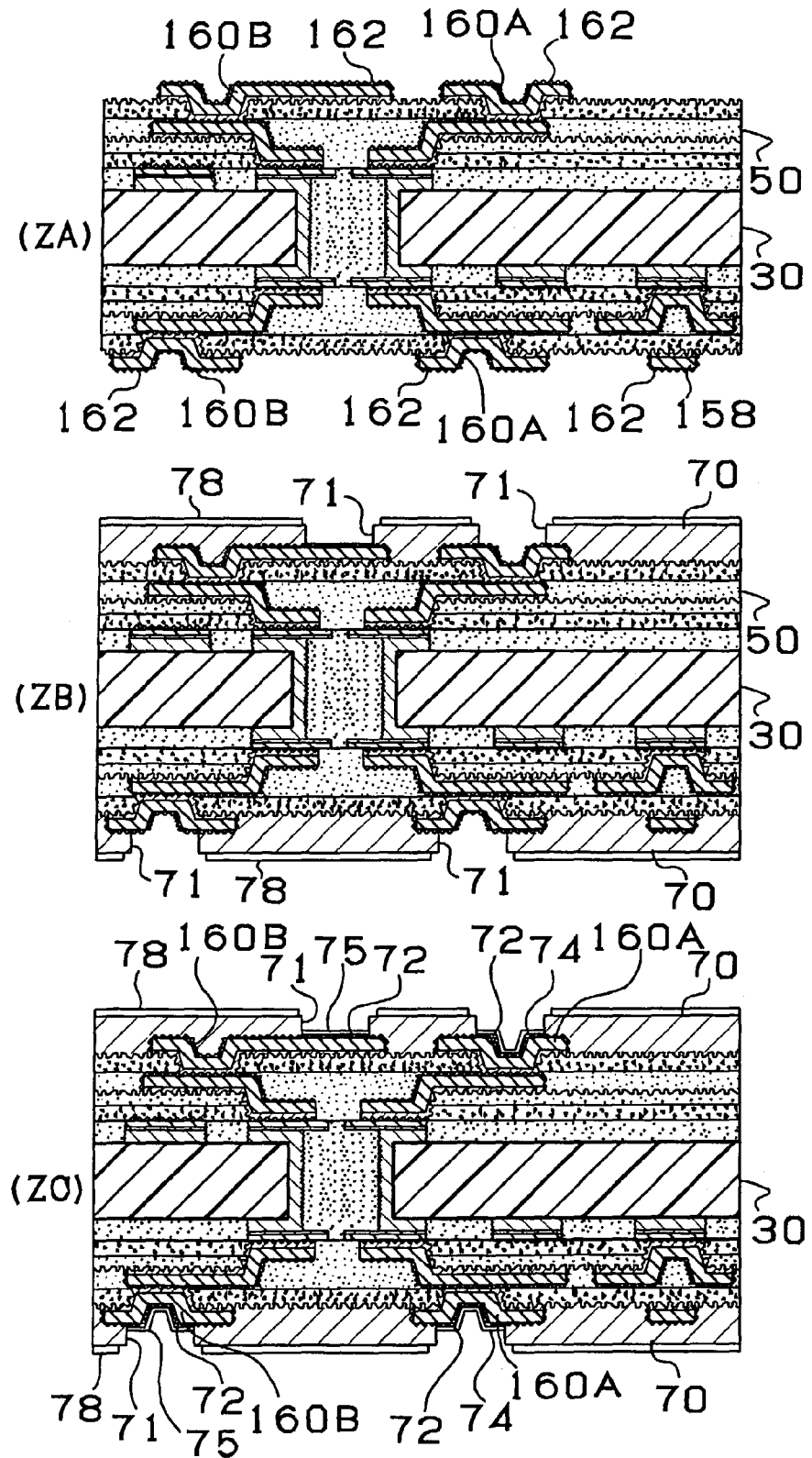
FIGS. 30ZA, 30ZB and 30ZC show manufacturing steps of the multilayer build-up wiring board in the third embodiment according to the present invention.

Next, the first modified example of the present invention will be described with reference to FIGS. 19 and 20. FIG. 19 is a cross-sectional view of a multilayer wiring board 110 in the first modified example. In the second embodiment described above, the plain layers 34U and 34D are provided on the both sides of the core substrate 30, respectively. On multilayer printed wiring board 110 in the first modified example, plain layers 58U and 58D are formed on the interlayer resin insulating layers 50, respectively.

That is, on the multilayer build-up wiring board 110 in the first modified example, conductor circuits 34 are formed on the front and back sides of the core substrate 30, respectively and lower layer side interlayer resin insulating layers 50 are formed on the conductor circuits 34, respectively. Plain layers 58U and 58D are formed on the lower layer side interlayer resin insulating layers 50, respectively. Here, the plain layer 58 on the surface side (IC chip side) is used as a power layer, whereas the plain layer 58 on the back surface side (daughter board side) is used as a ground layer. Upper interlayer resin insulating layers 150 are formed on the plain layers 58U and 58D, respectively. Via holes 160 and conductor circuits 158 are provided on each of the upper interlayer resin insulating layer 150.

FIG. 20A is a cross-sectional view taken along line F-F of FIG. 19, showing the plane of the plain layer 58U formed on the interlayer resin insulating layer 50. The cross section G-G of FIG. 20A corresponds to FIG. 19. As shown in FIG. 20, mesh holes 59a of a diameter of 200 μm are formed outside of a chip mount region C of the plain layer 58U. Lageniform meshes 59b are formed inside the chip mount region C. FIG. 20B shows an enlarged lageniform mesh 59b. A via hole 60 formed in the interlayer insulating layer 50 and a pad (bottom of the via hole), to which a via hole formed in the interlayer resin insulating layer 150 is formed, are provided in each of the mesh holes 59b with a gap K of several tens of microns provided. That is, the land 60 of the via hole and the pad 160a, to which the via hole is connected, are formed integrally with each other.

On the multilayer printed wiring board 110 in the first modified example, the meshes 59b are formed in the chip mount region C of the plain layer 58U and the via hole land 60 and the pad 160a, to which the via hole is connected, are provided in each of the mesh holes 59b. Due to this, the interlayer resin insulating layer 150 formed above the plain layer 58U and the interlayer resin insulating layer 50 formed below the plain layer 58U can be in direct contact to each other through the gaps K of the mesh holes 59b provided on the outer periphery of the via hole land 60 and the pad 160a, to which the via hole is connected, thereby making it possible to increase bonding property. In addition, gas containing moisture and the like absorbed by the interlayer resin insulating layers 150 and 50 can be exhaled through the gaps K of the mesh holes 59b provided on the outer periphery of the via hole land 60 the pad 160a, to which the via hole is connected. Due to this, it is possible to increase the insulating properties of the interlayer resin insulating layers 50 and 150 and to prevent the interlayer resin insulating layers from peeling off. Further, since the via hole land 60 and the pad 160a, to which the via hole is connected, are formed inside each mesh hole 59b in the chip mount region C, irregular portions are not formed and the chip mount region C can be formed flat. It is noted that the constricted part of the coupled portion between the via hole land 60 and the pad 160a, to which the via hole is connected, may be eliminated and the mesh hole 59b may be round-bellied shaped or teardrop shaped.

Next, the constitution of a multilayer print wiring board in the second modified example will be described with reference to FIG. 21.

FIG. 21 is a plan view showing a plain layer 34U formed on the front surface of the core substrate. In the second embodiment described above with reference to FIG. 18, mesh holes 35b, in each of which the through land 36a and the pad 60 to which the via hole is connected are provided, are formed in the chip mount region C. In the second modified example, by contrast, not only lageniform mesh holes 35b but also circular mesh holes 35c are provided in the chip mount region C, and a solid conductor layer 34d is arranged in each mesh hole 35C. As shown in FIG. 21B, the solid conductor layer 34d may be connected to the plain layer 34U around the layer 34d at, at least one portion.

On the multilayer printed wiring board in the second modified example, mesh holes 35c are formed in the chip mount region C of the plain layer 34C and the solid conductor layer 34d is provided in each of the mesh holes 35c. Due to this, the interlayer resin insulating layer 50 provided above the plain layer 34U and the resin core substrate 30 provided below the plain layer 34U can be directly connected to each other through gaps of the mesh holes 35C each provided on the peripheral portion of the solid conductor layer 34d, thereby making it possible to increase bonding property. Also, gas containing moisture or the like absorbed by the interlayer resin insulating layers 50 and the core substrate 30 can be exhaled through the gaps of the mesh holes 35c provided around the slid conductor layers 34d, so that the insulating properties of the interlayer resin insulating layers 50 and the core substrate 30 can be enhanced and the interlayer resin insulating layers can be prevented from peeling off. Further, since the solid conductor 34d is formed in each of the mesh holes 35c in the chip mount region C, no irregular portion is formed and the chip mount region C can be made flat.

Next, the constitution of a multilayer printed wiring board in the third modified example will be described with reference to FIG. 22.

FIG. 22A is a plan view showing a plain layer 34U formed on the front surface of a core substrate. In the second embodiment described above with reference to FIG. 18, mesh holes 35b, in each of which the through land 36a and the pad 60 to which the via hole is connected are provided, are formed in the chip mount region C. In the third modified example, by contrast, circular mesh holes 35d are formed in a chip mount region C and only a through hole land 36a is provided in each of the mesh holes 35d. FIG. 22B is a cross-sectional view of an interlayer resin insulating layer 50 and a core substrate 30 in the third modified example. In the third modified example, a via hole 60 is formed right on the land 36a of the through hole 36 formed in the core substrate 30.

On the multilayer printed wiring board in the third modified example, mesh holes 35d are formed in the chip mount region C of the plain layer 34U and a land 36a is provided in each of the mesh holes 35e. Due to this, the interlayer resin insulating layer 50 provided above the plain layer 34U and the resin core substrate 30 provided below the plan layer 34U can be in direct contact to each other through the gaps of the mesh holes 35d provided on the peripheral portion of the land 36a, thereby making it possible to enhance bonding property. Also, gas containing moisture and the like absorbed by the interlayer resin insulating layers 50 and the core substrate 30 can be exhaled through the gaps of the mesh holes 35d provided on the peripheral portion of the land 36a. This makes it possible to enhance the insulating properties of the interlayer resin insulating layers 50 and the core substrate 30 and to prevent the interlayer resin insulating layers from peeling off. Further, since the land 36a is formed in each of the mesh holes 34d in the chip mount region C, no irregular portions are formed and the chip mount region C can be made flat. As shown in FIG. 22C, the through hole land 36a and the via hole 60 may be connected through a conductor layer (cover plating) 36e covering the through hole.

Third Embodiment

Now, a multilayer build-up wiring board and a manufacturing method thereof in the third embodiment according to the present invention will be described with reference to the drawings.

Figure 31:
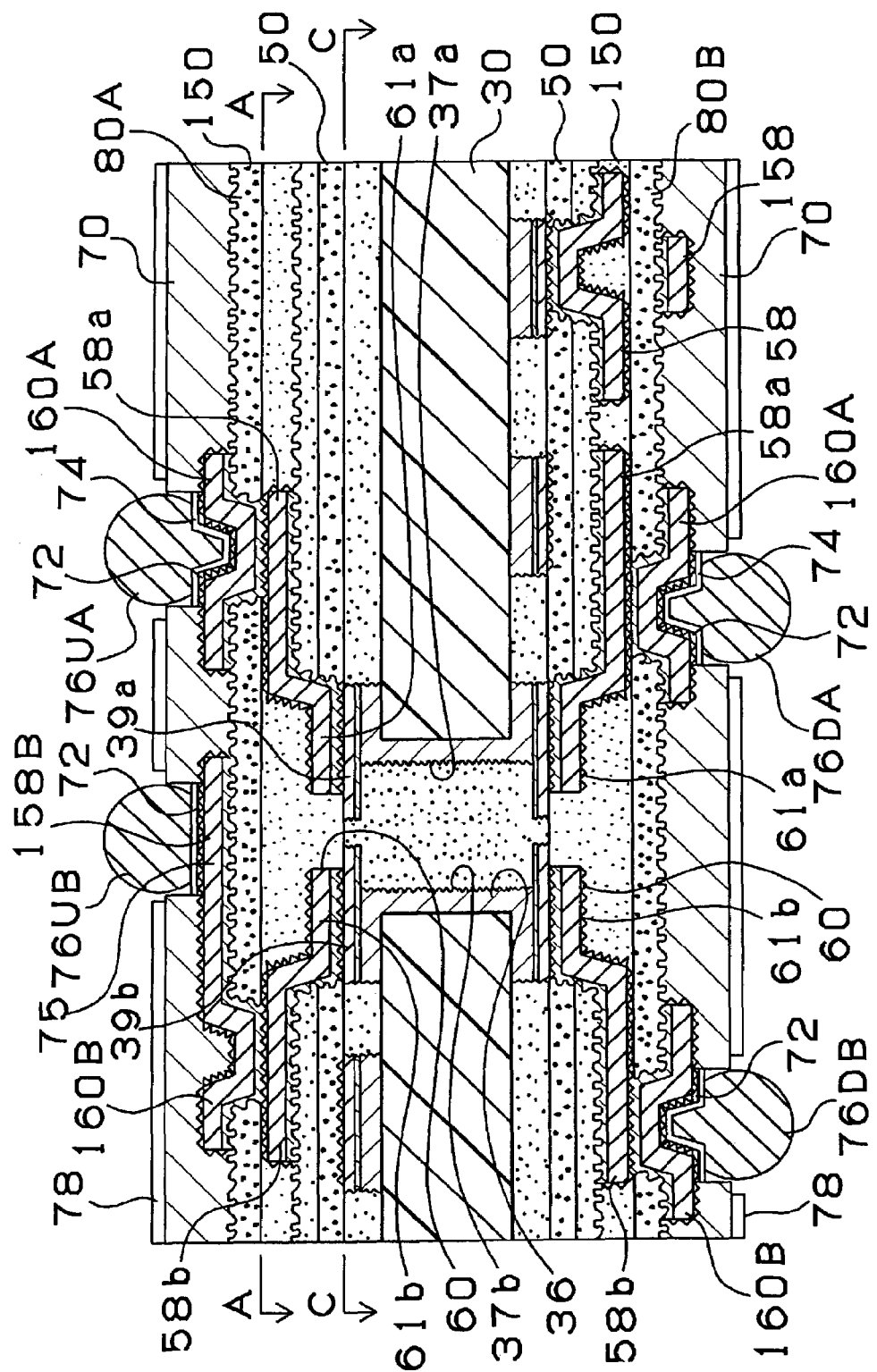
FIG. 31 is a cross-sectional view of the multilayer build-up wiring board in the third embodiment according to the present invention.
Figure 32:
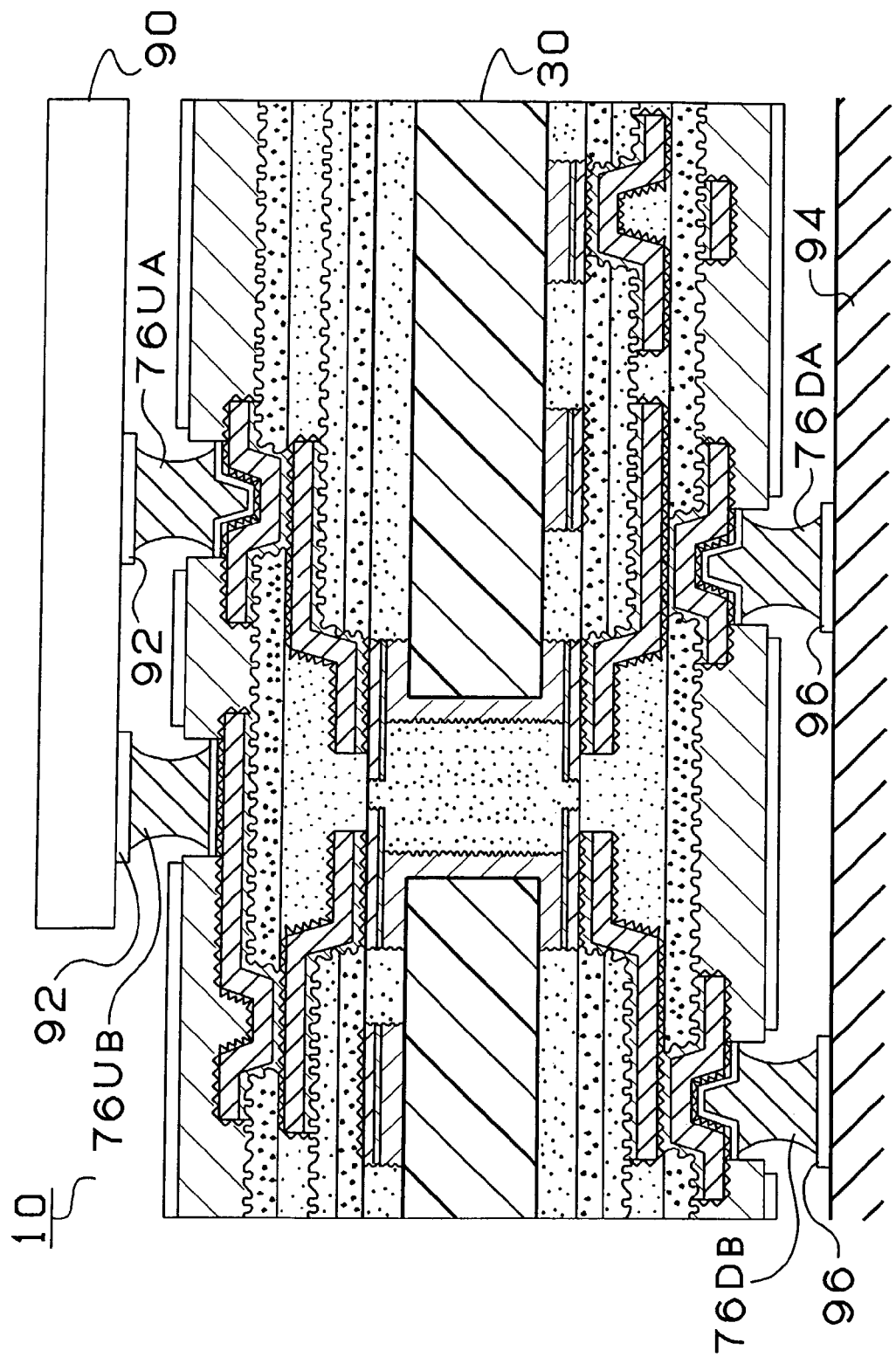
FIG. 32 is a cross-sectional view showing a state in which an IC chip is mounted on the multilayer build-up wiring board in the third embodiment according to the present invention.
Figure 33:
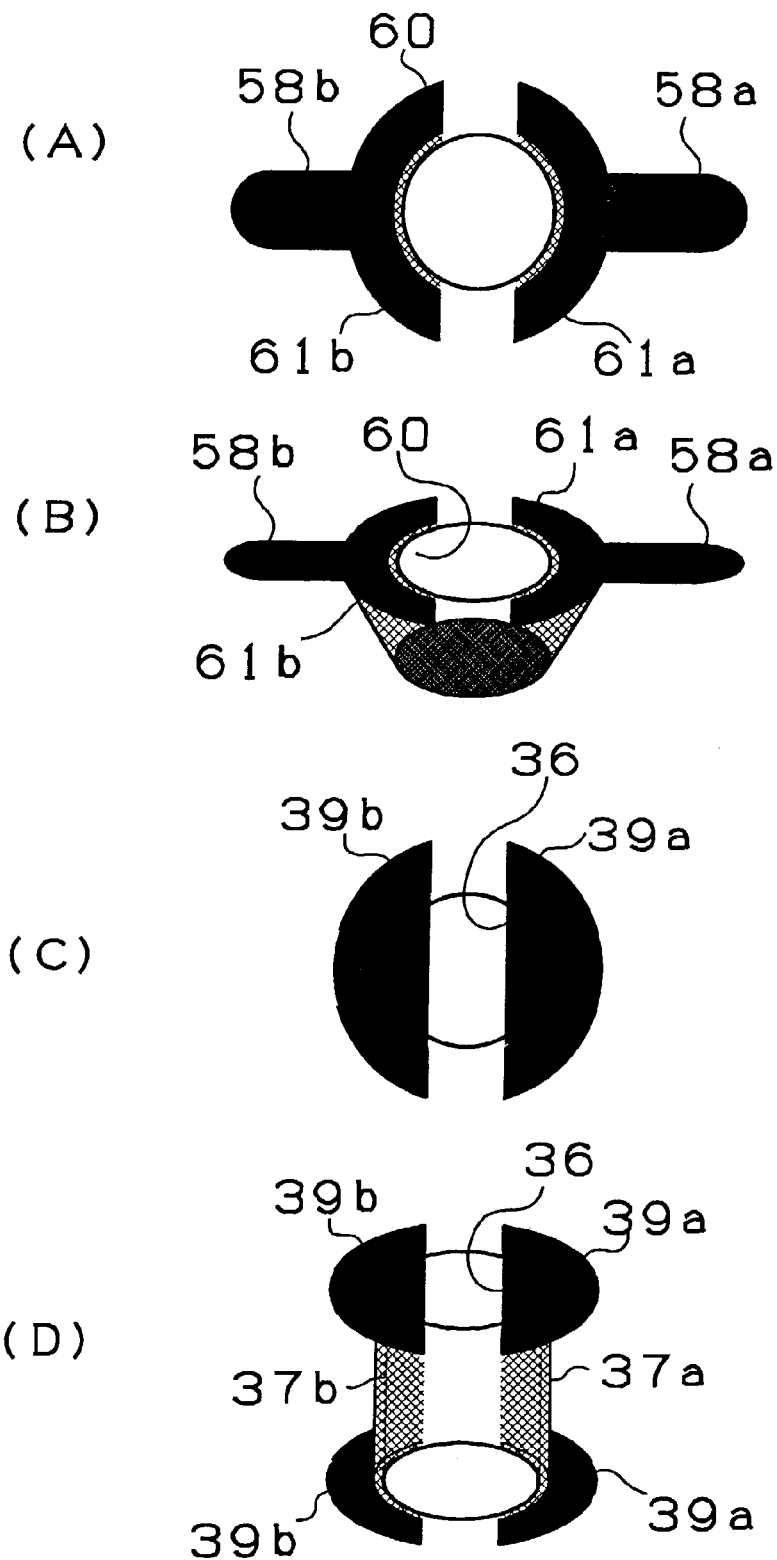
FIG. 33A is a cross-sectional view taken along line A-A of FIG. 31.
FIG. 33B is an explanatory view of the multilayer build-up wiring board in the third embodiment.
FIG. 33C is a cross-sectional view taken along line C-C of FIG. 31
FIG. 33D is an explanatory view of a through hole of the multilayer build-up wiring board in the third embodiment.

First, description will be given to the constitution of a multilayer build-up wiring board 10 in the third embodiment with reference to FIGS. 31, 32 and 33. FIG. 31 is a cross-sectional view showing a multilayer build-up wiring board (package board) 10 before an integrated circuit chip 90 is mounted thereon. FIG. 32 is a cross-sectional view showing the multilayer build-up wiring board 10 in a state in which the integrated circuit chip 90 is mounted. As shown in FIG. 32, an integrated circuit chip 90 is mounted on the upper surface of the multilayer build-up wiring board 10 and the lower surface of the board 10 is connected to a daughter board 94.

With reference to FIG. 31, the constitution of the multilayer build-up wiring board will be described in detail. On the multilayer build-up wiring board 10, build-up wiring layers 80A and 80B are formed on the front and back surfaces of a multilayer core substrate 30, respectively. The build-up layer 80A consists of an interlayer resin insulating layer 50 on which a via hole 60 and conductor circuits 58a and 58b are formed, and an interlayer resin insulating layer 150 on which via holes 160A and 160B and a conductor circuit 158B are formed. The build-up layer 80B consists of an interlayer resin insulating layer 50 on which a via hole 60 and conductor circuits 58a and 58b are formed, and an interlayer resin insulating layer 150 on which via holes 160A and 160B and a conductor circuit 158B are formed.

Solder bumps 76UA and 76UB for connecting to the lands 92 (see FIG. 32) of the integrated circuit chip 90 are arranged on the upper surface side. Solder bumps 76DA and 76DB for connecting to the lands 96 (see FIG. 32) of the daughter board (sub-board) 94 are arranged on the lower surface side.

FIG. 33A is a cross-sectional view taken along line A-A of FIG. 31, that is, a plan view of the opening portion of the via hole 60 provided in the surface of the interlayer resin insulating layer 50. FIG. 33B is an explanatory view perspectively showing the via hole 60. FIG. 33C is (a cross-sectional view taken along line C-C of FIG. 31, that is, a plan view of the opening portion of the through hole 36 formed in the surface of the core substrate 30. FIG. 33D is an explanatory view perspectively showing the through hole 36. On the multilayer build-up wiring board in this embodiment, the via hole 60 is divided into two parts and two wiring paths 61a and 61b are formed. Also, the through hole 36 is divided into two parts and two wiring paths 37a and 37b are formed. Semi-circular through hole lands 39a and 39b are connected to the wiring paths 37a and 37b, respectively. The through hole lands 39a and 39b are connected to the wiring paths 61a and 61b of the via hole, respectively.

As shown in FIG. 31, the solder bump 76UA is connected to the wiring path 37a of the through hole 36 through the wiring path 61a of the via hole 60 and the via hole 160A. The bump 76UA is further connected to the solder bump 76DA through the wiring path 61a of the via hole 60 and the via hole 160A from the wiring path 37a. Likewise, the solder bump 76UB is connected to the wiring path 37b of the through hole 36 through the via hole 160 and the wiring path 61b of the via hole 60. The bump 75UB is further connected to the solder bump 76DB through the wiring path 61b of the via hole 60 and the via hole 160B from the wiring path 37b.

In the third embodiment, the lands 39a and 39b formed at the opening of the through hole 36 are formed semi-circularly as shown in FIGS. 33C and 33D, and connected to the wiring paths 61a and 61b of the via hole, respectively, as shown in FIG. 31. By this connection, a region right on the through hole 36 can function as an inner layer pad to thereby remove a dead space. As a result, the arrangement concentration of the through holes 36 provided in the multilayer core substrate 30 improves and the number of the through holes 36 can be thereby increased. Further, two wiring paths 37a and 37b are arranged per through hole 36, so that the wiring paths twice as many as the through holes can be provided in the core substrate 30.

Further, since the via hole 60 arranged just on the through hole 36 consists of two wiring paths 61a and 61b, the wiring paths twice as many as the via holes can be provided in the interlayer resin insulating layer 50. Due to this, the wirings on the multilayer build-up wiring board can be arranged with high concentration. Besides, since the via hole 60 is formed right on the through hole 36, the wiring length is shortened and a high-speed multilayer build-up wiring board can be, therefore, realized.

On the multilayer build-up wiring board, a plurality of bumps on the back side thereof are integrated into one another and connected to the bumps on the front side. In this embodiment, by doubling the number of wirings connectable to one through hole, the wirings can be integrated on the build-up wiring layers 90A and 90B formed on the front and back sides, respectively, at the same pace. As a result, the number of build-up wiring layers 90A and 90B formed on the front and back sides, respectively can be reduced. That is to say, on the package substrate, wirings from a plurality of bumps on the front surface side (IC chip side) are connected to bumps on the back side (mother board side) while the wirings are integrated, so that more bumps are formed on the front side than the bumps on the back side. In this embodiment, to allow improving the wiring concentration on the front side, the number of build-up wiring layers 90A and 90B formed on the front and back sides, respectively can be made same (minimum).

Another mode of the third embodiment according to the present invention will be described with reference to FIGS. 34A and 34B.

FIGS. 34A and 34B show a case where a build-up wiring layer is formed on one side. In FIG. 34A, a conductor pin 230 is inserted into a through hole 36 and fixed by a solder 232. A solder resist 234 is provided on the back side. The conductor pin 230 is divided into two parts at the center by an insulator 230c and the both surfaces are electrically connected to the divided wiring paths 37a and 37b of the through hole 36, respectively. The wiring paths 37a and 37b are connected to the wiring paths 61a and 61b of the via hole 60, respectively. The wiring paths 61a and 61b are connected to solder bumps 76UA and 76UB through via holes 160A and 160B, respectively.

FIG. 34B shows a case where solder bumps 76DB and 76DA for connection purposes are formed on the side opposite to that on which the build-up multilayer wiring layer is formed. The solder bumps 76DB and 76DA are electrically connected to the divided wiring paths 37a and 37b of the through hole 36, respectively. The wiring paths 37a and 37b are connected to the wiring paths 61a and 61b of the via hole 60, respectively. The wiring paths 61a and 61b are connected to solder bumps 76UA and 76UB through the via holes 160A and 160B, respectively.

A signal line from the build-up multilayer wiring layer provided on one side of the core substrate can be pulled to the back side by the divided wiring paths 37a and 37b of the through hole 36 and the degree of freedom of the wirings on the back side can be improved.

Next, the method of manufacturing a multilayer build-up wiring board 10 in the third embodiment according to the present invention will be described with reference to FIGS. 24 to 31.

(1) A copper-clad laminate 30A including a substrate 30 of glass epoxy resin or BT (Bismaleimide/Triazine) resin and having a 18 μm copper foil 32 laminated on both sides thereof is used as a starting material (see FIG. 24A). First, the copper-clad laminate 30A is drilled and a penetrating hole 16 for a through hole is formed (see FIG. 24B). Next, a Pb catalyst is added and electroless plating treatment is conducted to the substrate, to thereby form a through hole 36 in the penetrating hole 16 (see FIG. 24C).

(2) The substrate 30 having the through holes 36 formed of an electroless copper plated film is washed, dried and subjected to oxidation-reduction treatment. Thereafter, a roughened layer 20 is provided on the entire surface of conductors including the through holes 36 (see FIG. 24D).

(3) Next, a filler. 22 containing copper particles of a mean particle diameter of 10 μm (manufactured by TATSUTA Electric Wire & Cable Co., Ltd., non-conductive plugging copper paste, product name: DD paste) is filled in the through holes 36 by screen printing, and dried and hardened (FIG. 24E). The filler 22 protruded from the roughened layer 20 on the surface of the conductors and the through holes 36 are removed by belt sanding using a #600 belt sand paper (manufactured by Sankyo Rikagaku Co., Ltd.) and the surface of the substrate 30 is subjected to buffing to remove flaws caused by belt sanding and flatten the surface of the substrate 30 (see FIG. 25F).

(4) A palladium catalyst (manufactured by Atotec) is added to the surface of the substrate 30 flattened in (3) and electroless plating is conducted to the surface, thereby forming electroless copper plated films 23 of a thickness of 0.6 μm (see FIG. 25G)

(5) Next, electrolytic plating is conducted under the same conditions as those in the first embodiment to thereby form electrolytic copper plated films 24 of a thickness of 15 μm and to form conductor layers (which become a semi-circular through hole lands) 26a covering the filler 22 filled in the through hole 36 (FIG. 25H).

(6) A commercially available photosensitive dry film is put on each side of the substrate 30 on which portions which become conductors 26a are formed, and a mask is mounted thereon. The film is exposed at 100 mJ/cm² and developed by 0.8% sodium carbonate, to thereby provide etching resists 25 of a thickness of 15 μm (see FIG. 25I). Here, to divide the conductor layer 26, a slit is provided in each etching resist 25 in the central region of the conductor 26a.

(7) Portions of the plated films 23 and 24 on which no etching resists are formed are dissolved by etching using a mixture liquid of sulfuric acid and peroxide and then the etching resists 25 are peeled off by 5% KOH. The conductor layers 26a covering the filler 22 are divided to thereby form through hole lands 39a and 39b (see FIG. 33C) and conductor circuits 34 (see FIG. 25J).

(8) Furthermore, a carbon dioxide laser of 2×10⁻⁴-second short pulse is applied to thereby remove part of the filler 22 in the through hole 36. Since the through hole 36 is covered with the conductor layers 26a, the layers 26a serve as masks and only filler 22 in the portions which are not covered with the layers 26a are removed. As a result of the removal of the filler, the inner wall of the through hole conductor 36 is exposed (FIG. 26K).

(9) Next, the exposed through hole 36 is dissolved by a solution of sulfuric acid and peroxide, the through hole 36 is divided into two parts to thereby obtain wiring paths 37a and 37b (see FIG. 26L).

(10) Thereafter, the surface of the through hole conductor 36 and those of the conductor circuits 34 are roughened by the oxidation (blackening)—reduction treatment used in (2) (FIG. 26M).

(11) Further, a metal mask having an opening is mounted in the through hole 36 and the above-stated non-conductive metal paste 24 is filled into the through hole 36 (FIG. 26N).

(12) The same composition of material for preparing a filling resin as in the first embodiment is mixed and kneaded to obtain a filling resin. The filling resin 40 is coated on the both sides of the substrate 30 using a roll coater within 24 hours after preparation. Thereafter, substrate 30 is sanded so that the filling resin 40 does not remain on the surface of the inner layer copper pattern 34 and those of the lands 39a and 39b of the through hole 36 and buffed (see FIG. 26O).

(13) A coated layer and roughened layer 42 of a needle alloy of Cu—Ni—P is provided on the surface of the conductor circuit 34 and those on the lands 39a and 39b of the through hole 36 as in the case of the first embodiment (see FIG. 27P).

Further, Cu—Sn displacement reaction is conducted to provide an Sn layer (not shown) of a thickness of 0.3 μm on the surface of the roughened layer.

(14) The same composition of material for preparing an interlayer resin insulating agent as that in the first embodiment is agitated to adjust the viscosity thereof to 1.5 Pa·s to thereby obtain an interlayer resin insulating agent (for a lower layer).

Next, the same composition of material for preparing an electroless plating adhesive agent as that in the first embodiment is agitated to adjust the viscosity thereof to 7 Pa·s to thereby obtain an electroless plating adhesive agent solution (for an upper layer).

(15) The interlayer resin insulating agent (for a lower layer) 44 obtained in (14) above is coated, the photosensitive adhesive agent solution (for an upper layer) 46 obtained in (7) above is coated on the both sides of the substrate of (14) and dried (pre-baked). Thus, adhesive agent layers 50a of a thickness of 35 μm are formed (see FIG. 27Q).

(16) A photo mask film (not shown), on which a black circle has been printed, is closely contacted with the both sides of the substrate 30 on which the adhesive agent layer has been formed in (15) above, developed and exposed. Thus, interlayer resin insulating layers (two-layer structure) 50 having a thickness of 35 μm and openings (via hole formation openings) 48 are formed (see FIG. 27R). A tin plated layer (not shown) is partially exposed to the openings 48 which become via holes.

(17) The substrate 30, in which the openings 48 are formed, is submerged in chromic acid for 19 minutes to dissolve and remove epoxy resin particles present on the surfaces of the interlayer resin insulating layers 50, thereby roughening the surfaces of the interlayer resin insulating layers 50 (see FIG. 27S). Thereafter, the substrate is submerged in a neutralizing solution (manufactured by Shipley Far East) and washed.

(18) A commercially available photosensitive dry film is put on and a mask formed into a predetermined pattern is mounted on the substrate. The film is exposed at 100 mJ/cm² and developed by 0.8% sodium carbonate, to thereby provide plating resists 51 for dividing the opening 48 into two parts (see FIG. 28T).

Furthermore, a palladium catalyst (manufactured by Atotec) is added to the surface of the substrate which has been subjected to roughening treatment (roughened depth of 6 μm), thereby providing catalyst nuclei on the surfaces of the interlayer resin insulating layers 50 and on the inner wall surfaces of the via hole openings 48.

(19) The substrate 30 is submerged in the electroless copper plating solution having the same composition as that in the first embodiment to thereby form electroless plated films 52 of a thickness of 0.6 μm on the entire roughened surface (see FIG. 28U).

(20) A commercially available photosensitive dry film is put on each electroless copper plated film 52 formed in (19) above and a mask (not shown) formed into a predetermined mask is mounted thereon. The film is exposed at 100 mJ/cm² and developed by 0.8% sodium carbonate, to thereby provide plating resists 54 of a thickness of 15 μm (see FIG. 28V)

(21) Next, electrolytic copper plating is conducted to portions on which no resists are formed under the same conditions as those in the first embodiment, to thereby form electrolytic copper plated films 56 of a thickness of 15 μm (see FIG. 29W).

(22) After the plating resists 51 and 54 are peeled off by 5% KOH, the electroless plated films 52 under the plating resist 54 are etched by a mixture liquid of sulfuric acid and peroxide and dissolved, thereby forming conductor circuits 58, 58*a*, 58*b* each consisting of the electroless copper plated film 52 and the electrolytic copper plated film 56 and having a thickness of 18 μm and forming via holes 60 each consisting of two wiring paths 61*a* and 61*b* and undivided via holes 60' (FIG. 29X).

(23) The same treatment as in (13) is conducted and a roughened layer 62 of Cu—Ni—P is formed on surfaces of the conductor circuits 58, 58*a* and 58*b* and on those of the via holes 60 and 60', and the surface of the roughened layer 62 is subjected to Sn displacement (see FIG. 29Y).

(24) The steps of (14) to (23) are repeated, thereby forming upper interlayer resin insulating layers 150, then forming via holes 160A and 160B and obtaining a multilayer wiring board (see FIG. 30ZA). It is noted that no Sn displacement is conducted to the roughened surface 62 formed on the surfaces of the conductor circuits 158 and via holes 160A and 160B.

(25) The solder resist composition described in D. above and having a thickness of 20 μm is coated on the both sides of the substrate 30 obtained in (24). Then, exposure and development treatments are conducted to thereby form solder resist layers (thickness of 20 μm) each having openings (opening diameter of 200 μm) 71 on the solder pad portions (including the via holes and via hole lands) (see FIG. 30ZB). Further, reinforcement layers 78 are formed on the solder resist layers 70, respectively.

(26) Next, nickel plated layers 72 of a thickness of 5 μm are formed on the opening portions 71 of the solder resist layers 70, respectively. Then, gold plated layers 74 of a thickness of 0.03 μm are formed on the nickel plated layers 72, respectively, thereby forming solder pads 75 on the via holes 160A and 160B and on the conductor circuits 158 (see FIG. 30ZC).

(27) Thereafter, a solder paste is printed in the opening portions 71 of the solder resist layers 70 and reflow is conducted at a temperature of 200° C., thereby forming solder bumps (solder bodies) 76UA, 76UB, 76DA and 76DB, forming a multilayer build-up wiring board 10 (see FIG. 31)

Next, description will be given to the mounting of an IC chip onto the multilayer build-up wiring board 10 and attachment of the daughter board 94 to the board 10 with reference to FIG. 32. An IC chip 90 is mounted on the multilayer build-up wiring board 10 such that the solder pads 92 of the IC chip 90 correspond to the solder bumps 76UA and 76UB of the multilayer build-up board 10, respectively. Likewise, the daughter board 94 is attached onto the solder bumps 76DA and 76DB of the multilayer build-up wiring board 10 by reflow.

Then, description will be given to a multilayer build-up wiring board in the first modified example of the third embodiment with reference to FIG. 35. FIG. 35A is a cross-sectional view showing the constitution of a multilayer build-up wiring layer in the first modified example. FIG. 35B is a plan view for describing the shapes of the through hole 139 and land 260 of the multilayer build-up wiring board.

As shown in FIG. 35B, the through hold land 139 of the through hole 136 is circularly formed and the pads 137A and 137B for connection of via holes are added to the lands 139, respectively. The wiring paths 260*a* and 260*b*, obtained by halving the via hole 260, are arranged on the pads 137A and 137B, respectively. The wiring path 260*a* is connected to the pad 258A through the conductor circuit 258 so that the path 260*a* is connected to the upper via hole 360. Likewise, the wiring path 260*b* is connected to the pad 258*b* through the conductor circuit 258 so that the path 260*b* is connected to the upper via hole 360.

In the constitution of the first modified example, the wiring concentration on the interlayer resin insulating layer 350 in which the via holes 260 are arranged can be increased by dividing the via holes 260.

In the above-stated third embodiment, an example of dividing the via hole and the through hole of the multilayer build-up wiring board into two parts respectively is to thereby provide wiring paths. It is also possible to divide them into three or more parts to further increase wiring concentration.

As stated so far, on the multilayer build-up wiring board in the third embodiment, due to the fact that one via hole consists of a plurality of wiring paths, several times as many the wiring paths as the via holes can be provided in the interlayer resin insulating layer, thereby making it possible to provide the wirings on the multilayer build-up wiring board with high concentration.

Fourth Embodiment

Figure 36:
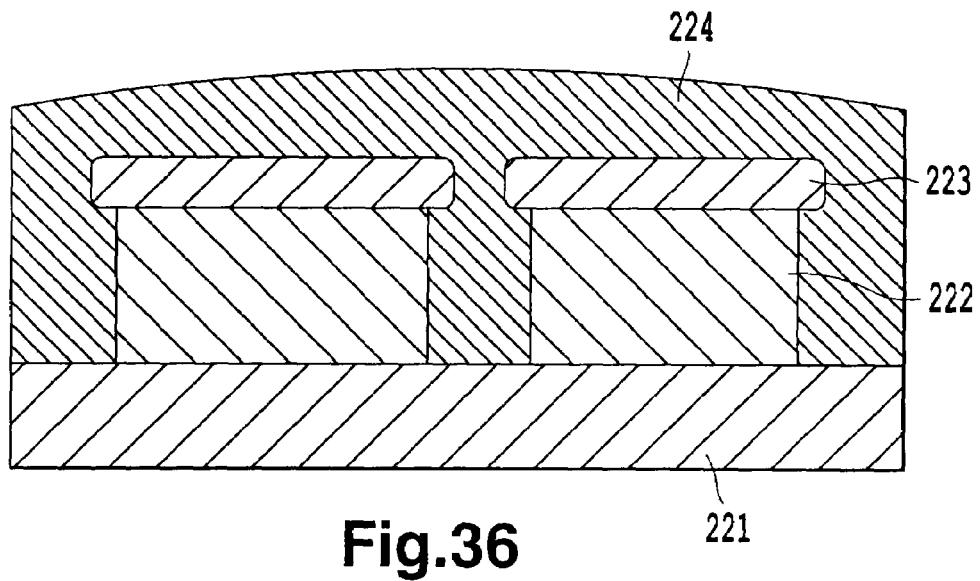
FIG. 36 is a cross-sectional view typically showing a wiring board in the fourth embodiment according to the present invention.

FIG. 36 is a cross-sectional view typically showing one embodiment of a wiring board in the fourth embodiment.

In the wiring board in the fourth embodiment, the first thick metal film 222 is formed on an insulating substrate 221 and the second metal film 223 thinner than the first metal film 222 is formed on the first metal film 222. The sides of the second metal film 223 protrude outside compared to those of the first metal film 222. As shown in FIG. 36, the advantage of the fourth embodiment is exhibited if a resin insulating layer 224 is formed to cover the conductor layer of a two-layer structure.

The material for the insulating substrate 221 is not particularly limited. An inorganic material such as ceramics or organic material such as resin may be freely used for the substrate.

In addition, a different metal film may be formed above or below the two-layer structured conductor layer. To improve adhesion with the resin insulating layer, a roughened layer made of another metal film may be formed to cover the conductor layer. Furthermore, the conductor layer and the resin insulating layer having the structures shown in FIG. 36 may be repeatedly formed.

The method of forming the conductor layer of a two-layer structure should not be particularly limited. For instance, the following methods may be used:

(1) The First Method:

A plating resist is formed on a substrate made of ceramics or the like and on a resin insulating layer or the like which has been subjected to roughening treatment. Thereafter, the first metal film 222 and the second film 223 are formed on portions on which no plating resists are formed.

Next, after removing the plating resists, using an etchant with which the first metal film 222 can be etched relatively easily and with which the second metal film 223 can be hardly etched, etching is conducted. Thus, a conductor layer of a two-layer structure can be formed as shown in FIG. 36.

For instance, copper is used as material for the first metal film 222, nickel is used as material for the second metal film 223 and a mixture liquid of sulfuric acid and peroxide is used as an etchant, thereby forming the film of the above-stated structure.

This method is used to manufacture a multilayer build-up wiring board in the fourth embodiment described herein after.

Figure 37:
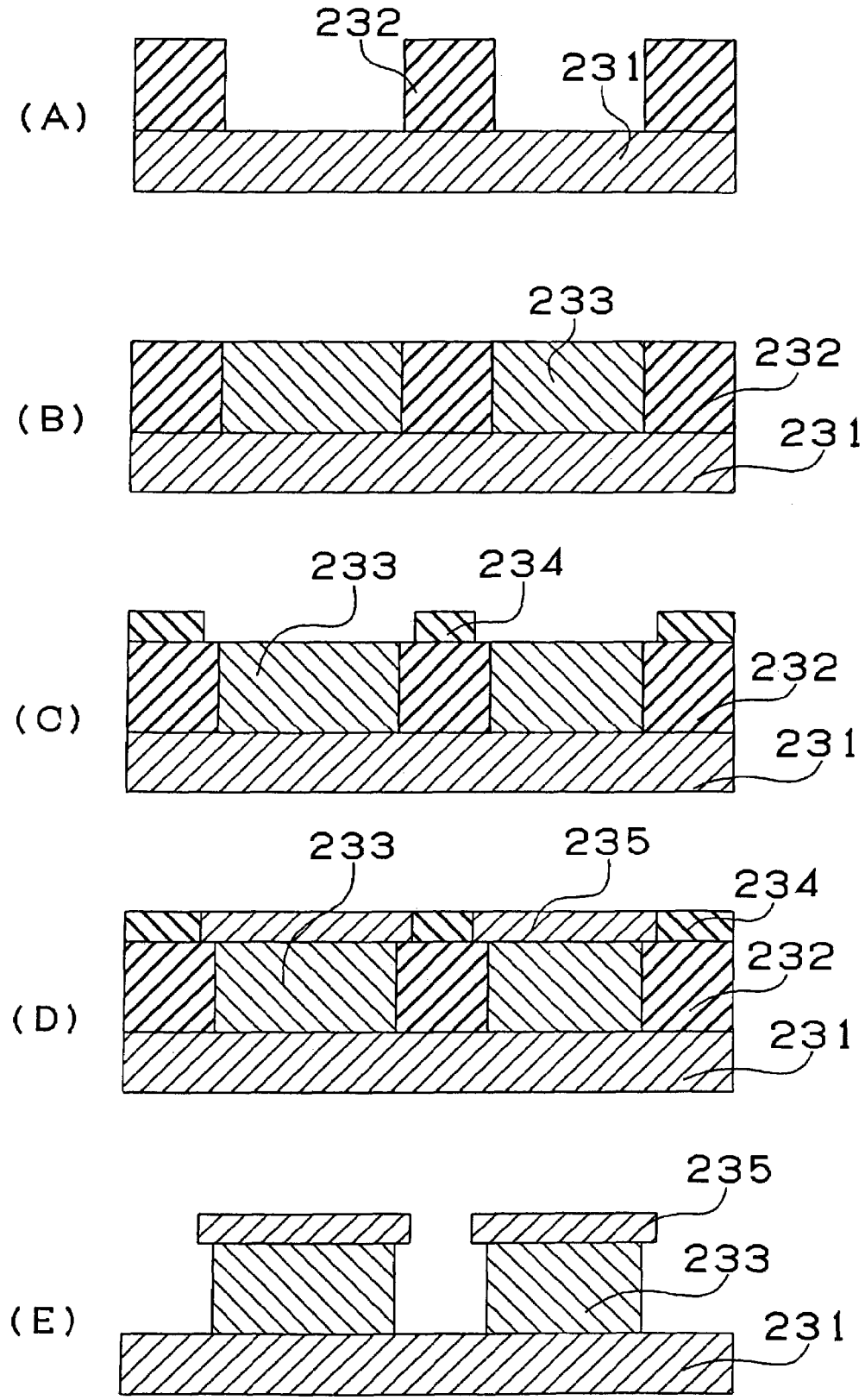
FIGS. 37A, 37B, 37C, 37D and 37E are cross-sectional views showing an example of manufacturing steps of the wiring board in the fourth embodiment.

(2) The Second Method:

As shown in FIG. 37, the first plating resist 232 is first formed on an insulating substrate 231 (see FIG. 37A).

For the formation of the first plating resist 232, ordinary lithography can be employed.

Next, the first metal film 233 is formed on portions on which the first plating resist 232 is not formed (see FIG. 37B) The first metal film 233 may be preferably thick and it is, therefore, desirable that the film 233 is formed by electroplating. In addition, it is desirable that the thickness of the film 233 is almost the same as that of the first plating resist 232.

Next, treatment for facilitating forming a metal on the surface of the first plating resist 232 (e.g., roughening treatment and application of catalyst nuclei) is conducted. Thereafter, the second plating resist 234 is formed so that the second plating resist 234 has an area slightly smaller than that of the first plating resist 232 (see FIG. 37C).

Then, the second metal film 235 is formed so as to fill recessed portions formed by the second plating resists 234 (see FIG. 37D).

Since it is necessary to form the second metal film 235 on the first plating resist 232 which is not covered with the second plating resist 234, it is preferable to conduct electroless plating.

Thereafter, the plating resists are removed, thereby forming a conductor of a two-layer structure consisting of the first metal film 233 and the second metal film 235 (see FIG. 37E).

Next, description will be given to a multilayer build-up wiring board in the fourth embodiment.

The multilayer build-up wiring board in the fourth embodiment has a structure in which at least one resin insulating layer and at least one layer of a conductor circuit are formed on a resin substrate. The board is characterized in that at least one layer of the conductor circuit is a conductor layer of a two-layer structure in which the second metal film thinner than the first metal film is formed on the first metal film and in that the sides of the second metal film forming the conductor layer protrudes outside compared to the sides of the first metal film.

With the constitution of the fourth embodiment, the sides of the second metal film formed on the first metal film protrude outside compared to those of the first metal film. Due to this, even if temperature change or the like occurs, stress does not concentrate on the corners of the conductor layer, with the result that it is possible to prevent the resin insulating layer from cracking.

On the multilayer build-up wiring board in the fourth embodiment, a resin substrate on which a conductor circuit is directly formed may be used. A resin insulating layer and a layer of a conductor circuit may be provided on the resin substrate or two or more resin insulating layers and two or more layers of conductor circuits may be provided on the substrate. Alternately, a resin substrate on which no conductor circuit is formed may be used. A resin insulating layer and a layer of a conductor circuit may be provided on the resin substrate or two or more resin insulating layers and two or more layers of conductor circuits may be provided on the substrate. Further, the resin insulating layer and the conductor circuit may be provided on one side of the resin substrate or may be provided on both sides thereof.

Now, the method of manufacturing the multilayer build-up wiring board in the fourth embodiment will be described, taking a multilayer build-up wiring board as an example.

(1) First, a wiring substrate having a lower conductor circuit is formed on the surface of a resin substrate. At this moment, an etching resist is formed on a copper foil and then etching is conducted with an etchant of a mixture liquid of sulfuric acid and peroxide, a sodium persulfate solution or an ammonium persulfate solution to thereby form a lower conductor circuit.

In addition, a penetrating hole is drilled in the resin substrate. The wall surface of the hole and the surface of the copper foil are electroless plated to thereby form a through hole. Copper plating is preferably adopted for the electroless plating.

Further, electroplating may be conducted to thicken the copper foil. Copper plating is preferable for the electroplating.

After the electroplating, the inner wall of the through hole and the surface of the electroplated film surface may be roughened. As for the roughening method, there are, for example, blackening (oxidation)—reduction treatment, spray treatment using a mixture liquid of organic acid and cupric complex or Cu—Ni—P needle alloy plating.

In addition, if necessary, a conductive paste may be filled in the through hole and a conductor layer covering the conductor paste can be formed by electroless plating or electroplating.

(3) Next, an opening for a via hole is provided in the formed interlayer resin insulating layer so as to ensure electrical continuity with the lower conductor circuit.

If an adhesive agent for the above-stated electroless plating is used, the adhesive agent layer is exposed and developed. Thereafter, the layer is thermally hardened to thereby obtain a via hole opening.

If thermohardening resin is used, the resin layer is thermally hardened and then subjected to laser treatment. Thus, a via hole opening can be provided in the interlayer resin insulating layer.

(4) Next, the surface of the interlayer resin insulating layer is roughened. If the electroless plating adhesive agent is used, resin particles present on the surface of the interlayer resin insulating film is dissolved and removed by acid or oxidizer to thereby roughen the surface of the electroless plating adhesive agent layer.

(5) Catalyst nuclei is added to the wiring substrate having the interlayer resin insulating layer of a roughened surface. To add the catalyst nuclei, it is preferable to use noble metal ions or noble metal colloid. Normally, palladium chloride or palladium colloid is used. To fix the catalyst nuclei, it is preferable to conduct heat treatment. Palladium is a preferable catalyst nuclei.

(6) Next, electroless plating is conducted to the surface of the interlayer resin insulating layer on which the catalyst nuclei has been added to thereby form an electroless plated film on the entirety of the roughened surface. The thickness of the electroless plated film is preferably 0.5 to 5 μm.

Thereafter, a plating resist is formed on the electroless plated film.

(7) Electroplating of a thickness of 5 to 20 μm is conducted to portions on which no plating resist is formed and an upper conductor circuit and a via hole are formed.

After electroplating, electroless nickel plating is conducted to form a nickel plated film. The reason for forming the nickel plated film is that electroplated coatings of alloy of Cu—Ni—P are easily deposited on the nickel plated film.

Also, the nickel plated film functions as a metal resist, so that excessive etching can be advantageously prevented in the later etching step.

Copper plating is preferable for the above electroplating.

(8) Next, after the plating resist is removed, the substrate from which the plated resist is removed is submerged in a mixture liquid of sulfuric acid and peroxide, a sodium persulfate solution or an ammonium persulfate solution to thereby etch the substrate. Thus, the electroless plated film present under the plating resist is removed and an independent upper layer conductor circuit is provided.

At this moment, if a mixture liquid of sulfuric acid and peroxide is used in particular, the electroless nickel plated film is not etched and the copper plated film is slightly etched. Due to this, the sides of the electroless nickel plated film protrude outside compared to those of the copper plated film and a conductor layer of two-layer structure is formed.

Figure 36A:
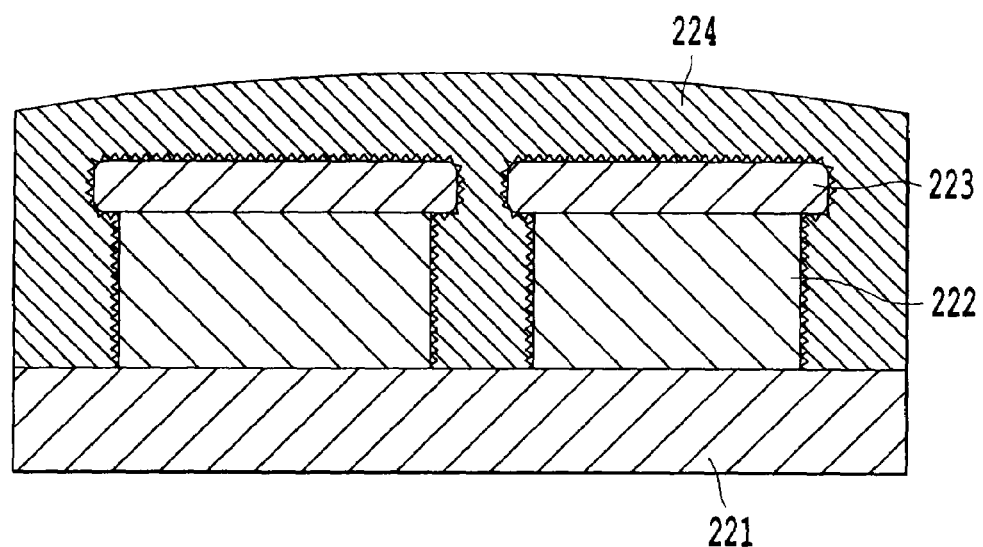
FIG. 36A is a cross sectional view showing a wiring board having top roughened surface.

Next, the substrate from which an oxide film has been removed is submerged into a plating liquid and a roughened layer of porous Cu—Ni—P alloy is formed on the upper layer conductor circuit. See FIG. 36A. The roughened layer of Cu—Ni—P alloy is easily deposited on the nickel plated film. Due to this, corners become closer to a curved surface, thereby preventing the concentration of stress even if the conductor layer is expanded or contracted.

Next, the fourth embodiment will be described with reference to the drawings.

Figure 38:
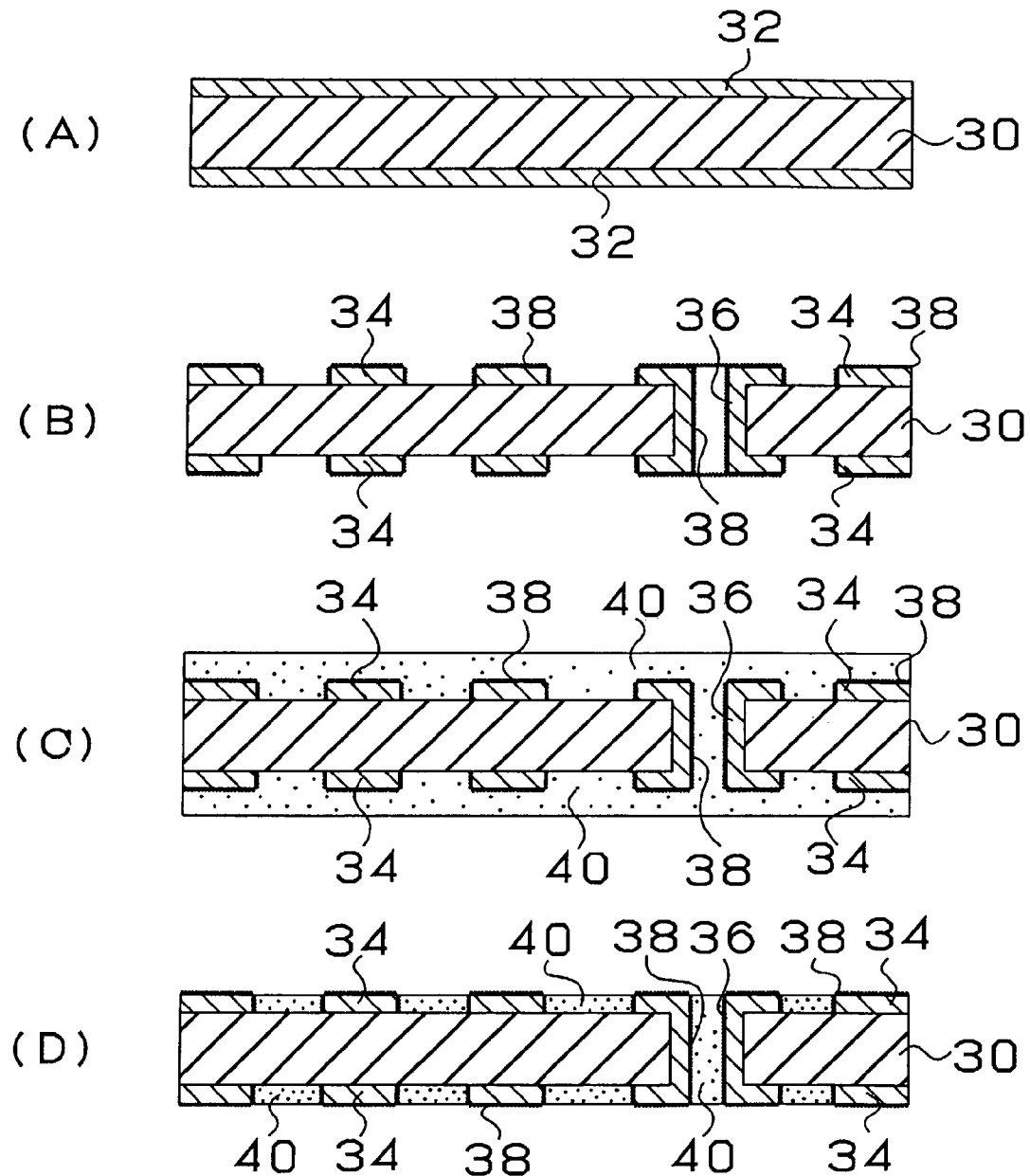
FIGS. 38A, 38B, 38C and 38D are cross-sectional views showing part of manufacturing steps of the multilayer build-up wiring board in the fourth embodiment.

B. Method of Manufacturing a Multilayer Build-Up Wiring Board (1) A copper-clad laminate including a substrate 30 of a thickness of 1 mm and of glass epoxy resin or BT (Bismaleimide/Triazihe) resin and having a 18 μm copper foil 32 laminated on both sides thereof is used as a starting material. (See FIG. 38A) First, the copper-clad laminate is drilled and plating resists are formed thereon. Thereafter, the substrate 30 is subjected to electroless plating to form through holes 36 and pattern-etched in accordance with an ordinary method, thereby forming an inner layer conductor circuit 32 on each of the both sides of the substrate.

Next, the substrate 30 having the inner layer conductor circuits 32 formed thereon is washed and dried. Thereafter, a roughened surface 38 is provided on the entire surfaces of the inner layer conductor circuits 34 including the through holes 36 by conducting oxidization using an oxidizing (blackening) bath of NaOH (10 g/l), NaClO$_2$ (40 g/l) and Na$_3$PO$_4$ (6 g/l) (see FIG. 38B).

(2) A filling resin 40 mainly consisting of epoxy resin is coated on both sides of the substrate by using printer, thereby filling the filling resin 40 between inner layer conductor circuits 34 or into the through holes 36 and drying the substrate. That is, the filling resin 40 is filled between the inner layer conductor circuits 34 or into the through hole 36 by these steps (see FIG. 38C).

(3) The substrate which has been subjected to the treatment (2) is sanded and buffed. Thereafter, the filling resin 40 thus filled is heated and hardened (see FIG. 38D).

(4) A roughened layer 42 of Cu—Ni—P porous alloy having a thickness of 2 μm is formed on the each of the surfaces of the exposed inner layer conductor circuits 34 and on the lands of the through hole 36 as in the case of the first embodiment. Further, an Sn layer of a thickness of 0.05 μm is formed on the surface of each roughened layer 42 (see FIG. 39A) It is noted that the Sn layer is not shown in the drawings.

(5) An electroless plating adhesive agent is coated on both sides of the substrate twice using a roll coater. The substrate is left horizontally for 20 minutes and then dried at 60° C. for 30 minutes (see FIG. 39B).

Figure 39:
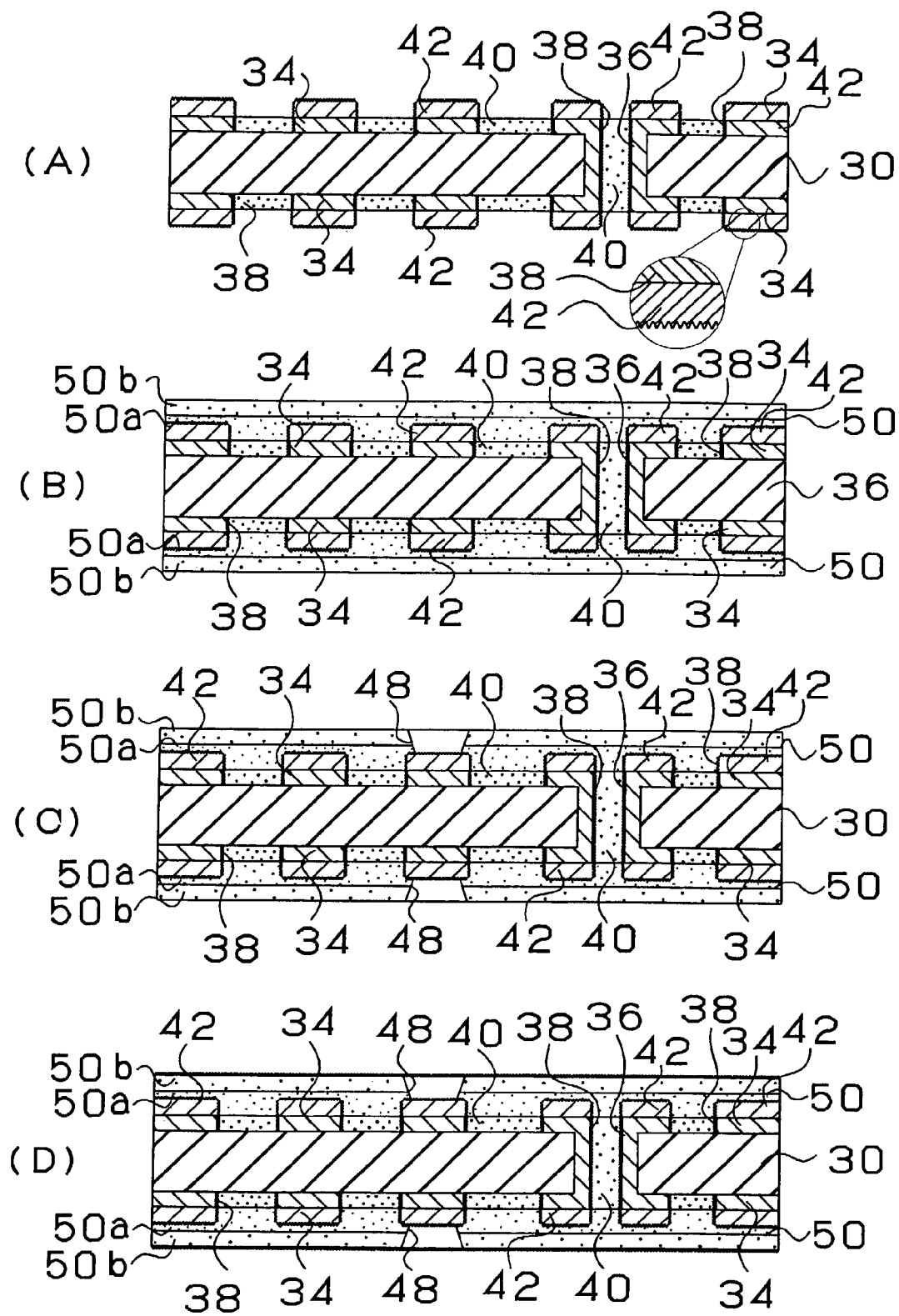
FIGS. 39A, 39B, 39C and 39D are cross-sectional views showing part of manufacturing steps of the multilayer build-up wiring board in the fourth embodiment.

(6) The substrate on which the electroless plating adhesive agent layer is formed in (5) above is exposed and developed to thereby form interlayer resin insulating layers 50 (50a, 50b) each having an opening hole (opening hole 48 for a via hole) and having a thickness of 18 μm (see FIG. 39C).

(7) The substrate on which the via hole opening hole 48 has been formed is submerged in a chromic acid solution (700 g/l) at 73° C. for 20 minutes, epoxy resin particles present on the back surface of the interlayer resin insulating layer 50 are dissolved and removed to roughen the surface to thereby obtain a roughened surface Thereafter, the substrate is submerged in a neutralizing solution (manufactured by Shipley Far East) and washed (see FIG. 39D).

Furthermore, a palladium catalyst (manufactured by Atotec) is added to the surface of the substrate which the surface has been subjected to roughening treatment, thereby providing catalyst nuclei on the surfaces of the interlayer resin insulating layers 50 and on the inner wall surface of the via hole opening hole 48.

(8) Next, the substrate is submerged in an electroless copper plating solution which composition is shown below to thereby form an electroless copper plated film 52 having a thickness of 0.8 μm on the entirety of the roughened surface (see FIG. 40A).

[Electroless Plating Aqueous Solution]

| | |
|---|---|
| EDTA | 60 g/l |
| Copper sulfate | 10 g/l |
| HCHO | 6 ml/l |
| NaOH | 10 g/l |
| α, α'-bypyridil | 80 mg/l |
| Polyethylene glycol (PEG) | 0.1 g/l |

[Electroless Plating Conditions]
  Solution temperature: 60° C.
  Time: 20 minutes (9) A commercially available photosensitive dry film is put on the electroless copper plated film 52 and a mask is mounted thereon. The film is exposed at 100 mJ/cm$^2$ and developed by 0.8% sodium carbonate, to thereby provide plating resists 54 (see FIG. 40B).

(10) Next, electrolytic copper plating is conducted under the same conditions as those in the first embodiment to thereby form electrolytic copper plated films 56 of a thickness of 13 μm.

(11) Further, the substrate is submerged in an electroless nickel batch of a solution (90° C.) of nickel chloride (30 g/l), sodium hypophosphite (10 g/l) and sodium citrate (10 g/l) to thereby form nickel films 57 of a thickness of 1.2 μm on the electrolytic copperplated films, respectively (see FIG. 40C).

(12) After the plating resists 54 are peeled off by 5% KOH, the electroless plated films 52 under the plating resist 54 are etched away by a mixture liquid of sulfuric acid and peroxide, thereby forming upper layer conductor circuits 58 (including via holes 60) each consisting of the electroless copper plated film 52, the electrolytic copper plated film 56 and the nickel film 57, having L/S=28/28 and a thickness of 11 μm (see FIG. 40D).

(13) After the oxide films on the nickel films are removed by 18 parts by weight of hydrochloric acid, the same treatment as in (4) above is conducted to thereby form roughened layers 42 of Cu—Ni—P alloy having a thickness of 2 μm on the surfaces of the upper layer conductor circuits 58, respectively.

(14) The steps of (5) to (13) are repeated and further upper layer conductor circuits 158, via holes 160 and roughened layers 42 are formed. Finally, solder resist layers 70 each having openings are formed, nickel plated films 72 and gold plated films 74 are formed. Thereafter, solder bumps 76 are formed to thereby obtain a multilayer build-up wiring board having solder bumps 18 (see FIGS. 41A to 42C).

Second Comparison Example

In the second comparison example, a multilayer build-up wiring board is manufactured in the same manner as that of the fourth embodiment except that the step (11) is not conducted and nickel films are not formed in the second comparison example.

A heat cycle test for repeating 100 times a heat cycle of cooling the multilayer build-up wiring board obtained in the fourth embodiment and the second comparison example to −55° C. and then heating the substrate to 125° C. was conducted. After the test, the multilayer build-up wiring board was cut by a wire saw and the cross sections of the conductor circuit and the interlayer resin insulating layer are observed with an optical microscope.

As a result, no cracks were seen in the multilayer build-up wiring board obtained in the fourth embodiment, whereas cracks deriving from the corners of the conductor circuits 58 or the like were seen in the interlayer resin insulating layers on the multilayer build-up wiring board.

FIGS. 43A and 43B show microphotographs of the optical microscope showing the cross section obtained in the fourth embodiment.

As is obvious from the cross section of the conductor circuit shown in FIG. 43, the sides of the electrolytic plated film 56 forming the upper layer conductor circuit 58 protrude outside compared to those of the nickel film 57. Due to the structure of this upper layer conductor circuit 58, stress does not concentrate on the corners of the conductor circuit 58, with the result that it is possible to prevent the interlayer resin insulating layer 50 from cracking.

As stated so far, according to the multilayer build-up wiring board in the fourth embodiment, the sides of the second metal film forming a conductor layer of two-layer structure protrude outside compared to those of the first metal film. Owing to this, even if resin insulating layers are formed on the conductor layers and temperature change or the like occurs, the stress does not concentrate on the corners of the conductor layers, with the result that it is possible to prevent the resin insulating layer from cracking.

Furthermore, according to the multilayer build-up wiring board in the fourth embodiment, the sides of the second metal film forming the two conductor layers protrude outside with respect to those of the first metal film. Owing to this, even if temperature change or the like occurs, the stress does not concentrate on the corners of the conductor layers to thereby make it possible to prevent the resin insulating layers from cracking.

The invention claimed is:

1. A multilayer wiring board comprising:
a first resin insulating layer;
a conductor circuit formed as a composite metallic layer, said conductor circuit having a base disposed on the first resin insulating layer, the composite layer including a first metal film and a second metal film which has a thickness thinner than a thickness of the first metal film, the first metal film having a top surface, the second metal film having a bottom surface and a top surface, an entirety of the top surface of the first metal film being electrically and directly connected to the bottom surface of the second metal film with a metal-to-metal contact region between the first and second metal films being at least as wide as the top surface of the first metal film, the top surface of the first metal film being smaller than the bottom surface of the second metal film, and the top surface of the second metal film having a rounded edge and a roughened layer, said bottom surface of the second metal film extending linearly at a same level from the metal-to-metal contact region beyond said top surface of the first metal film; and
a second resin insulating layer separate from the first resin insulating layer and provided on the conductor circuit to cover the conductor circuit including the first and second metal films,
wherein the top surface of the first metal film being smaller than the bottom surface of the second metal film reduces stress in the second resin insulating layer.

2. A multilayer wiring board as in claim 1, wherein roughened layers are formed on said first metal film and second metal film.

3. A multilayer wiring board as in claim 1, wherein oxidizing-reducing film roughened layers are formed on etched plated films covered with said first metal film and second metal film.

4. A multilayer wiring board as in claim 1, wherein corners of said periphery of said second metal film are a curved surface.

5. A multilayer build-up wiring board comprising:
a first resin insulating layer;
a conductor circuit formed as a composite metallic layer, said conductor circuit having a base disposed on the first resin insulating layer, the composite layer including a first metal film and a second metal film which has a thickness thinner than a thickness of the first metal film, the first metal film having a top surface, the second metal film having a bottom surface and a top surface, an entirety of the top surface of the first metal film being electrically and directly connected to the bottom surface of the second metal film with a metal-to-metal contact region between the first and second metal films being at least as wide as the top surface of the first metal film, the top surface of the first metal film being smaller than the bottom surface of the second metal film, and the top surface of the second metal film having a rounded edge and a roughened layer, said bottom surface of the second metal film extending linearly at a same level from the metal-to-metal contact region beyond said top surface of the first metal film; and
a second resin insulating layer separate from the first resin insulating layer and provided on the conductor circuit to cover the conductor circuit including the first and second metal films,
wherein the top surface of the first metal film being smaller than the bottom surface of the second metal film reduces stress in the second resin insulating layer.

6. A multilayer build-up wiring board as in claim 5, wherein roughened layers are formed on said first metal film and second metal film.

7. A multilayer build-up wiring board as in claim 5, wherein oxidizing-reducing film roughened layers are formed on etched plated films covered with said first metal film and second metal film.

8. A multilayer build-up wiring board as in claim 5, wherein corners of said periphery of said second metal film are a curved surface.

9. A multilayer wiring board comprising:
   a substrate;
   a conductor circuit provided on the substrate, said conductor circuit having a base disposed on the substrate and including a composite metallic layer having a first metal film and a second metal film which has a thickness thinner than a thickness of the first metal film, the first metal film having a top surface, the second metal film having a bottom surface and a top surface, and the top surface of the first metal film having a width smaller than a width of the bottom surface of the second metal film such that an entirety of the top surface of the first metal film being electrically connected to and both mechanically attached and covered with the bottom surface of the second metal film and with a metal-to-metal contact region between the first and second metal films being at least as wide as the top surface of the first metal film the top surface of the second metal film having a rounded edge and a roughened layer, said bottom surface of the second metal film extending linearly at a same level from the metal-to-metal contact region beyond said top surface of the first metal film; and
   a resin insulating layer separate from the substrate and provided on the conductor circuit to cover the conductor circuit including the first and second metal films,
   wherein the top surface of the first metal film is smaller than the bottom surface of the second metal film and thereby reduces stress in the resin insulating layer.

10. The multilayer wiring board as in claim 9, wherein the top surface of the second metal film has a roughened layer.

11. The multilayer wiring board as in claim 9, wherein the top surface of the first metal film has the width smaller than the width of the bottom surface of the second metal film such that sides of the second metal film protrude outside the top surface of the first metal film.

* * * * *

UNITED STATES PATENT AND TRADEMARK OFFICE
CERTIFICATE OF CORRECTION

PATENT NO.         : 7,514,779 B2
APPLICATION NO.    : 10/334062
DATED              : April 7, 2009
INVENTOR(S)        : Hirose et al.

Page 1 of 1

It is certified that error appears in the above-identified patent and that said Letters Patent is hereby corrected as shown below:

On the title page, Item (30), The Foreign Application Priority Data has been omitted. Item (30) should read:

-- (30)    Foreign Application Priority Data

Sept. 17, 1998   (JP) ................................. 10-283437
Oct. 28, 1998    (JP) ................................. 10-324535
Dec. 21, 1998    (JP) ................................. 10-362961
Jan. 5, 1998     (JP) ................................. 11-315 --

Signed and Sealed this

Nineteenth Day of May, 2009

JOHN DOLL
*Acting Director of the United States Patent and Trademark Office*